United States Patent
Tarng et al.

(10) Patent No.: US 8,089,323 B2
(45) Date of Patent: Jan. 3, 2012

(54) GREEN TECHNOLOGY: GREEN CIRCUIT AND DEVICE DESIGNS OF GREEN CHIP

(76) Inventors: Min Ming Tarng, San Jose, CA (US); Mei Jech Lin, San Jose, CA (US); Eric Yu-Shiao Tarng, San Jose, CA (US); Alfred Yu-Chi Tarng, San Jose, CA (US); Angela Yu-Shiu Tarng, San Jose, CA (US); Jwu-Ing Nieh, San Jose, CA (US); Huang-Chang Tarng, San Jose, CA (US); Shun-Yu Nieh, San Jose, CA (US)

( * ) Notice: Subject to any disclaimer, the term of this patent is extended or adjusted under 35 U.S.C. 154(b) by 124 days.

(21) Appl. No.: 12/229,412

(22) Filed: Aug. 23, 2008

(65) Prior Publication Data

US 2009/0066157 A1 Mar. 12, 2009

Related U.S. Application Data

(63) Continuation-in-part of application No. 11/500,125, filed on Aug. 5, 2006, and a continuation-in-part of application No. 11/593,271, filed on Nov. 6, 2006, now Pat. No. 7,511,589, and a continuation-in-part of application No. 12/079,179, filed on Mar. 25, 2008, and a continuation-in-part of application No. 12/082,601, filed on Apr. 12, 2008.

(51) Int. Cl.
*H03B 5/12* (2006.01)
*H03G 3/20* (2006.01)
*H03F 3/45* (2006.01)

(52) U.S. Cl. ........ 331/117 FE; 331/176; 330/127; 330/252; 330/259; 330/261

(58) Field of Classification Search ........... 331/117 R, 331/57, 117 FE, 167, 176; 323/222–225, 323/282; 330/127, 252, 259, 261
See application file for complete search history.

(56) References Cited

U.S. PATENT DOCUMENTS

| | | | | |
|---|---|---|---|---|
| 3,393,957 A | * | 7/1968 | Smith | 359/282 |
| 4,338,574 A | * | 7/1982 | Fujita et al. | 331/1 A |
| 4,734,900 A | * | 3/1988 | Davie | 369/59.19 |

(Continued)

*Primary Examiner* — Levi Gannon

(57) ABSTRACT

Green Design is to save the resource and energy for earth. Applying the recycling of energy concept to the electrical and electronic device and circuit, we can save many nuclear power plants to save the earth and human society. Comparing with today power amplifier PA has only 10% efficiency, the high linearity and high efficiency power-managing amplifier PMA and differential power managing amplifier DPMA can have the power efficiency more than 95%. The recycling switch inductor drive power management unit PMUx gets rid of the switch loss and has power efficiency more than 99%. The Xtaless Clock generator based on on-chip gain-boost-Q LC tank and the Spurfree and Jitterless Frequency & Phase Lock Loop FPLL. The DPMA directly supply the power to the plasma light. The charge doped light mirror reduces the voltage swing, increases the power efficiency and operating speed of plasma light, projective TV, LaserCom. The plasma light can use for the home light to have the efficiency of 95% to replace the conventional light bulb having only 10% efficiency. The bipolar LED serves as both thermal detector and fault indication light saving a lot of energy and enhances the safety of electrical vehicle. The resistorless-zero-current-detector saves a lot of power dissipation in the PMU. The 5-less green SOC design of Xtaless clock generator, the capless LDVR (low drop voltage regulator), the inductorless SM (Switch Mode Power Regulator), resistorless current detector and diodeless TRNG (True Random Number Generator) can save the earth.

19 Claims, 62 Drawing Sheets

U.S. PATENT DOCUMENTS

| | | | |
|---|---|---|---|
| 6,208,211 B1 * | 3/2001 | Zipper et al. | 331/17 |
| 6,388,536 B1 * | 5/2002 | Welland | 331/177 R |
| 6,621,362 B2 * | 9/2003 | Momtaz et al. | 331/117 R |
| 6,750,726 B1 * | 6/2004 | Hung et al. | 331/100 |
| 6,750,727 B1 * | 6/2004 | Sutardja | 331/117 R |
| 6,803,829 B2 * | 10/2004 | Duncan et al. | 331/34 |
| 7,274,265 B2 * | 9/2007 | Ahmad | 331/176 |
| 7,358,826 B2 * | 4/2008 | McCorquodale et al. | 331/179 |
| 7,405,628 B2 * | 7/2008 | Hulfachor et al. | 331/11 |
| 2008/0273234 A1 * | 11/2008 | Mehrl et al. | 359/223 |

\* cited by examiner

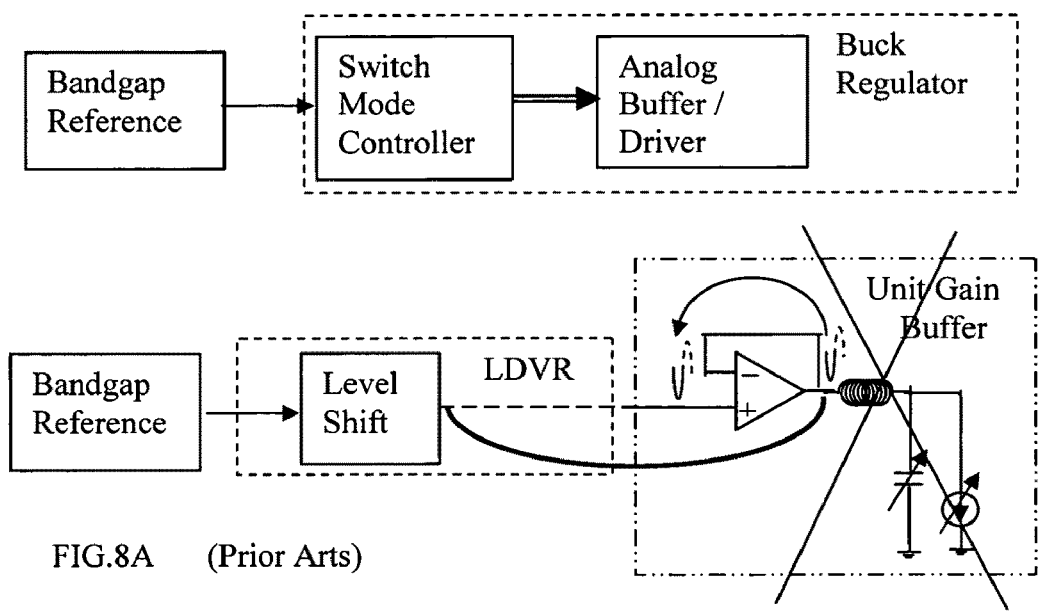
FIG.8A (Prior Arts)
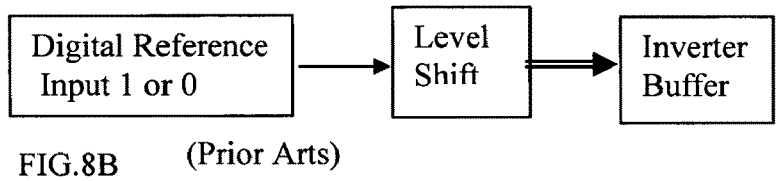
FIG.8B (Prior Arts)
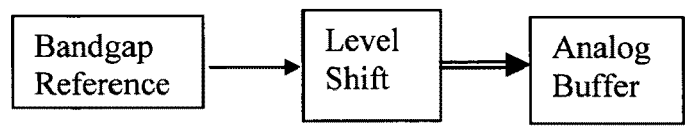
FIG.8C
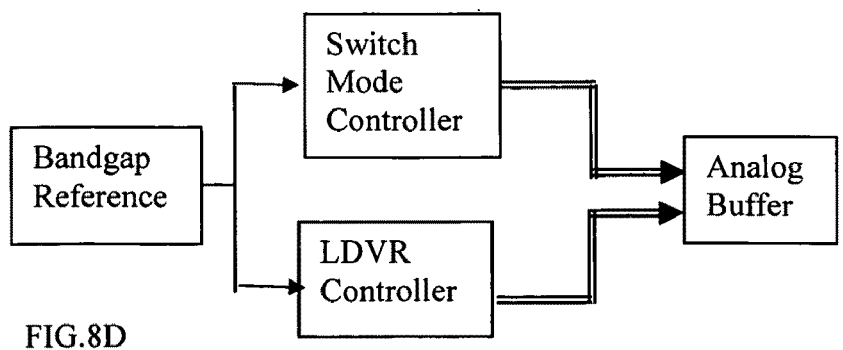
FIG.8D

| | Initial | VZ (1->0) | | | IZ (1->0) | | | | Final |
|---|---|---|---|---|---|---|---|---|---|
| | | Vin | Vout | | Vin | | Vout | | |
| | | | SC | SG | + | - | SC | SG | |
| Charge | H0 | Cg | 1->0 | 0->1 | S | G | 0 | 1->0 | H1 |
| Discahrge | H1 | Cs | 0->1 | 1->0 | G | S | 1->0 | 0 | H0 |

Table of Energy Recycling Drive

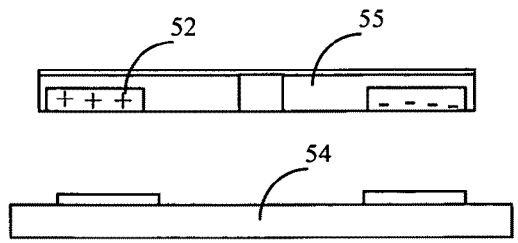
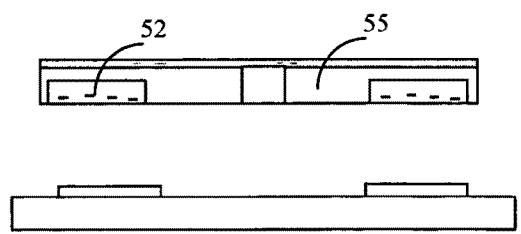
FIG.34A	FIG.34B
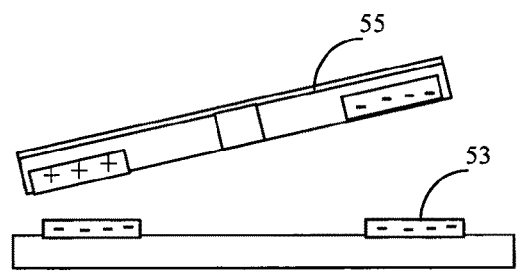
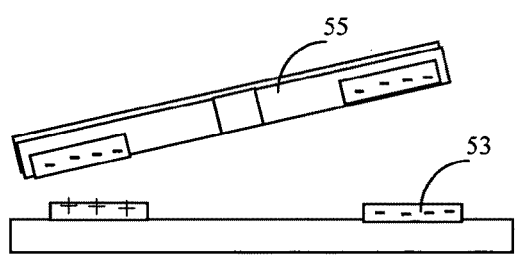
FIG.34C	FIG.34D
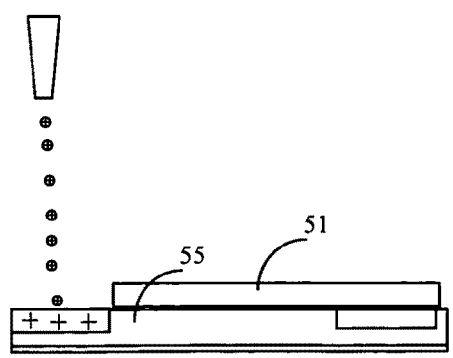
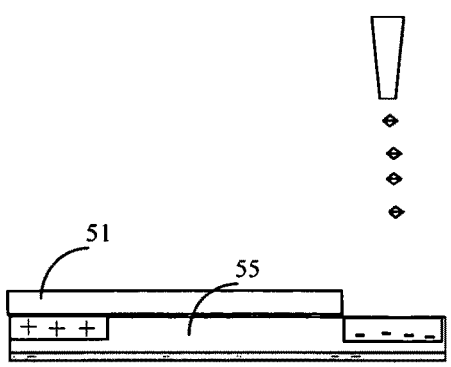
FIG.34E	FIG.34F

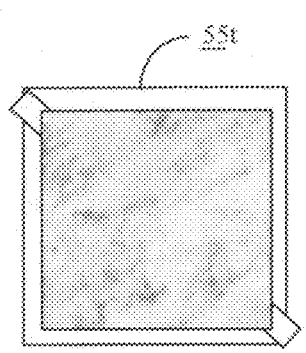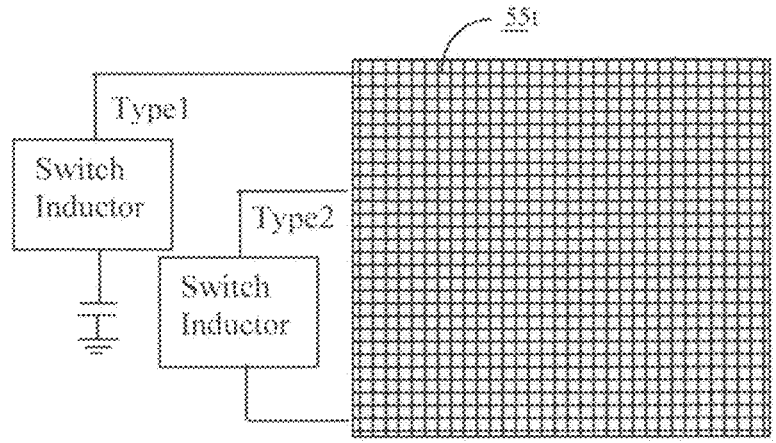
FIG.35A   FIG.35B
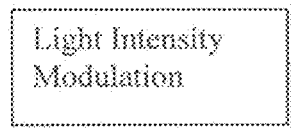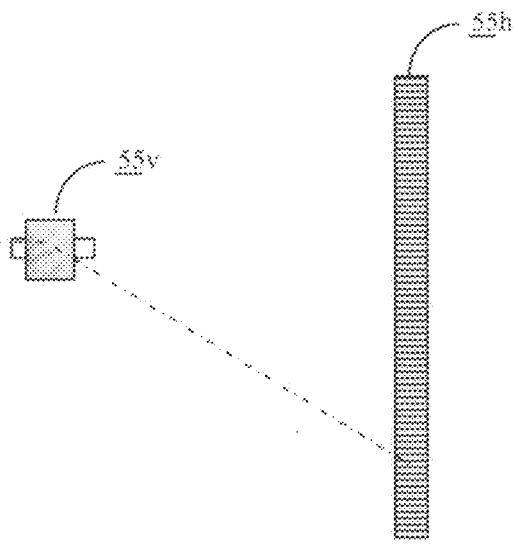
FIG.36A
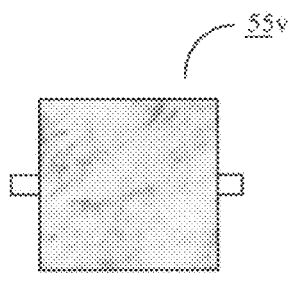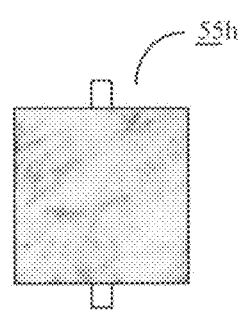
FIG.36B   FIG.36C

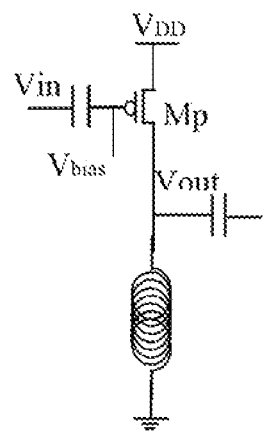
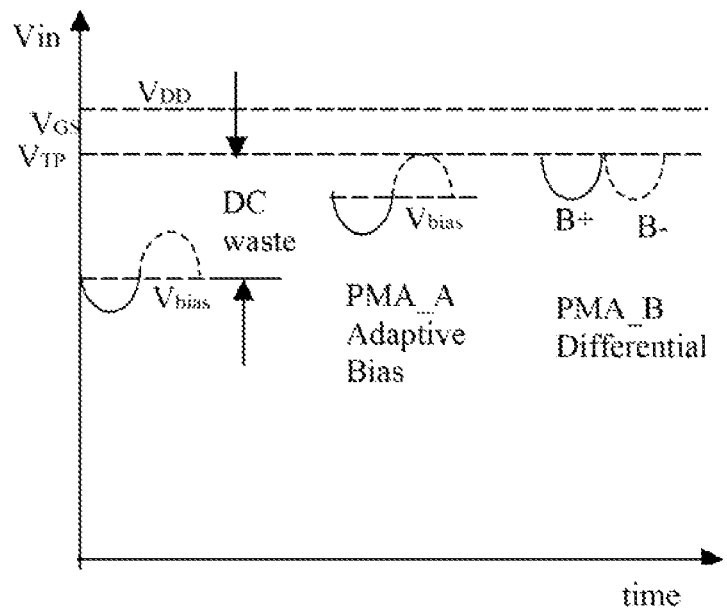
FIG.41A  FIG.41B
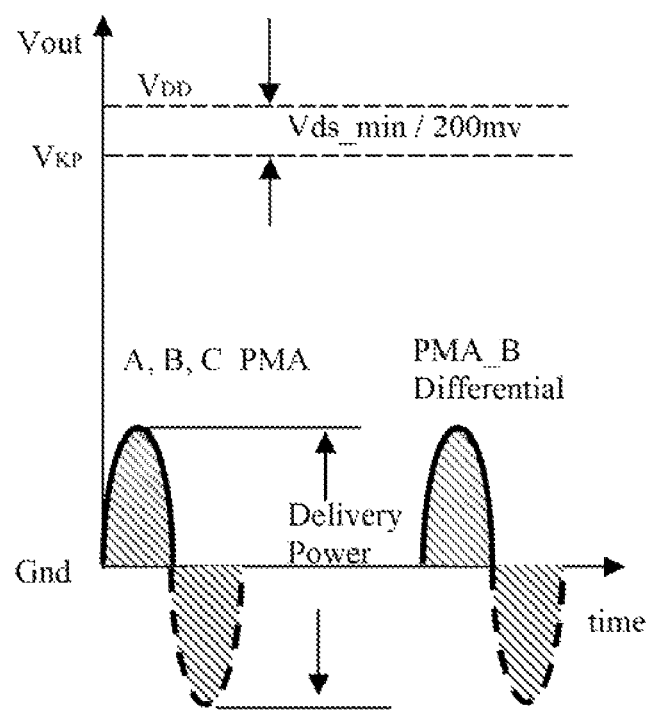
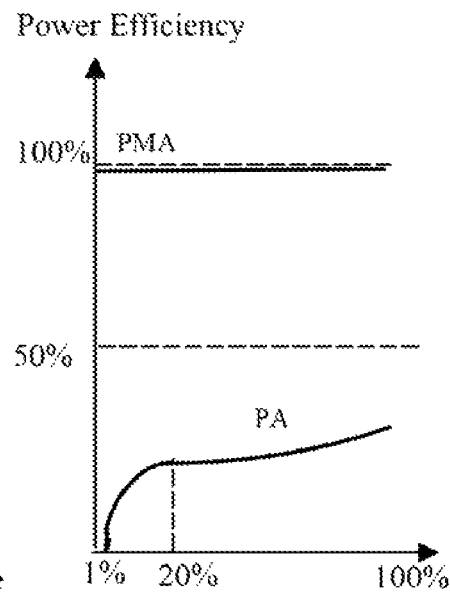
FIG.41C  FIG.41D

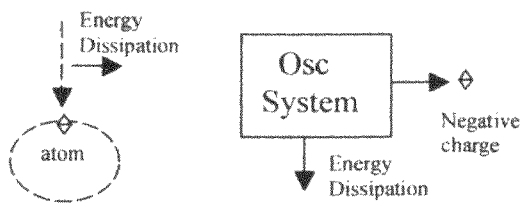
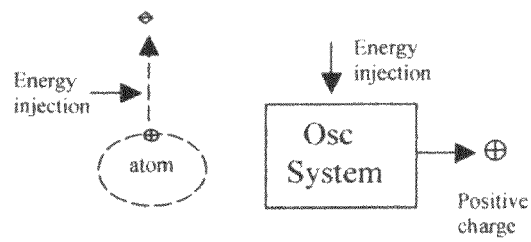
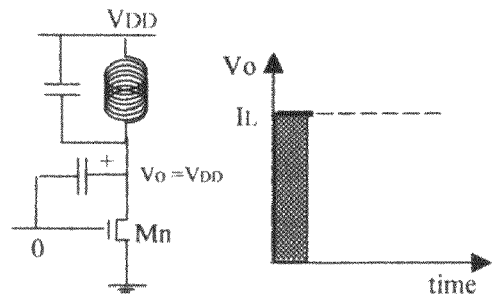
FIG.42A1
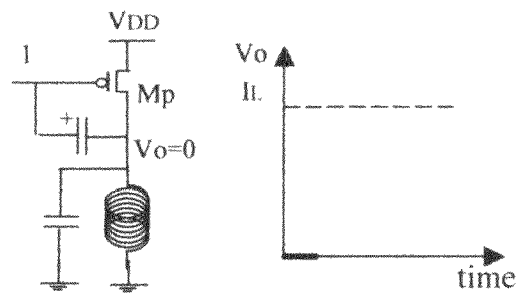
FIG.42B1
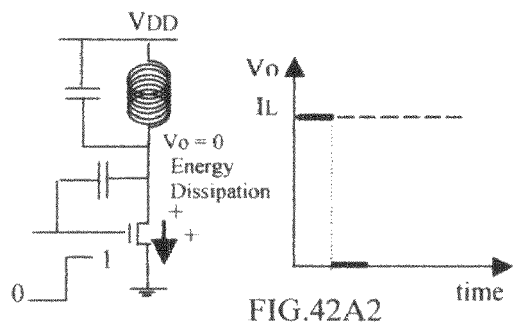
FIG.42A2
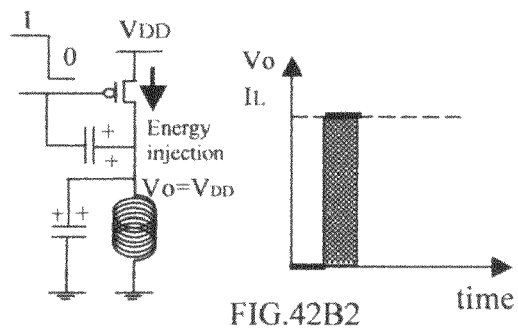
FIG.42B2
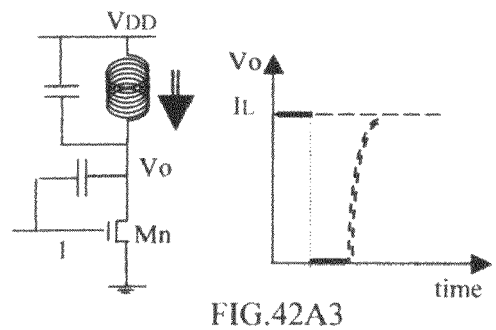
FIG.42A3
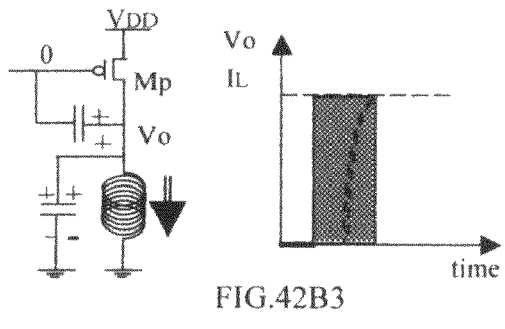
FIG.42B3
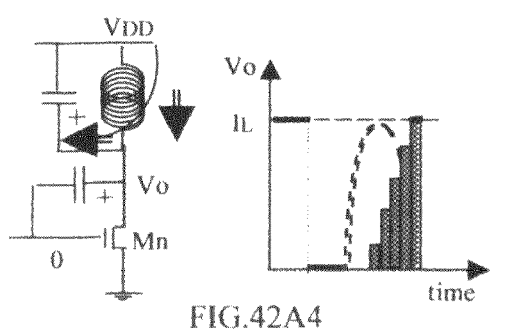
FIG.42A4
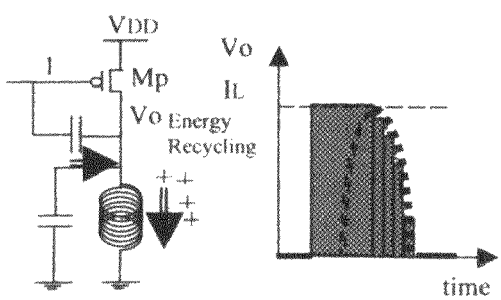
FIG.42B4

GREEN TECHNOLOGY: GREEN CIRCUIT AND DEVICE DESIGNS OF GREEN CHIP

This is a Continuation in Part application claims priority of U.S. patent application Ser. No. 11/500,125, filed Aug. 5, 2006, U.S. patent application Ser. No. 11/593,271, filed Nov. 6, 2006, now U.S. Pat. No. 7,511,589, U.S. patent application Ser. No. 12/079,179, filed Mar. 25, 2008, U.S. patent application Ser. No. 12/082,601, filed Apr. 12, 2008 which herein incorporated by reference in its entirety.

BACKGROUND

1. Field of Invention

To save the earth, we need to use the unified approach for all the different circuit theoryies to invent the green circuit design theory. In other words, we need to have the multi-disciplinary approach of analog, digital, radio frequency (RF), power management unit (PMU) and power amplifier (PA) to work altogether to find new green technology with the unified approach. With the unified multi-disciplinary approach, we have made many fundamental breakthroughs in the green circuit design theory.

For the switch mode power supply, the switching loss is the biggest problem. In the switching of the huge output driver, the charging and discharging of the huge output driver waste a lot of energy. All the energy is discharged to the ground as the heat. Due to switch loss, the switching frequency cannot be high. However, the higher the switching frequency, the smaller the inductor and capacitor are. With the high switching frequency, the inductor and capacitor can be integrated on chip to save the energy further. Now, due to no green recycling mechanism, the switching loss is high. The switching loss high, then the switching frequency is low. For the low switching frequency, the inductor and capacitor are big. The big inductor and capacitor cannot be integrated on-chip. For the on-board inductor and capacitor, it needs energy to drive the large on-board inductor and capacitor. Therefore, the on-board large inductor and capacitor are not only waste material but also waste energy. The switch loss has a lot catastrophic disastrous effects.

With the green re-cycling mechanism, the switching loss is minimized that the switching frequency can be increased. With the high switching frequency, the size of the inductor and capacitor can be reduced to be integrated on-chip. With the on-chip inductor and capacitor, the energy is saved further.

For the power amplifier PA, all the cellular phones need the power amplifier. For the 3G, the PA uses 75% power of the cellular phone. However, the power efficiency is only 10%. Charging the battery take half hour and the cellular phone can use 2 days. However, for the 4G 4th Generation cellular phone, it uses the OFDM Orthogonal Frequency Division Multiplex modulation. For the OFDM, the PAR Peak Average Ratio is very large that the power dissipation is very large. There is no DC signal can be transmitted that the DC biasing is just waste. For the small signal in OFDM, the large DC biasing current is dissipated as heat.

For the 4G, the power efficiency is only about 1% and 99% of the energy is dissipated as heat. The battery size of 4G is about 8 times larger than the battery of 3G cellular phone. Charge for 2 hours and uses for 3 hours. It needs two batteries to swap between the battery charging and battery use.

For our invention, we make green energy means having the three innovations to solve the PA problem in 4G.

(1) we use the differential structure to have the voltage bias of zero DC current to get rid of the energy wasted by the DC current;
(2) We use the dynamic storage LC tank to store the reflected energy and the DC energy;
(3) Recycling the stored energy to be the transmitting energy again.

With the green energy means, even for the 4G cellular phone, the power efficiency can be 75%. It can save many nuclear power plants in the U.S.

Conservation of the earth resource becomes a Green Movement. Not only recycling the material but also the energy needs to be recycled. Applying the energy-recycling concept in the circuit and chip design, it becomes the new styles of circuit and chip design, Green Circuit Design for Green Chip. The Green Circuit Designs for Green Chip includes many versatile fields, from the battery of electrical vehicle (EV), etc to RF Power Amplifier of cellular phone and plasma light, etc. We will apply the re-cycling energy concept in all the power-hungry design.

For the $3^{rd}$ generation cellular phone, the battery can use for three days. However, for the $4^{th}$ generation cellular phone, the battery is charged for two hours and used for three hours only. Comparing with the $3^{rd}$ generation cellular phone, the size of the $4^{th}$ generation cellular phone is about four times bigger and the battery is slide on the cellular phone. There are two batteries in one package. One battery is in use and the other battery is in charge. Therefore, we have to reduce the power of the portable cellular phone and personal computer for the coming age. The 75% of the power of wireless media is power amplifier. We need to increase the efficiency of the power amplifier.

For lighting, even bulb uses the Power Amplifier to light plasma bulb. The power amplifier has the low efficiency 30% only. It makes the energy loss tremendously. We have to develop the new circuit design style of the "switch inductor" and the "asynchronously event driven state machine" for the green circuit design of the green chip.

To increase the efficiency of the power amplifier, it needs the power management. To increase the efficiency of the power management, it needs to reduce the switching loss. To reduce the switching loss, it needs to recycle the energy. To recycle the energy, it needs the switch inductor.

The green circuit design is the switch inductor with the recycle of energy. The switch inductor is the conjugate concept of the switch capacitor. The switch capacitor has the sample & hold concept. The switch inductor has the switch & hold concept. The switch & hold of the switch inductor is the conjugate concept of the sample & hold concept of the switch capacitor.

With the switch inductor, the recycling circuit is much different from the resonant circuit. The resonant circuit doesn't have the switch. The energy is cycling in the resonant circuit with the natural frequency. The recycling circuit has the switch to control the flowing direction and the recycle of the energy.

The switching loss is $P_{Loss} = fC\Delta V$ where f is the switching frequency. The larger the frequency f is, the larger the power loss $P_{Loss}$ is. Before, the switching loss of the buck converter forbids the operating frequency to operate at high frequency. With the recycling energy, we can increase the switch frequency f without the increment of switch loss. Furthermore, with the increase of the switch frequency f, the device size L and C in the output driver of the buck regulator can be reduced that the L and C can be reduced and become the inductor-less and capacitor-free design.

The recycling energy of the switch inductor had better to work with the advanced control technology of the Adaptive Non-overlapping Crossing Zero Voltage Detector (VZ) and the Adaptive Zero Current Detector (IZ). With the VZ and IZ events, the event driven state machine can be developed to replace the clock driven state machine.

Furthermore, the new standard for the power management has set. The ripple of the power has set to be less than the 10 mV. It forces the power chip to use the multi-phase PWM. The multiphase power supplies still increase the switch loss. Now, with the re-cycling of the energy, the switch loss can be neglected and the output driver size is kept the same. Furthermore, increase the frequency, the driver size can be reduced. Therefore, the multi-frequency power supply is much better than the multi-phase power supply.

Both the PC and the wireless products have to solve the dynamic variance of the power management. The PC power management has the sudden requirement of current. The wireless power management has the sudden large variance of the voltage. To meet the sudden change of power requirement, the LDVR has to work with the switch mode power supply. At the normal operation, the switch mode power works to have the high efficiency. For the sudden variance of the current and/or voltage, the LDVR buffer will step in to boost up the voltage for the large crest factor of the large PAR (Peak to Average Ratio). Therefore, we need to have the unified approach to merge the Low Drop Voltage Regulator (LDVR) with the Switch Mode (SM) power supply.

The Scaling Power Management for Power Amplifier can increase both the efficiency of the power amplifier and the linearity of the power amplifier. The signal will see the same scaling power over input factor of (Vdd/Vi) that the gain of the power amplifier is linear over all the input Vi. It will increase the linearity of the power amplifier.

The Scaling Power Management is different from the envelope extraction of the power amplifier. The envelope extraction has the power level to be the exact shape of the waveform of the envelope. The Scaling Power Management doesn't need to have the exact shape of the input information. Furthermore, it keeps the safety margin that the output signal will not be truncated.

To increase the efficiency and the linearity of A type power amplifier, the adaptive-bias A type power amplifier is to have the bias of the operating point to vary according to the amplitude of the input voltage. To increase the efficiency further, the Conjugate-B-High-Linear-High Efficiency Power differential B type power amplifier is developed. The DC level of the input voltage is eliminated that the power efficiency can increase a lot.

Furthermore, the RF designers didn't have the new analytic methodology of the output power efficiency before. They fail to recognize the power amplifier problem. Now, with the multi-disciplinary of analog, digital, RF, power management and power amplifier, we invent the new analytic methodology of the output power efficiency and the new power managing amplifier (PMA) architecture. Now, with the green design, we have developed new style of power amplifier design to save the more than 80% energy.

2. Description of Prior Art

There is the dream of the green chip. However, nobody recognize the green chip problem is the green circuit. There is no systematic research work on the green circuit design. Since there is no fundamental research of the green circuit, the green chip concept is just a dream which cannot be implemented. In the past, the American car is a big car. The big car consumes a lot of fuel as consuming water does. Now, both the fuel and water become the scarce resource. We must have the conservation concept of both energy and resource. Before, the circuit design used the clock driven switch capacitor and the clock driven synchronous state machine design. The clock driven design has all the circuit to start to work at the clock edge and has the power surge. It generates a lot of power noise.

Before the power amplifier has the extremely low power efficiency being 10%. For the base station, the total energy efficiency is even lower to be 3%. Therefore, we need to increase the power efficiency for the power amplifier with the green circuit design of the green chip.

The modulation of the wireless standard has the low peak to average ratio (PAR) before. Now, for the $4^{th}$ generation of the cellular phone and wireless standard, the peak to average ratio (PAR) is much higher. It pushes the operating point back off to the lower power efficiency operating range.

Furthermore, today power management is addressed to be the PC problem. The power management has the problem of latency. It cannot meet the requirement of the dynamic response of PAR of the wireless problem. Even the analog buck regulator cannot meet the fast transient of the load regulation, not to mention the digital buck regulator. Therefore, in our new approach, we have the unified approach to unify the fast LDVR with the normal operation SM together.

Today, the power amplifier has very low efficiency. To increase the efficiency, we need to work on the power management of the power amplifier. However, there is seldom considering both the power management and power amplifier at the same time. The power management cannot meet the transient behavior requirement of the power amplifier. However, there is no work address on the issue of the power management for the power amplifier. Today, the architecture of the power management has the fundamental problems. It never meets the tough requirement of the power amplifier. Therefore, the problem of the power management for the power amplifier is just left there. The power amplifier has the power efficiency to be 10% only.

The modern PMU design is load adaptive. It is not only designed for the voltage of power supply but also for the fast transient of the power supply. However, until recently the industry start to consider minimizing the ripple of the power supply. The power industry still doesn't consider the fast transient of the power supply. For the ripple of the power supply, the power manufacturer and venders just use the huge capacitor to walk around the fast transient of the power supply. However, for the wireless power amplifier, to increase the power efficiency, the supply power voltage needs to track the variance of the amplitude envelope of the input signal. The power supply needs to trace the amplitude envelope of the input signal in mega frequency range. It is far beyond the traditional PMU approach. Therefore, the traditional PMU just does not work in the green circuit technology. We need to make the innovation in the green PMU technology.

Objects and Advantages

We develop the fundamental green circuit theory and methodology for the design of the green chip. The fundamental green circuit includes the switch inductor, energy/charge recycling circuit, feed forward with local feedback, the merge of the SM with LDVR for the dynamic loading adaptive power management, Zero Voltage Crossing detect, Zero Current Crossing detect, differential B power amplifier, bias adaptive A power amplifier, input scaling power amplifier power management and the high-efficiency and high linearity power managing amplifier, etc. With the combination of the above green circuit design, both the efficiency and the linearity of power amplifier will increase a lot. The home plasma light has high power and light efficiency of 95% will achieved. With the green technology, the electrical vehicle (EV), the wireless of PC and cellular phone, and plasma light, etc will reduce the total energy consumption of the earth more than 80%.

DRAWING FIGURES

FIG. 1 is the energy flow for the green power system which includes the power flow for the electronic system, the power flow for the optoelectronic system and electrical vehicle system, etc.

FIG. 2(A) is the transient behavior of the green power management of clock driven system-on-chip (SOC); (B) is the green power management for the modulated signal behavior of $4^{th}$ generation wireless signal; (C) is the wireless input for the class A power amplifier which has the adaptive bias; (D) is the wireless input for the class B power amplifier; (E) is the green power management for the Electrical Vehicle (EV) battery; (F) is the green power safety management for the Electrical Vehicle (EV) battery; (G) is the green power management for the plasma light bulb with power amplifier of PA or power managing amplifier PMA; (H) is the dimmer of plasma light bulb of PA type power amplifier and PMA type power amplifier.

FIG. 8(A) is the power management (PMU) system of the prior art; (B) is the analogy of the digital level shift to the Low Drop Voltage Regulator (LDVR) architecture as shown in FIG. 8C; (C) is the analogy of the Low Drop Voltage Regulator (LDVR) to the digital level shift circuit as shown in FIG. 8B; (D) is the unified approach of the green design of PMUx.

FIG. 10 is the recycling energy with switching inductor to switch from gate holding 1 state to gate holding 0 state; (A) is the gate holding state H1; (B) is the switch gate state (SG) of the switching inductor; (C) is the switch capacitor state (SC) of the switching inductor; (D) is the gate holding state H0; (E) is the switching waveform of the switching inductor to switch from gate holding 1 state to gate holding 0 state.

FIG. 11 is the recycling energy with switching inductor to switch from gate holding 0 state to gate holding 1 state; (A) is the gate holding state H0; (B) is the switch capacitor state (SC) of the switching inductor; (C) is the switch gate state (SG) of the switching inductor; (D) is the gate holding state H1; (E) is the switching waveform of the switching inductor to switch from gate holding 0 state to gate holding 1 state.

Figure 12:
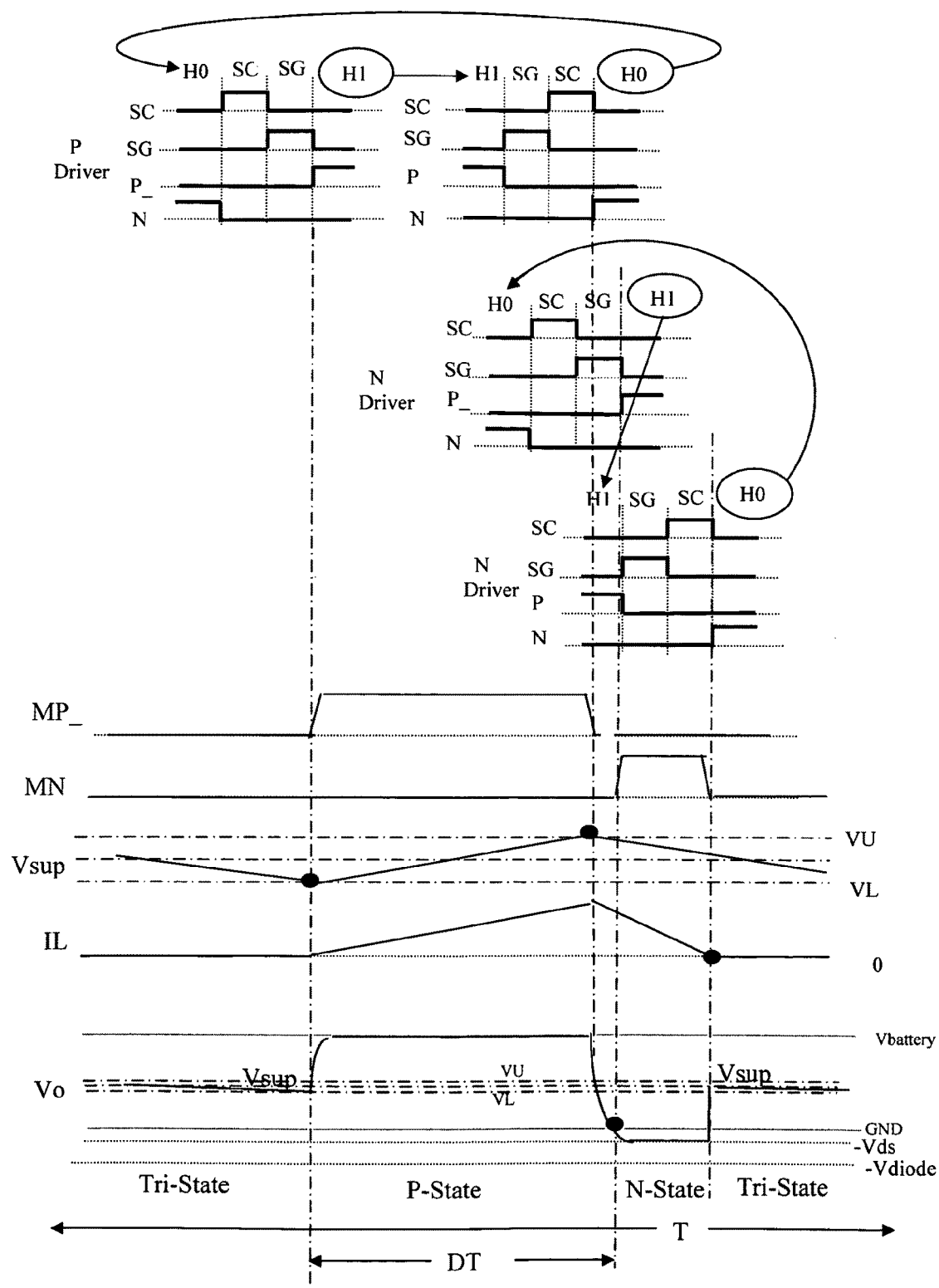

FIG. 12 is the hierarchical waveform of the recycling energy green circuit design for Green Power Management Unit (GPMU).

Figure 13A:
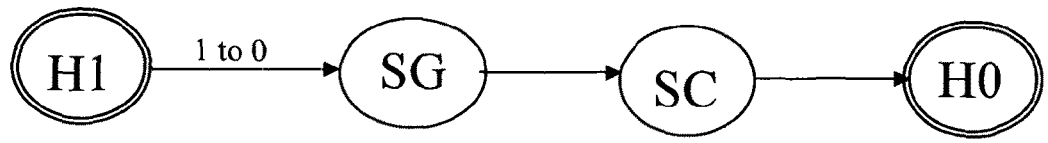

FIG. 13(A) is the state transition diagram from H1 to H0; (B) is the state transition diagram from H0 to H1; (C) is the combinatory state transition diagram recycling energy between H0 and H1; (D) is the LDVR and SM synchronous PMU having the combinatory state transition diagram recycling energy between H0 and H1.

Figure 14A:
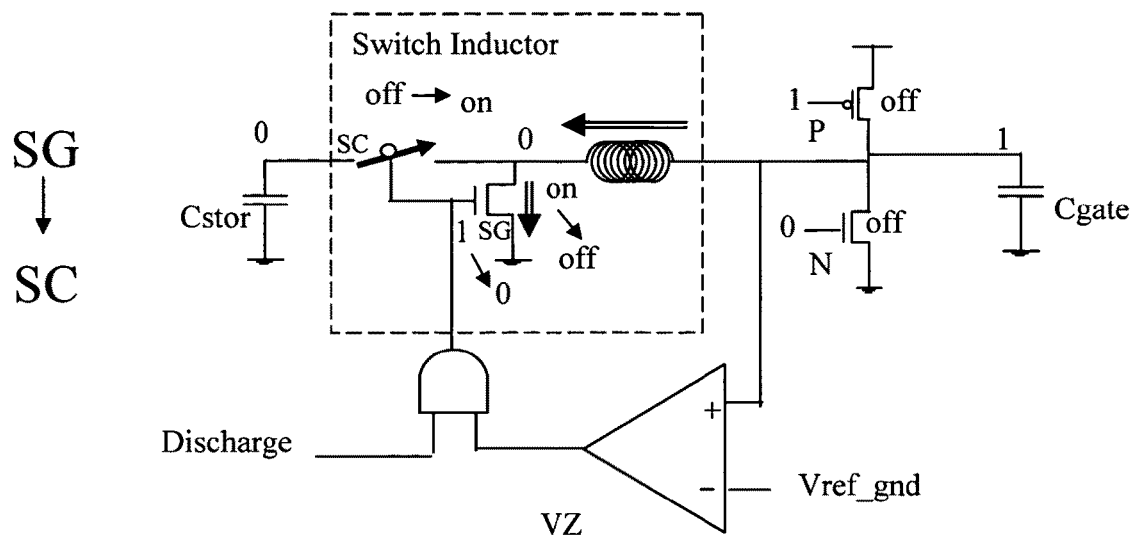

FIGS. 14(A) and (B) are the event driven state diagram for the transition from H1 to H0; (A) is the transition from SG to SC being triggered with the zero voltage VZ event; (B) is the transition from SC to H0 being triggered with the zero current IZ event; (C) and (D) are the event driven state diagram for the transition from H0 to H1; (C) is the transition from SC to SG being triggered with the zero voltage VZ event; (D) is the transition from SG to H1 being triggered with the zero current IZ event.

Figure 13B:
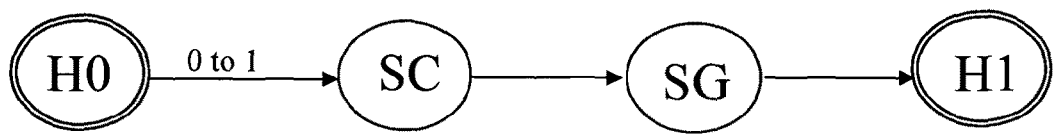
Figure 13C:
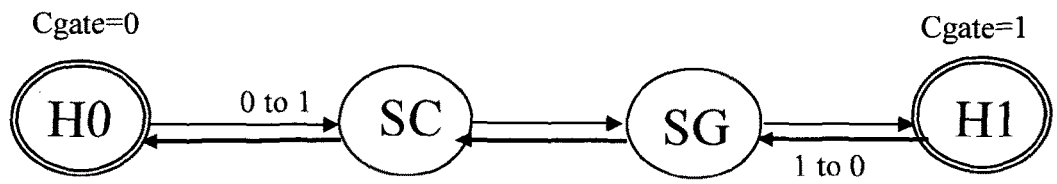

FIG. 15 is the recycling mechanism corresponding to the state diagram as shown in FIG. 13C; (A) is the zero voltage-crossing event (VZ); (B) is the zero current crossing event (IZ).

Figure 15A:
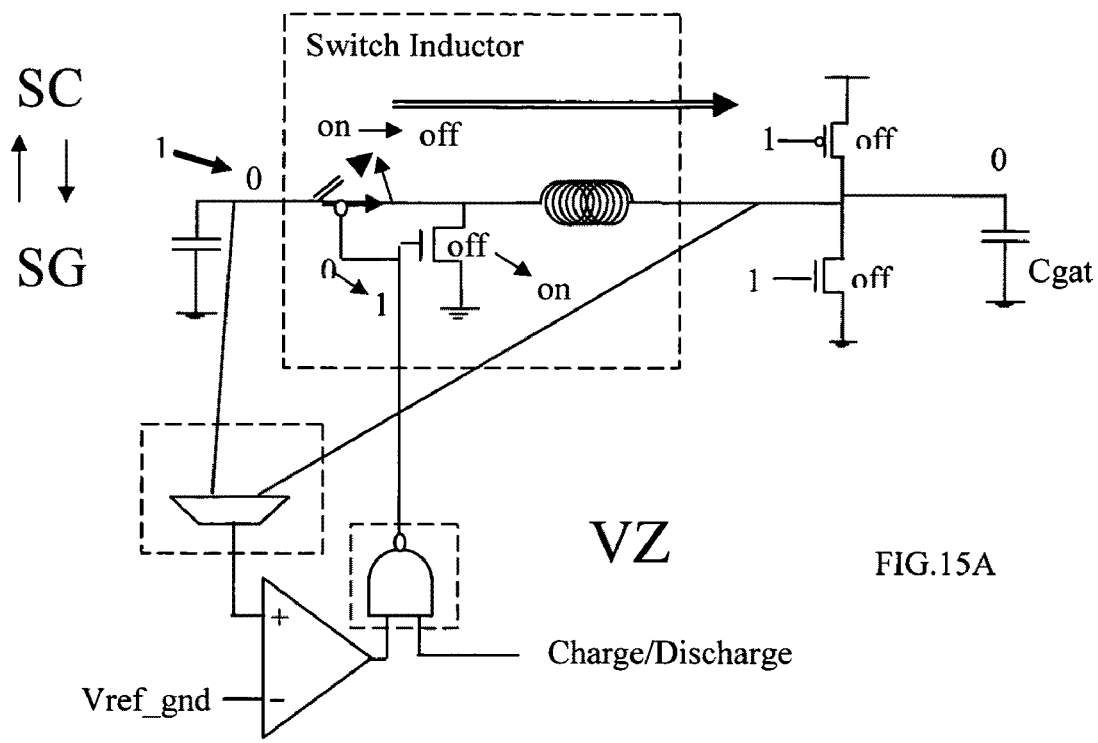
Figure 15B:
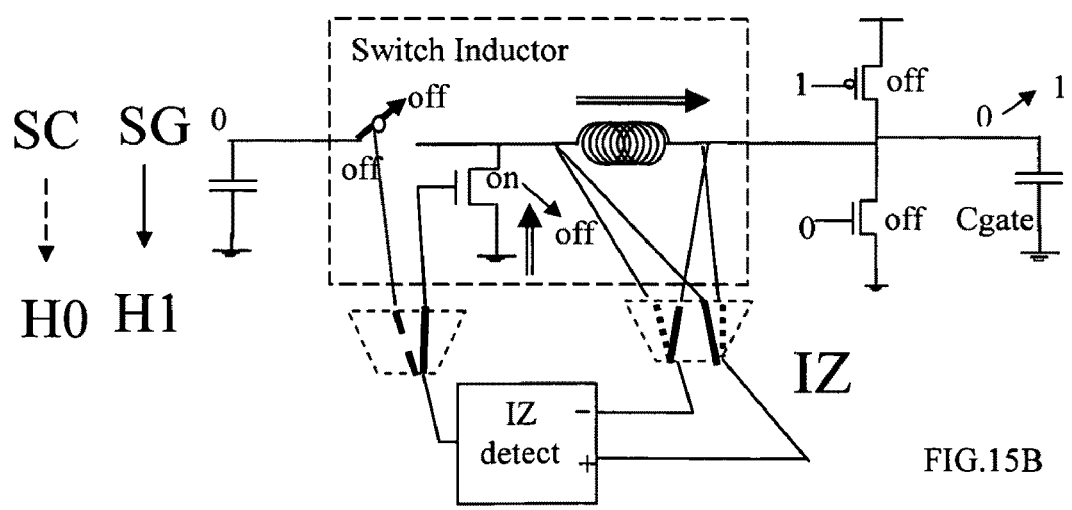
Figures 16, 17:
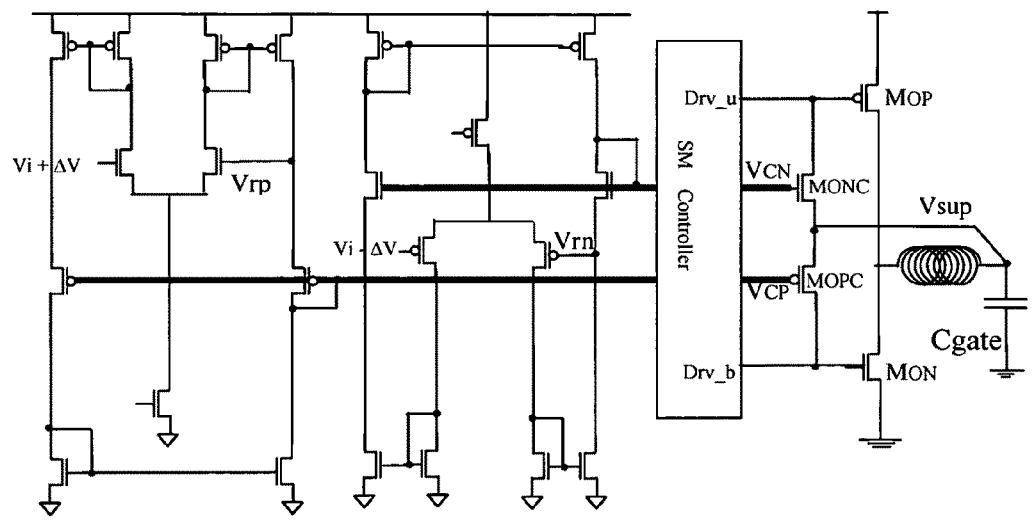

FIG. 16 is table for the Energy Recycling Drive corresponding to FIG. 15.

FIG. 17 is the fast transient response power management unit (PMUx) with the low drop voltage regulator (LDVR) triggering switch mode (SM) buck regulator.

Figure 9:
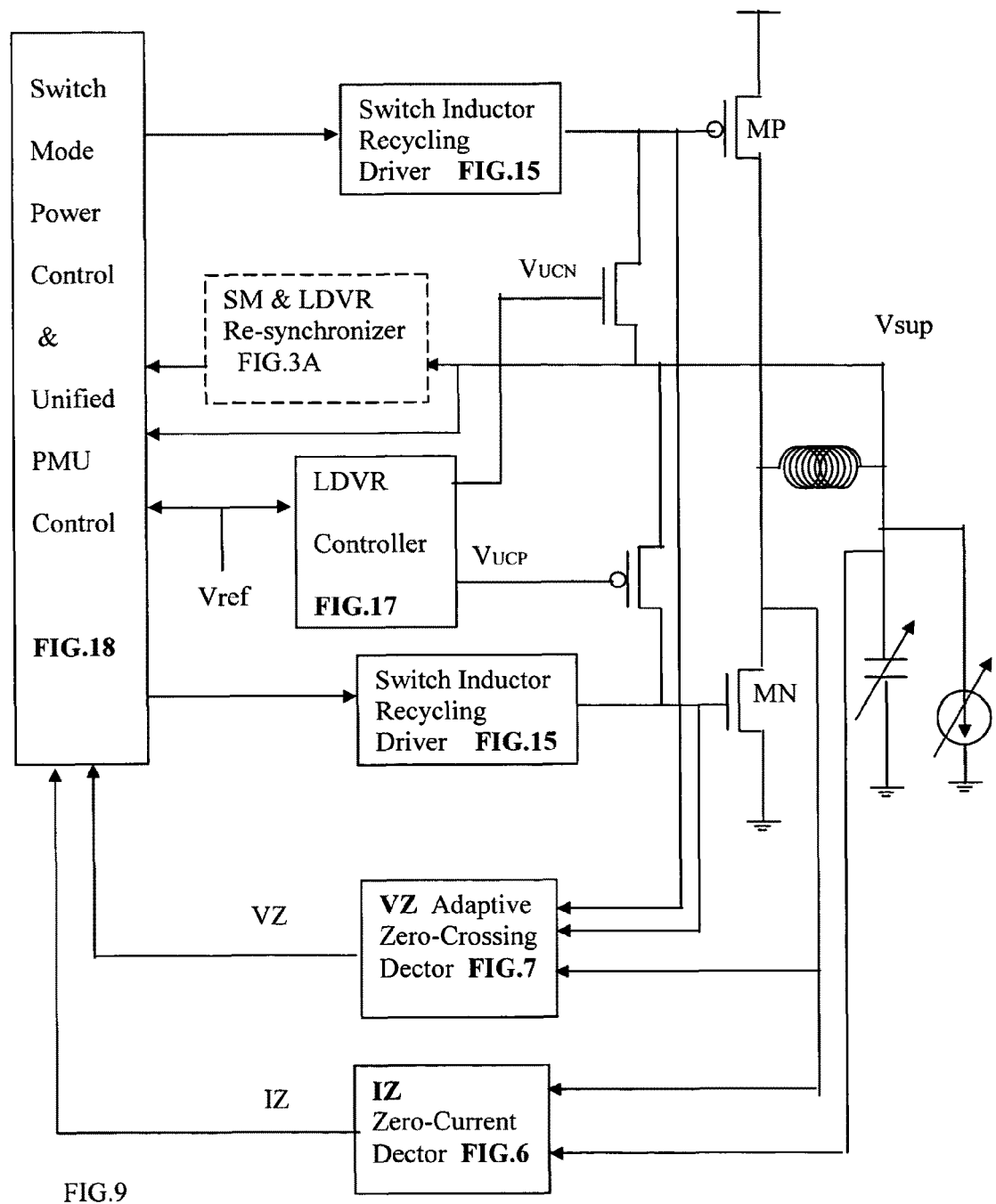
FIG. 9 is the high-level block diagram of schematics for the unified approach of the green design of PMUx in FIG. 8D.
Figure 18:
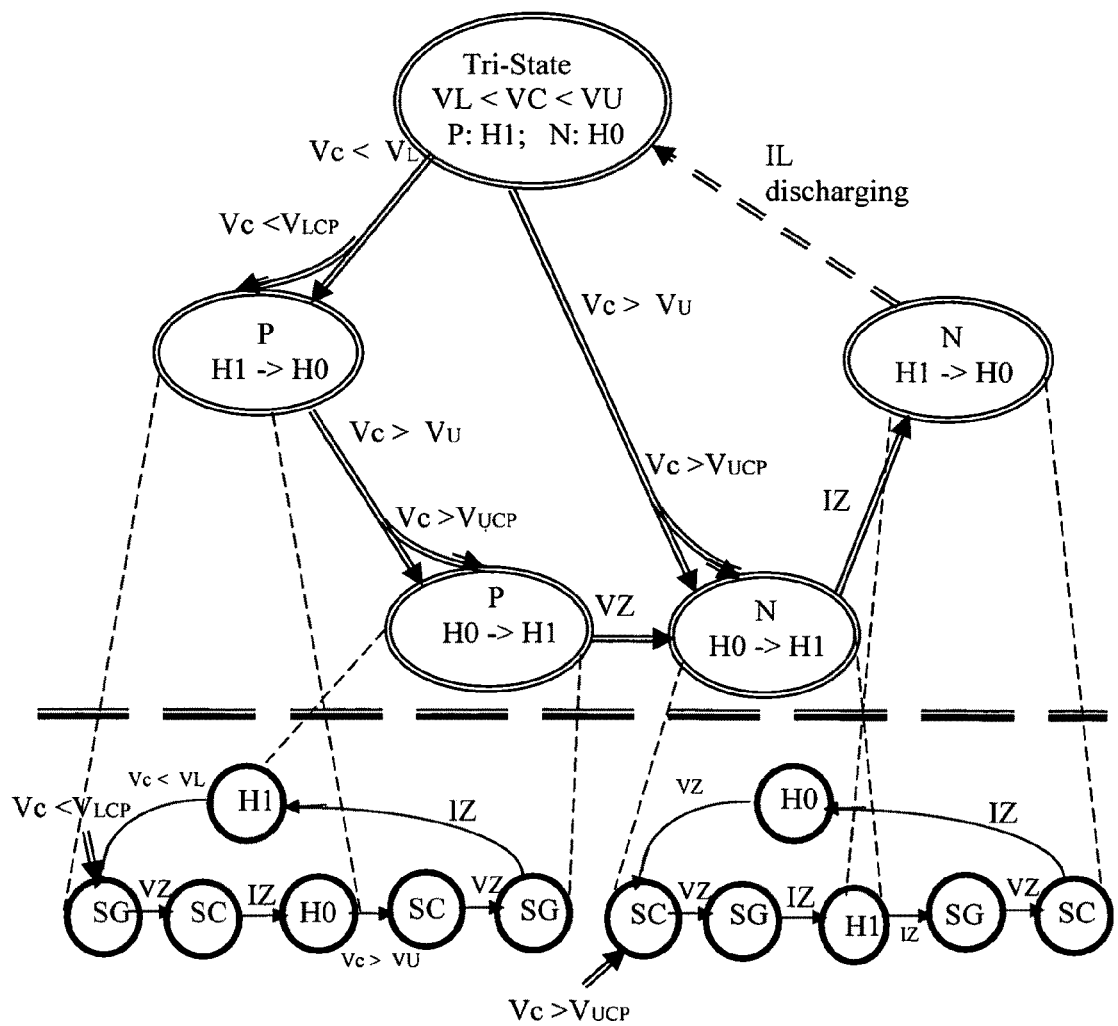

FIG. 18 is the hierarchical state diagram for the green PMUx of FIG. 9.

Figure 19A:
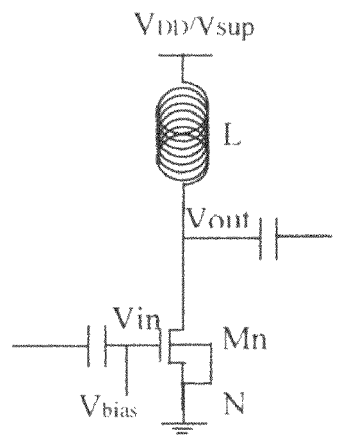

FIG. 19(A) is the generic circuit of the power amplifier; (B) is the biasing voltage effects on the power dissipation; (C) is the power supply $V_{DD}$ effects on the power dissipation.

FIG. 20 is the A type power amplifier PA-A; (A) is the operation of the conventional PA-A; (B) is the operation of the green PA-A; (C) is the circuit of the green PA-A.

Figure 21A:
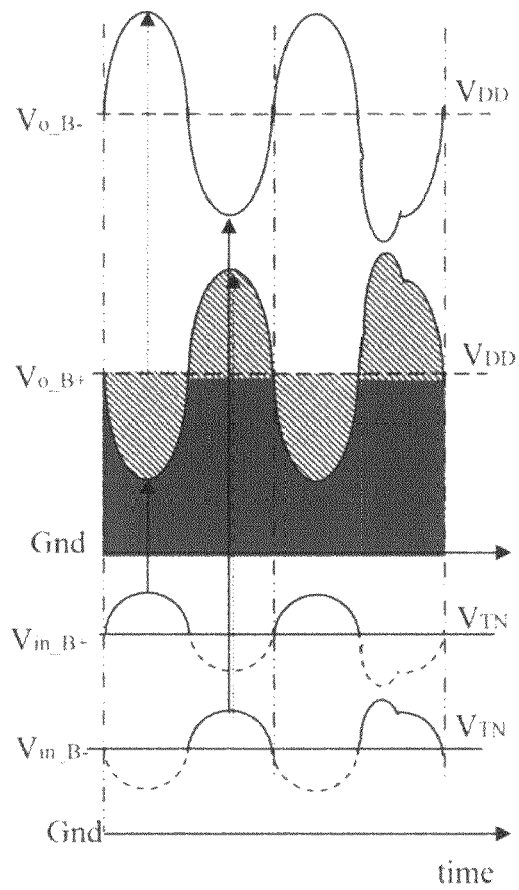

FIG. 21(A) is the operation of the differential B type power amplifier PA-B; (B) is the operation of the differential C type power amplifier PA-C; (C) is the Doherty amplifier with the differential B type power amplifier PA-B and the differential C type power amplifier PA-C.

Figure 22A:
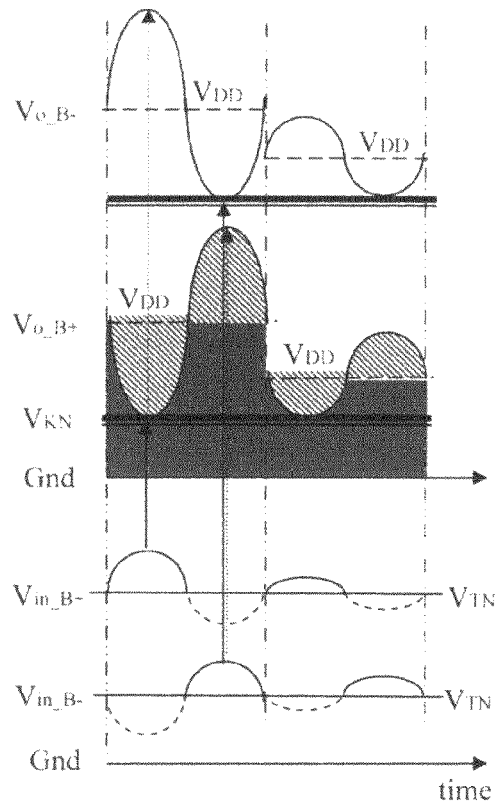

FIG. 22(A) is the operation of the differential B type power amplifier PA-B having the scaling power supply; (B) is the operation of the differential C type power amplifier PA-C having the scaling power supply; (C) is the Doherty amplifier with the differential B type power amplifier PA-B and the differential C type power amplifier PA-C having the scaling power supply.

FIG. 23 is the MOS version differential power amplifier; (A) is the complete differential PA having the recycling energy resonator and the feedback latch type switch; (B) is the PA with the recycling LC resonator; (C) is the PA having the N-side feedback switch and the recycling energy resonator; (D) is the differential PA with the recycling energy LC resonator; (E) is the differential PA with the recycle inductor and the cross feedback latch.

FIG. 24 is the bipolar version differential power amplifier; (A) is the complete differential PA having the recycling energy resonator and the feedback latch type switch; (B) is the PA with the recycling LC resonator; (C) is the PA having the N-side feedback switch and the recycling energy resonator; (D) is the differential PA with the recycling energy LC resonator; (E) is the differential PA with the recycle inductor and the cross feedback latch.

Figure 25A:
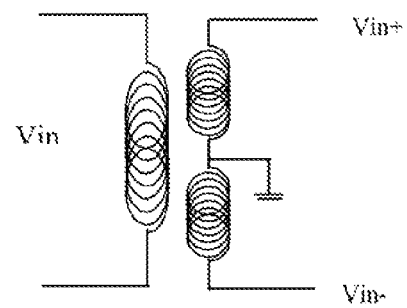

FIG. 25(A) is the single to differential conversion balun; (B) is the MOS version of single to differential conversion and differential PA; it is for both B type power amplifier PA_B and C type power amplifier PA_C; (C) is the bipolar version of single to differential conversion and differential PA; it is for both B type power amplifier PA_B and C type power amplifier PA_C.

Figure 26A:
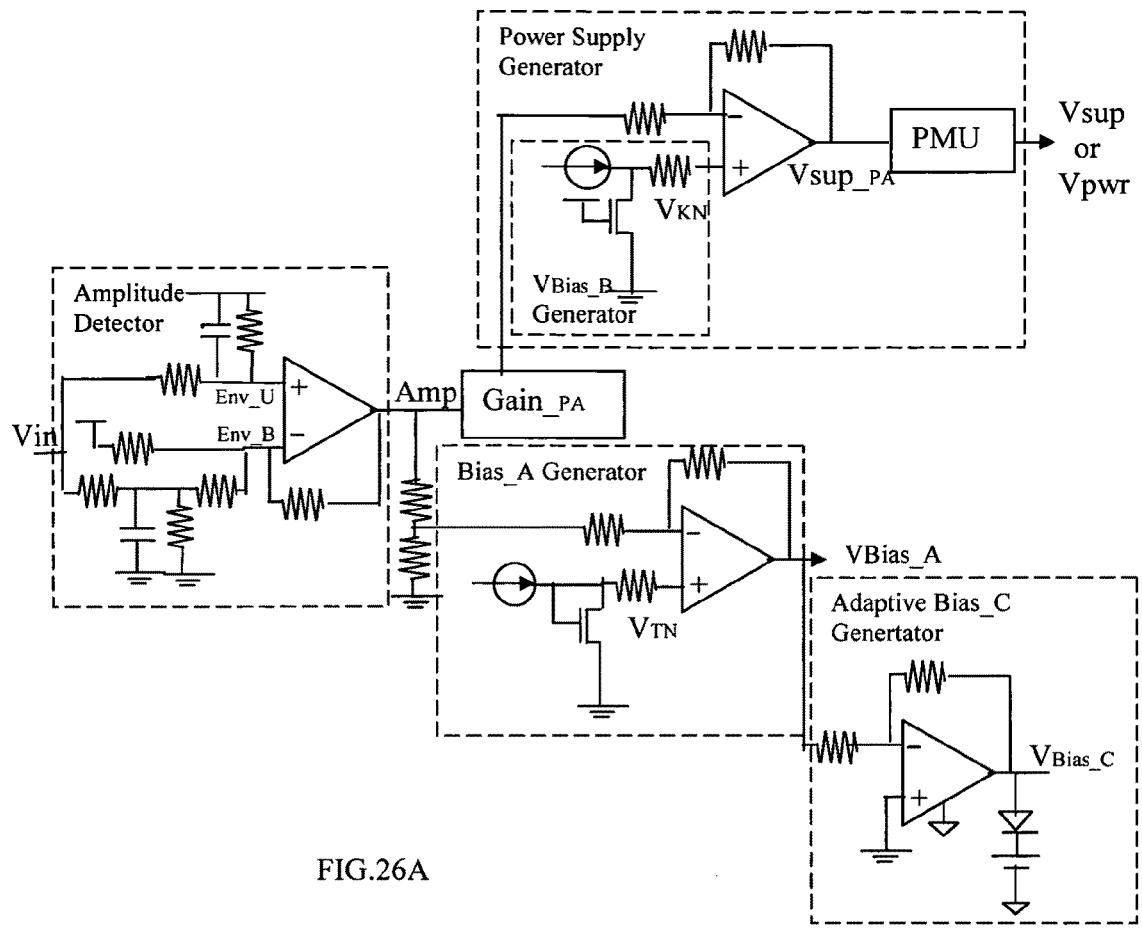

FIG. 26(A) is the power scaling voltage generator, the adaptive A type power amplifier PA_A biasing generator and the adaptive C type power amplifier PA_C biasing generator; (B) is the adaptive C type power amplifier PA_C biasing; (C) is the adaptive C type power amplifier PA_C biasing with power scaling voltage.

Figure 27A:
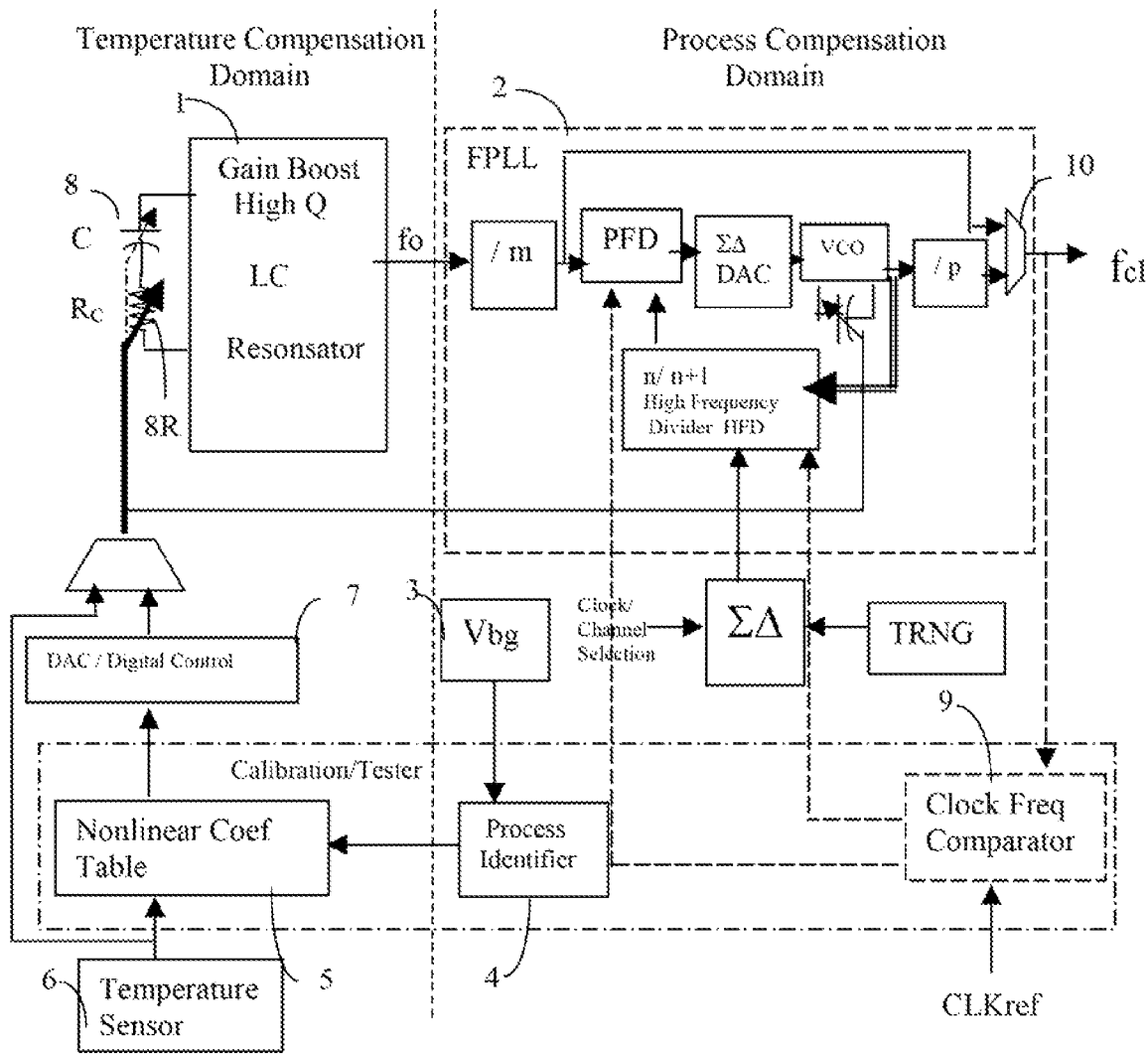

FIG. 27(A) is the on-chip Xtaless clock generator for green chip design; it has the LC tank resonator and frequency-phase lock loop FPLL with ΣΔ Average and frequency compensation over temperature with the adjustment of resistance; (B) is the VCO having the frequency compensation over temperature with the adjustment of resistance as shown in FIG. 27A.

Figure 27B:
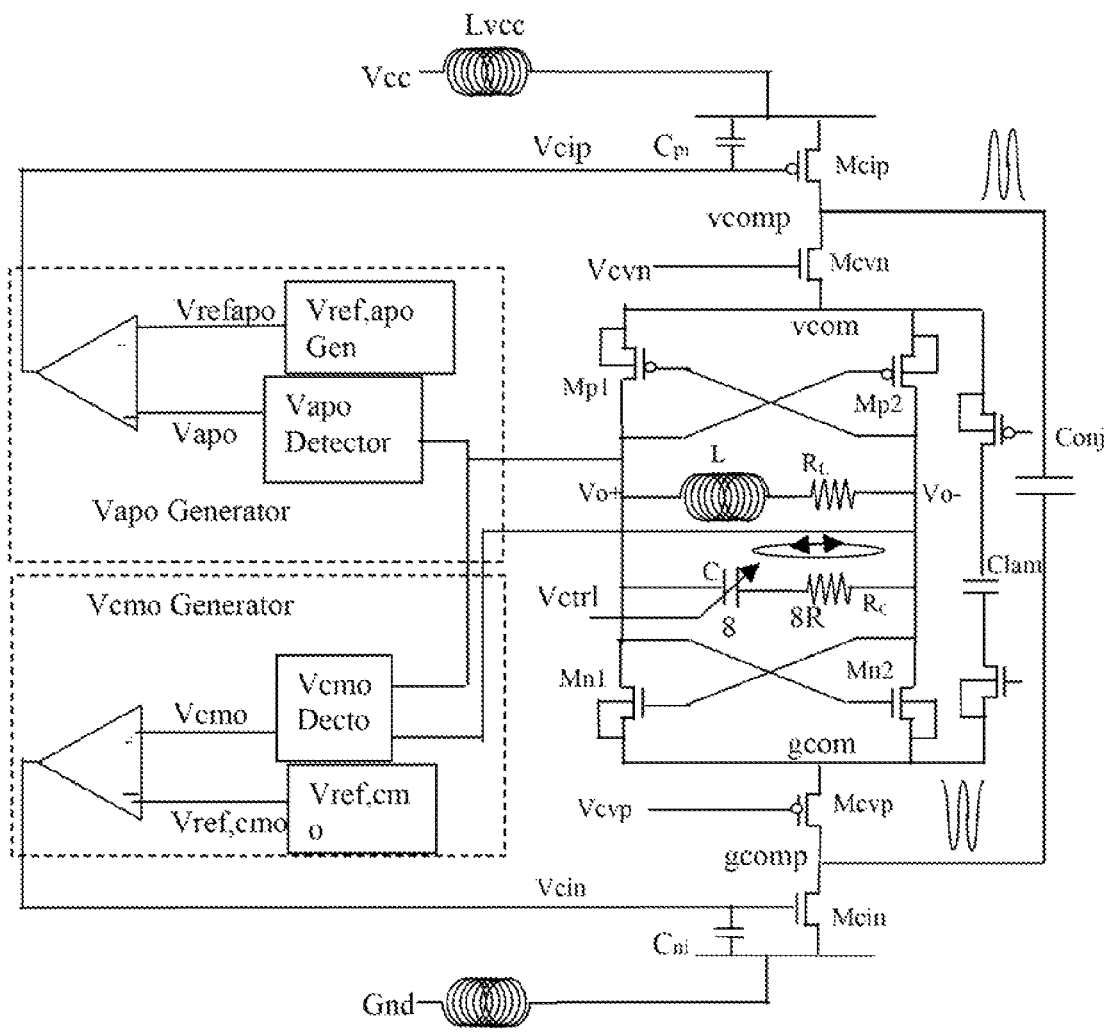
Figure 28A:
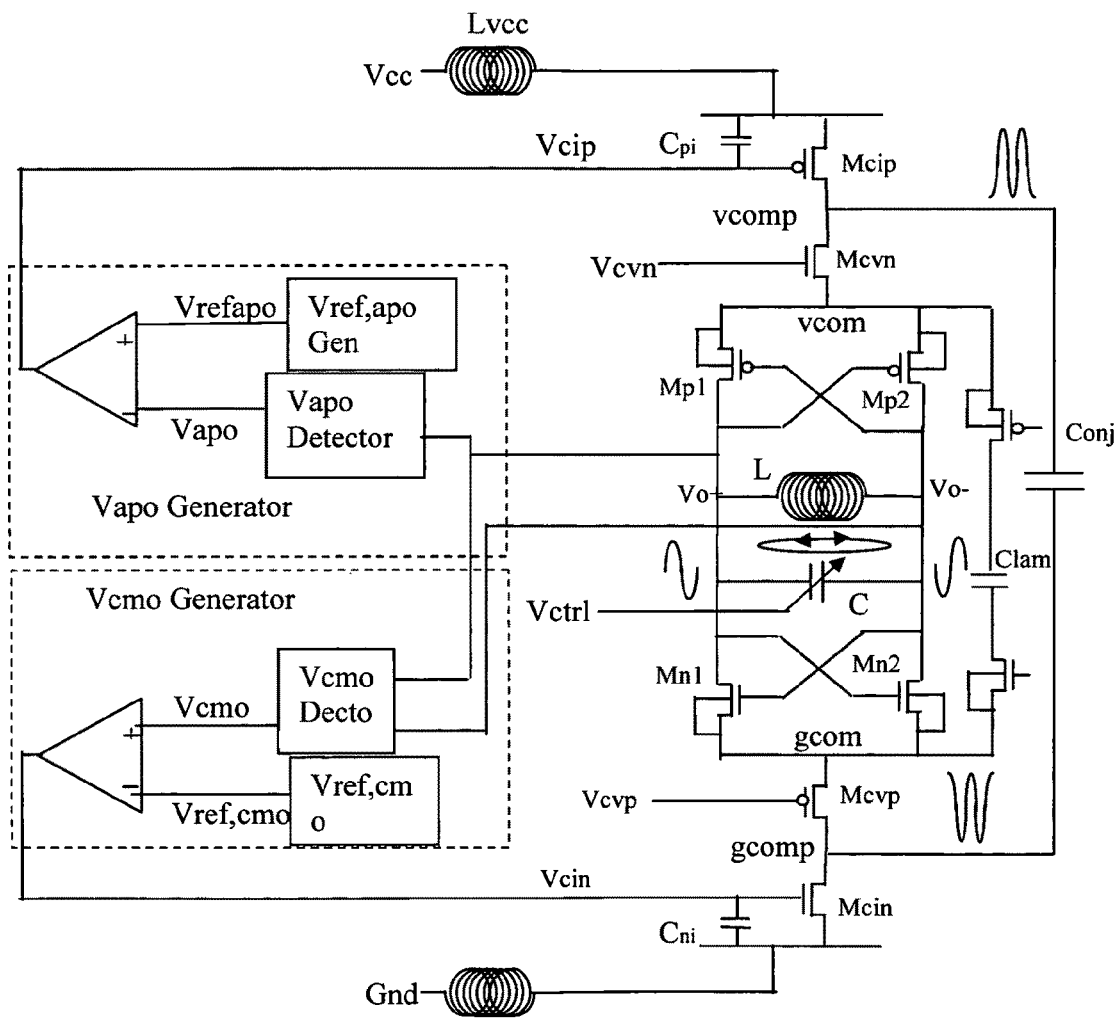

FIG. 28(A) is the LC resonator for the Xtaless clock generator and the FPLL of green chip design as shown in FIG. 27: (B) is the green circuit of the high speed low power latch for the LC resonator for divider of the Xtaless clock generator as shown in FIG. 27; (C) is the green circuit of the high speed low power FIFO for divider of the LC resonator for the Xtaless clock generator as shown in FIG. 27; (D) is the low power high speed logic/digital circuit clock waveform of preset and evaluation as shown in FIG. 27; (E) is the OR/NOR gate of low power high speed green logic circuit; (F) is the AND/NAND gate of low power high speed green logic circuit; (G) is the characteristics curves of the submicron MOS device; (H) is the low power bandgap voltage reference generator for the green circuit design.

Figure 29A:
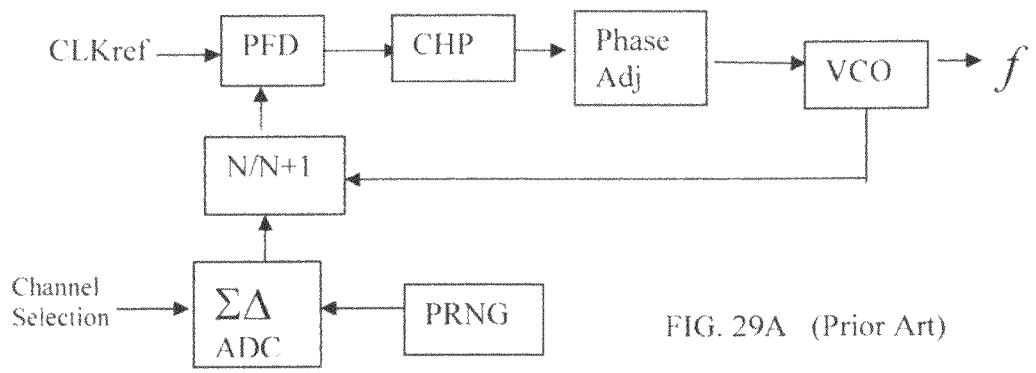
Figure 30A:
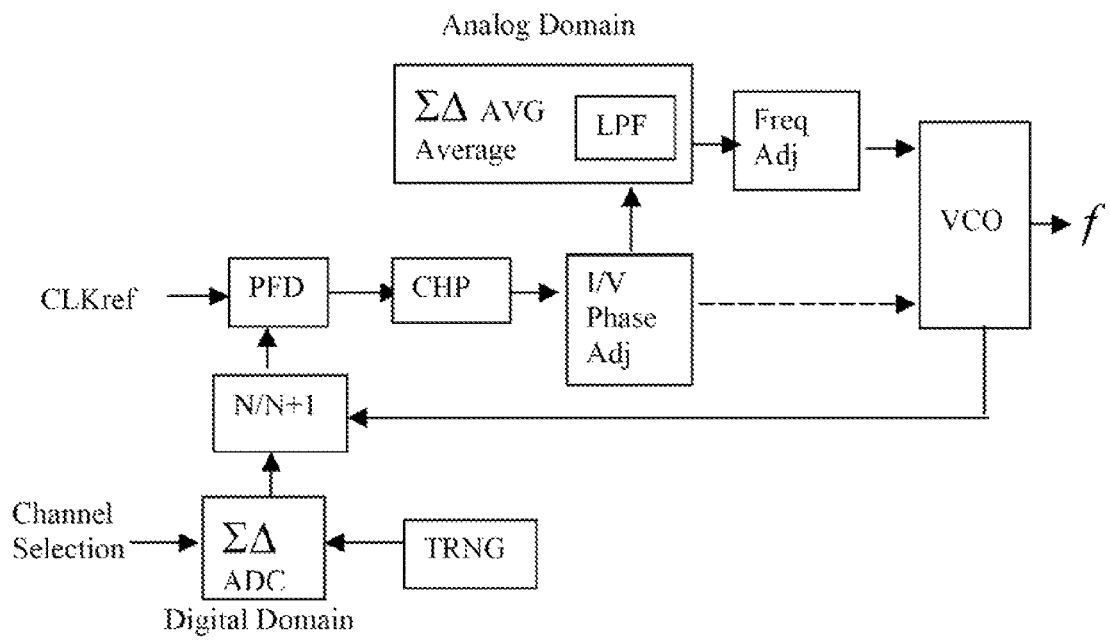

FIG. 29(A) is the conventional fractional PLL; (B) is the state transition diagram of the PRNG (Pseudo Random Number Generator); (C) is the spur generated by the conventional fractional PLL due to the pseudo-random chaotic pattern of PRNG; (D) is the disruptive jumping in infinite continuous domains state transition diagram of the TRNG (True Random Number Generator); (E) is the spur free spectrum generated by the spurfree fractional PLL FIG. 30(A) is the cutting edge PLL having the TRNG (True Random Number Generator) and the ΣΔ AVG average analog signal processing to convert the phase impulses noise to the average clock frequency; (B) is the block diagram of Integer PLL; (C) is the block diagram to show the ΣΔ ADC encoder and decode of ΣΔ AVG analog signal process; (D) is the schematics for the continuous LPF type ΣΔ AVG analog average signal processing to convert the phase impulses noise to the average clock frequency instead of injecting into the VCO directly.

Figure 31A:
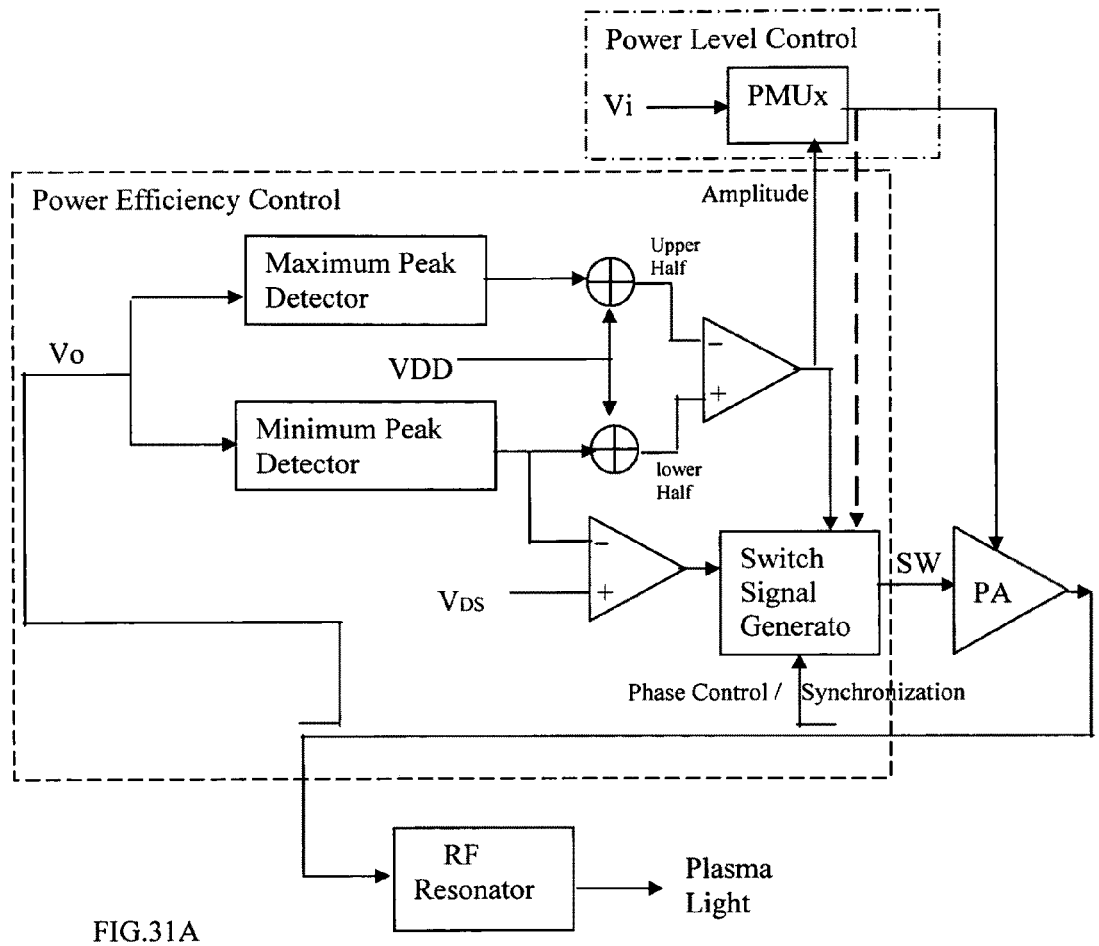
Figure 31B:
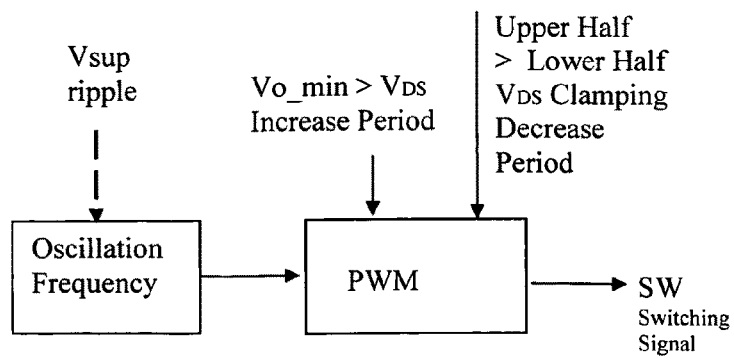

FIG. 31(A) is the green design for the plasma light system; (B) is the pulse width modulation for the green design for the plasma light.

FIG. 32 is the versatile resonant cavity design for the plasma light; (A) is the dipole type elliptical resonant cavity design for the plasma light; (B) is the single pole type resonant cavity design for the plasma light; (C) is the twin-pad type resonant cavity design; (D) is the twin-pad type concentrically resonant cavity design; (E) the high light efficiency low RF leakage plasma light bulb for the plasma bulb; (F) the white light energy band structure of the plasma bulb.

Figure 33A:
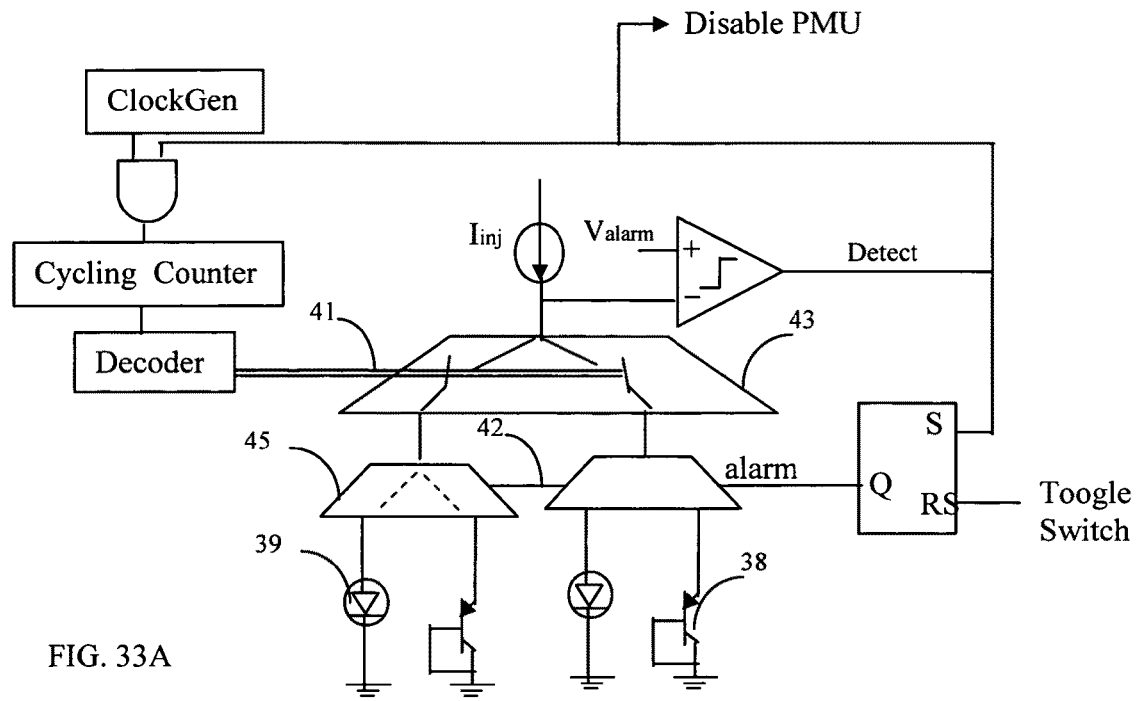

FIG. 33(A) is the thermal safety system for the battery of electrical vehicle (EV); (B) is the alternative design for the battery of electrical vehicle (EV); the LED has both the light indication and the thermal safety detection function.

FIG. 34(A) is the light mirror element having a pair of dipole electrodes; (B) is the light mirror element having a pair of single pole electrodes; (C) is the operation of the light mirror element having a pair of dipole electrodes; (D) is the operation of the light mirror element having a pair of single pole electrodes; (E) is the first step to dope the first pole on the light mirror element; (F) is the second step to dope the second pole on the light mirror element.

FIG. 35(A) is the light mirror element; (B) is the matrix of the light mirror elements for digital light processor of the projective TV.

FIG. 36(A) is the laser light projective system; (B) is the vertical scanning projective light element; (C) is the horizontal scanning projective light element.

Figure 37A:
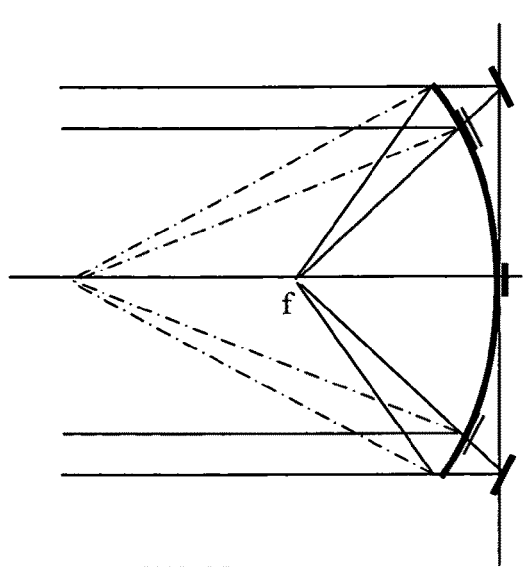
Figure 37B:
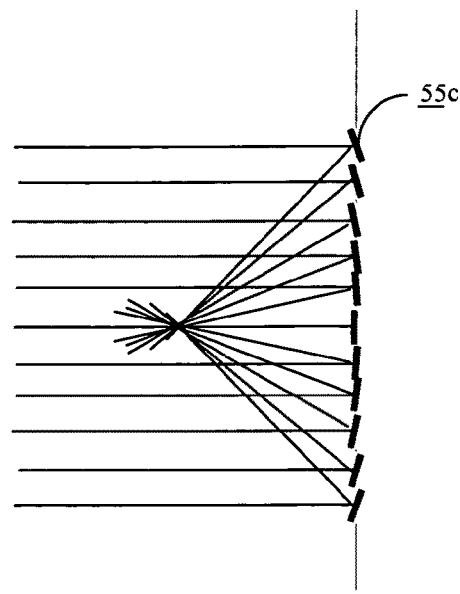
Figure 38A:
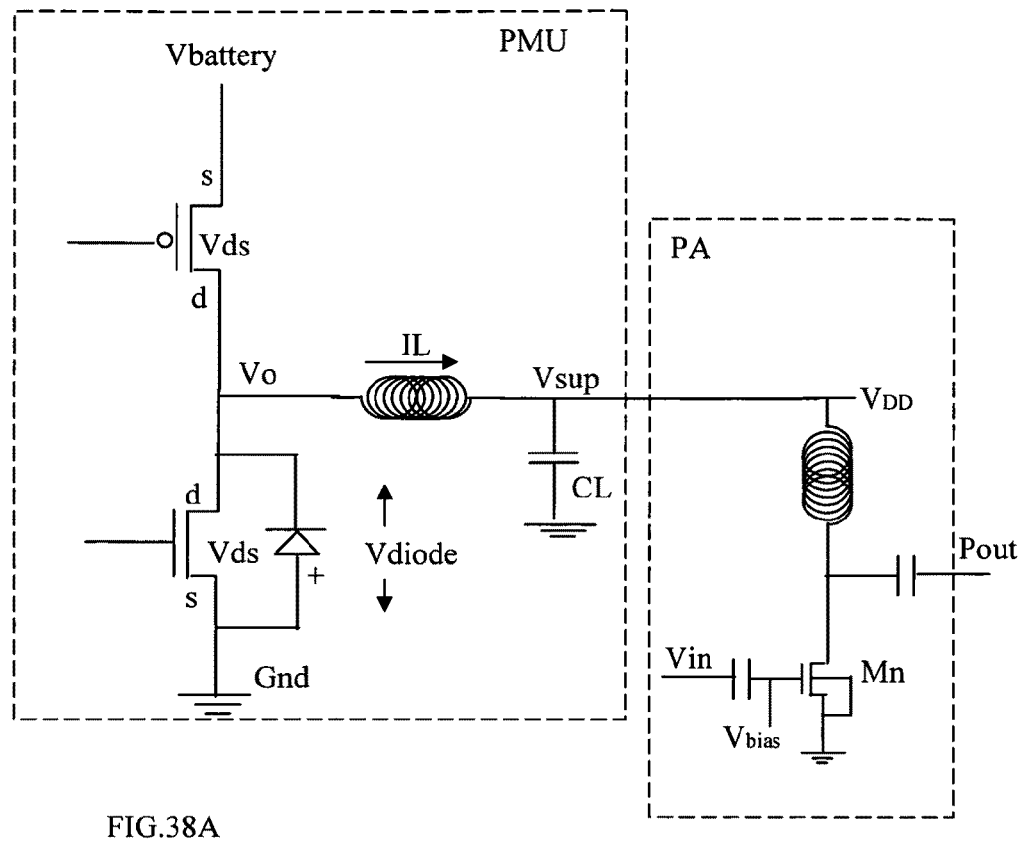

FIG. 37(A) is the constructive process of the digital concave mirror for the lasercom; (B) is the Analog Light Processor (ALP) concave mirror implemented with the light mirror element; (C) is the alignment of the light mirror elements for the concave mirror; (D) is the lasercom system with the ALP concave mirror being made of the light mirror elements FIG. 38(A) is the whole schematics of the power management device with the power amplifier device as shown in FIG. 20C; (B) is the merge of the power management with the power amplifier to be the green circuit design of the power-managing amplifier (PMA).

Figure 39:
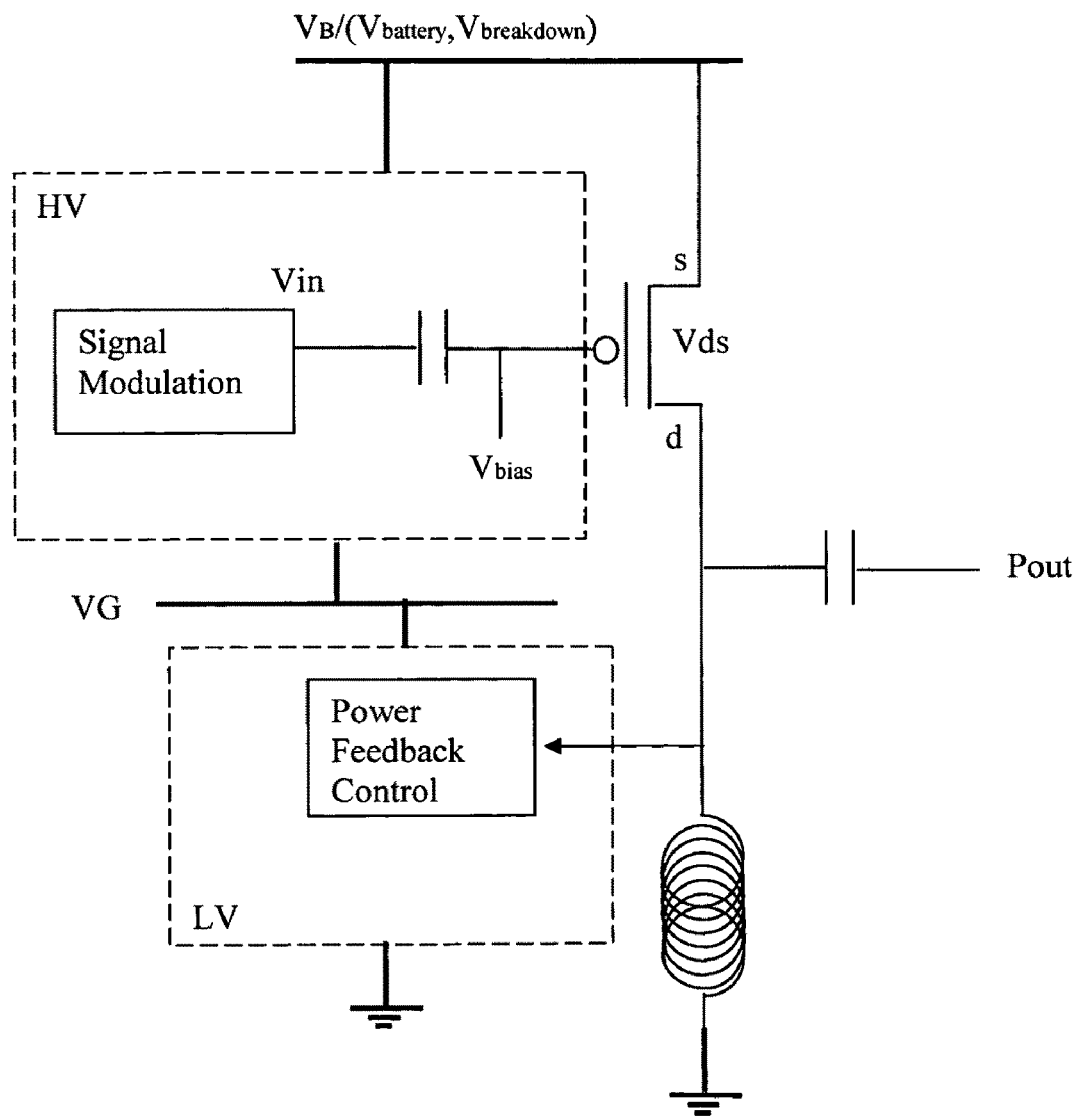

FIG. 39 is the high voltage version of the green circuit design of the power-managing amplifier (PMA).

Figure 40A:
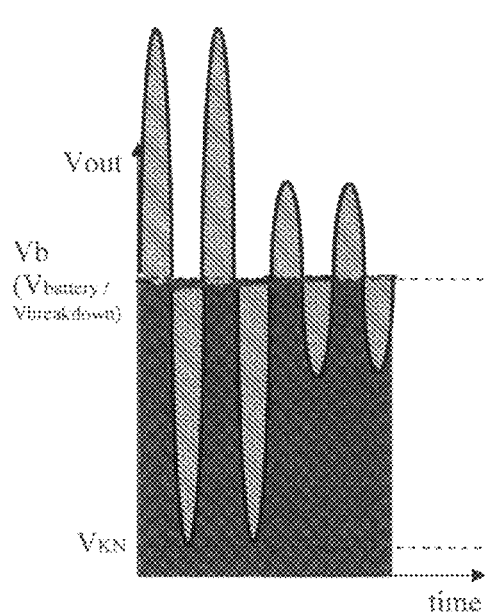

FIG. 40(A) is the output waveform of N type switching device power amplifier PA; (B) is the fundamental mode plus the $1^{st}$ and $3^{rd}$ harmonics N type class-F power amplifier; (C) is the output waveform of P type switching device power managing amplifier PMA; (D) is the comparison of the plasma light power efficiency of the N-type PA-E and PA-F with the P-type PMA-B, PMA-C, PMA-D, PMA-E, PMA-F.

FIG. 41(A) is the A, B and C type power managing amplifier PMA; (B) is the different input waveforms; (C) is the delivery output power of PMA power always being 100%; (D) is the comparison of the output power efficiency between the PA and PMA.

FIG. 42 is adopting the energy flow concept to show the difference between the switch-capacitor-DC-loss N type PA and the switch-capacitor-DC-recycling P type PMA; (A1) is the N-switch off and the DC energy stored in LC tank; (A2) is the N-switch on and the DC energy dissipation; (A3) is the N-switch on and inductor current is built up; (A4) is the N-switch off and the inductor current converting to charge; (B1) is the P-switch off that no DC energy stored in LC tank; (B2) is the P-switch on and charging up capacitor to store the DC energy in LC tank; (B3) is the building up of inductor current; (B4) is the capacitor-stored DC energy converting to the inductor current that the stored DC energy is recycled to be the LC tank oscillatory energy.

Figure 43A:
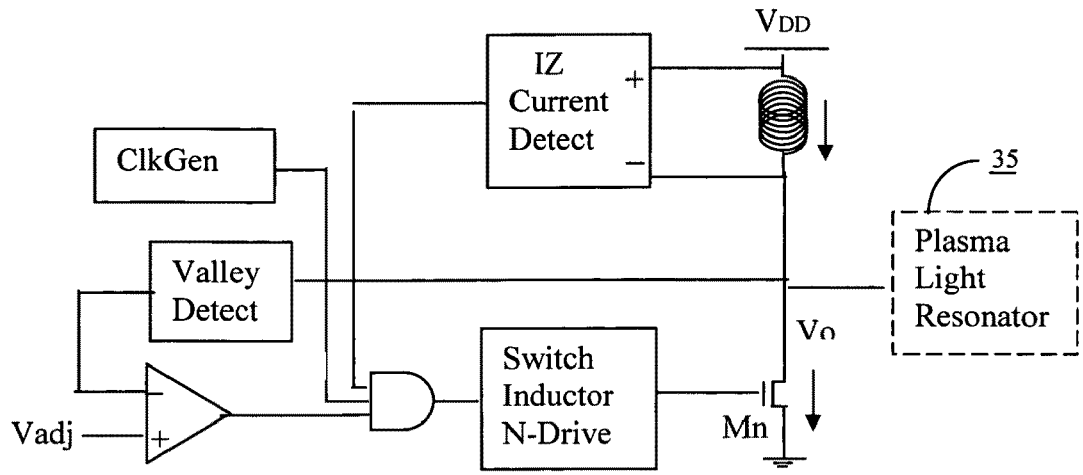

FIG. 43(A) is the N type self-adaptive oscillatory PA; (B) is the P type self-adaptive oscillatory PA; (C) is the push-pull N type self-adaptive oscillatory PA; (D) is the push-pull P type self-adaptive oscillatory PA.

Figure 44A:
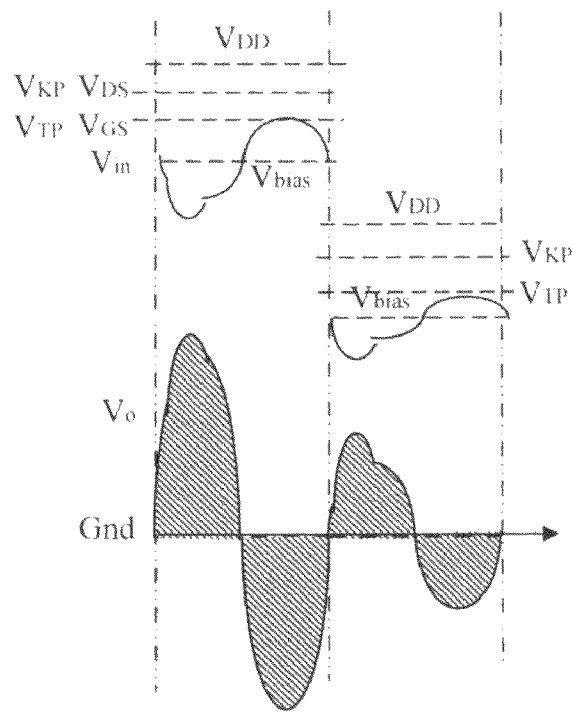

FIG. 44(A) is the waveform of the A type power managing amplifier (PMA) with the option of the adaptive $V_{DD}$; (B) is the waveform of the A type power managing amplifier (PMA) with the option of the adaptive bias; (C) is the schematics of the A type power managing amplifier (PMA).

Figure 45A:
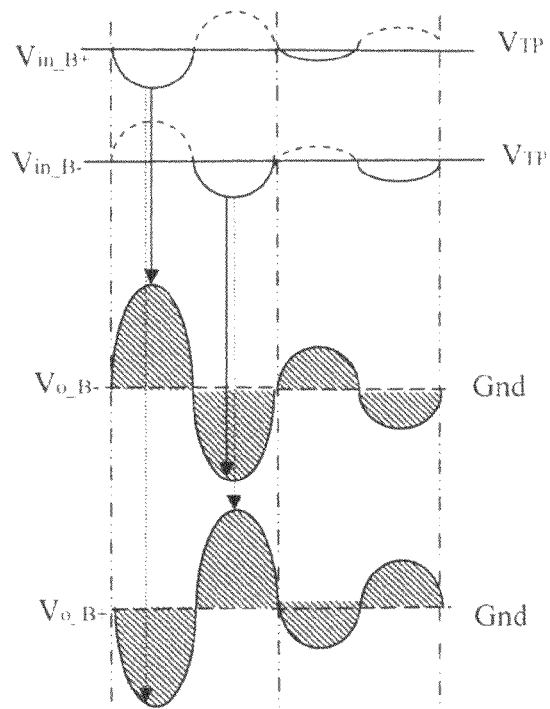

FIG. 45(A) is the waveform of the B type differential power-managing amplifier (PMA); (B) is the waveform of the C type differential power-managing amplifier (PMA); (C) is the Doherty power-managing amplifier having both the B type differential power-managing amplifier (PMA) and C type differential power-managing amplifier (PMA).

FIG. 46 is the Doherty power managing amplifier with the scaling power and adaptive bias; (A) is the waveform of the B type power managing amplifier PMA with the scaling power and adaptive bias; (B) is the waveform of the C type power managing amplifier PMA with the scaling power and adaptive bias; (C) is the Doherty power managing amplifier having both the B type power managing amplifier PMA and C type power managing amplifier PMA with the scaling power and adaptive bias.

Figure 47A:
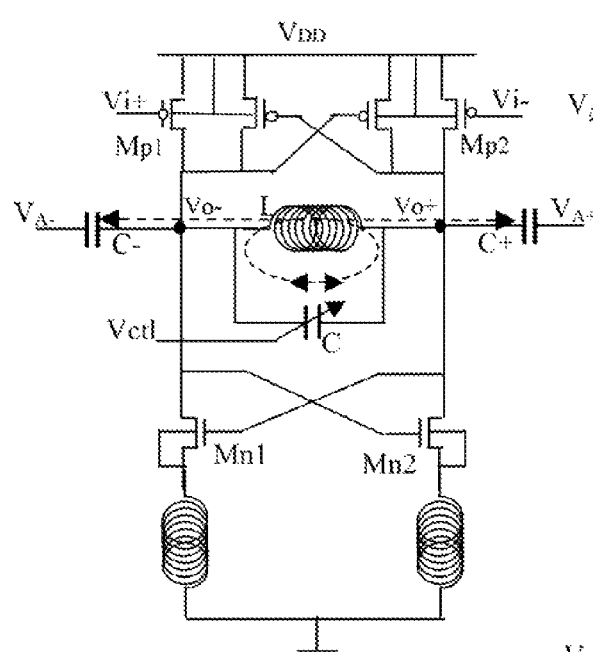
Figure 47B:
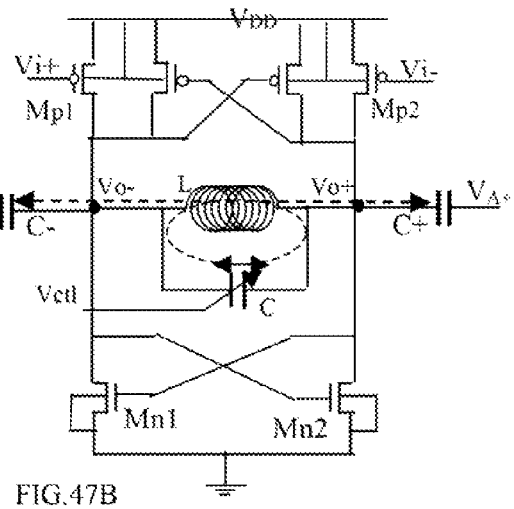
Figure 47D:
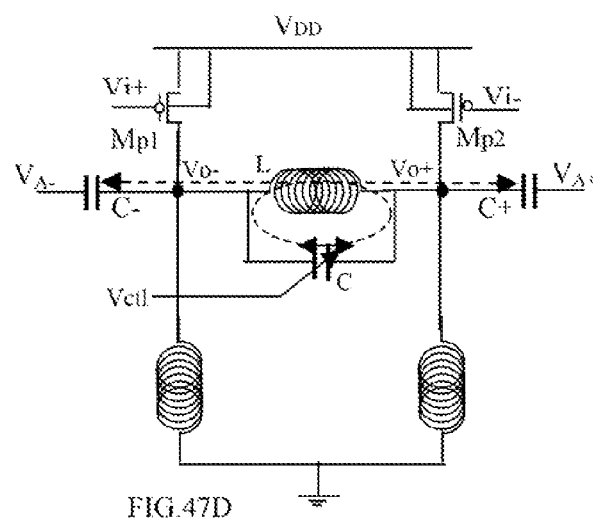
Figure 47C:
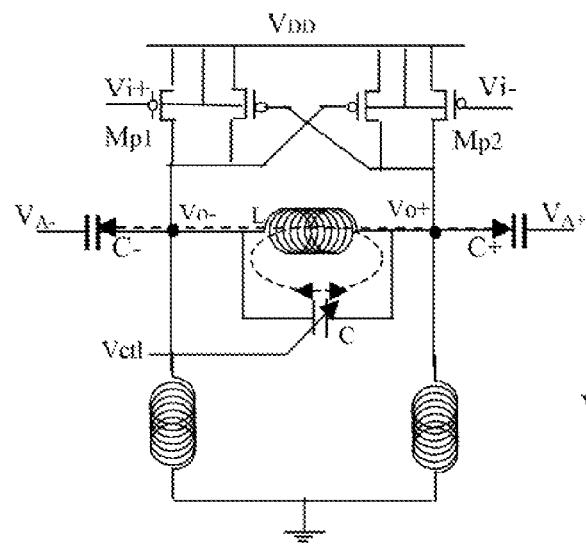
Figure 47E:
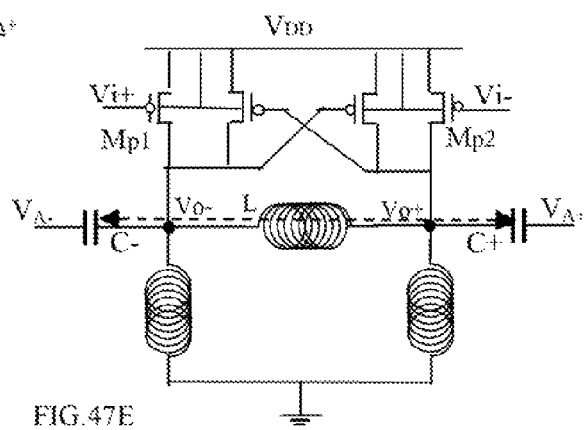
Figure 48A:
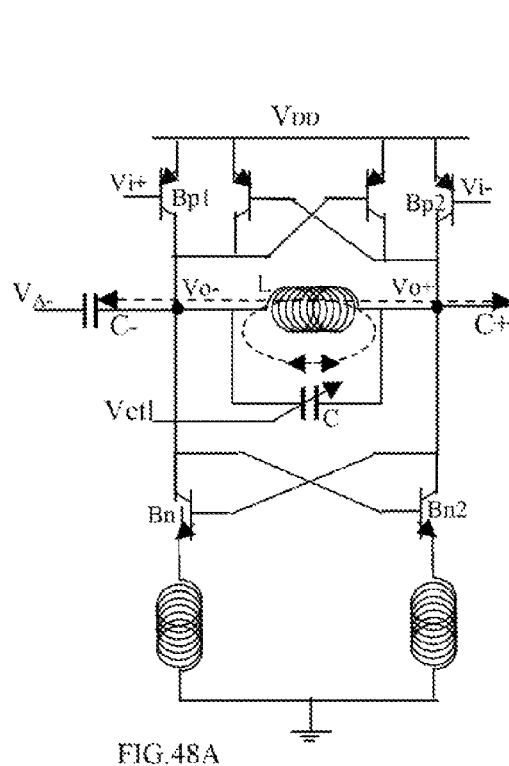
Figure 48B:
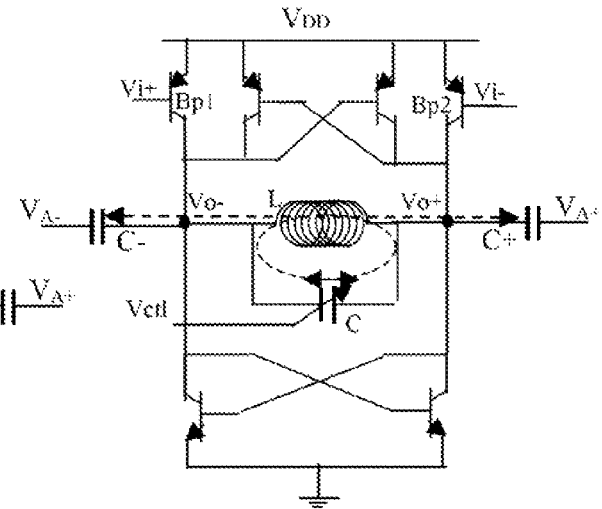
Figure 48C:
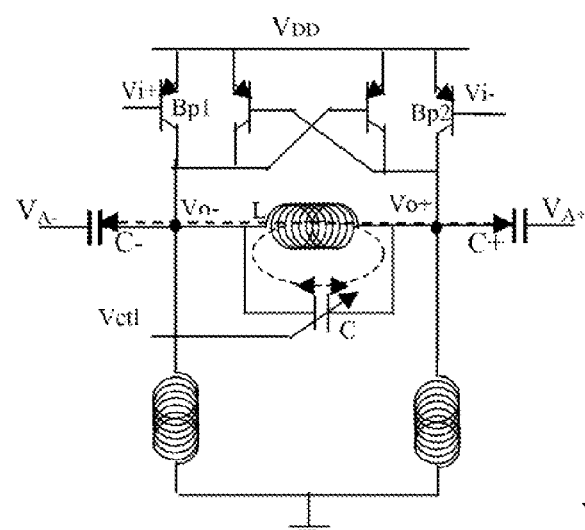
Figure 48D:
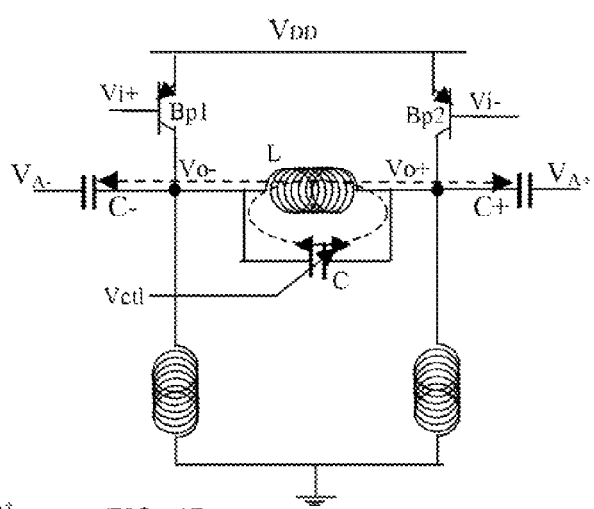
Figure 48E:
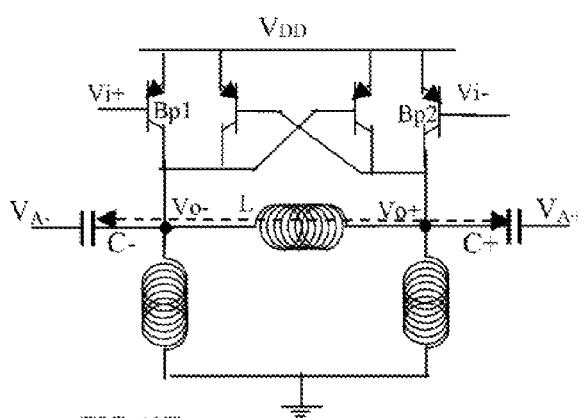

FIG. 47(A) is the differential power managing amplifier having the cross coupling and energy recycling mechanism; (B) is the simplified differential power managing amplifier having the cross coupling and energy recycling mechanism; (C) is the simplified differential power managing amplifier having the p-side cross coupling and energy recycling mechanism; (D) is the simplified differential power managing amplifier having the energy recycling mechanism; (E) is the simplified differential power managing amplifier having the cross coupling mechanism.

FIG. 48 is the bipolar version of the differential power managing amplifier PMA; (A) is the differential power managing amplifier having the cross coupling and energy recycling mechanism; (B) is the simplified differential power managing amplifier having the cross coupling and energy recycling mechanism; (C) is the simplified differential power managing amplifier having the p-side cross coupling and energy recycling mechanism; (D) is the simplified differential power managing amplifier having the energy recycling mechanism; (E) is the simplified differential power managing amplifier having the cross coupling mechanism.

Figure 49A:
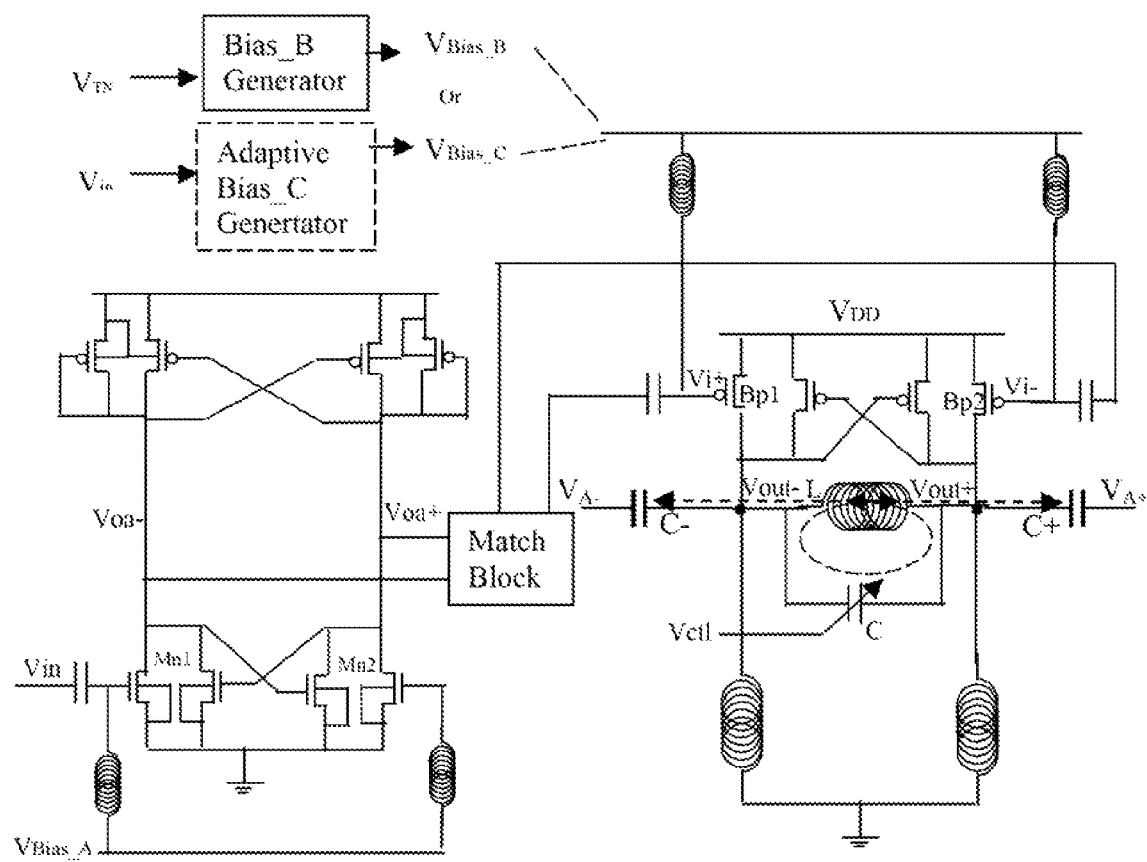

FIG. 49(A) is the MOS version of the single to differential conversion and differential power managing amplifier PMA; (B) is the bipolar version of the single to differential conversion and the differential power-managing amplifier PMA.

Figure 50A:
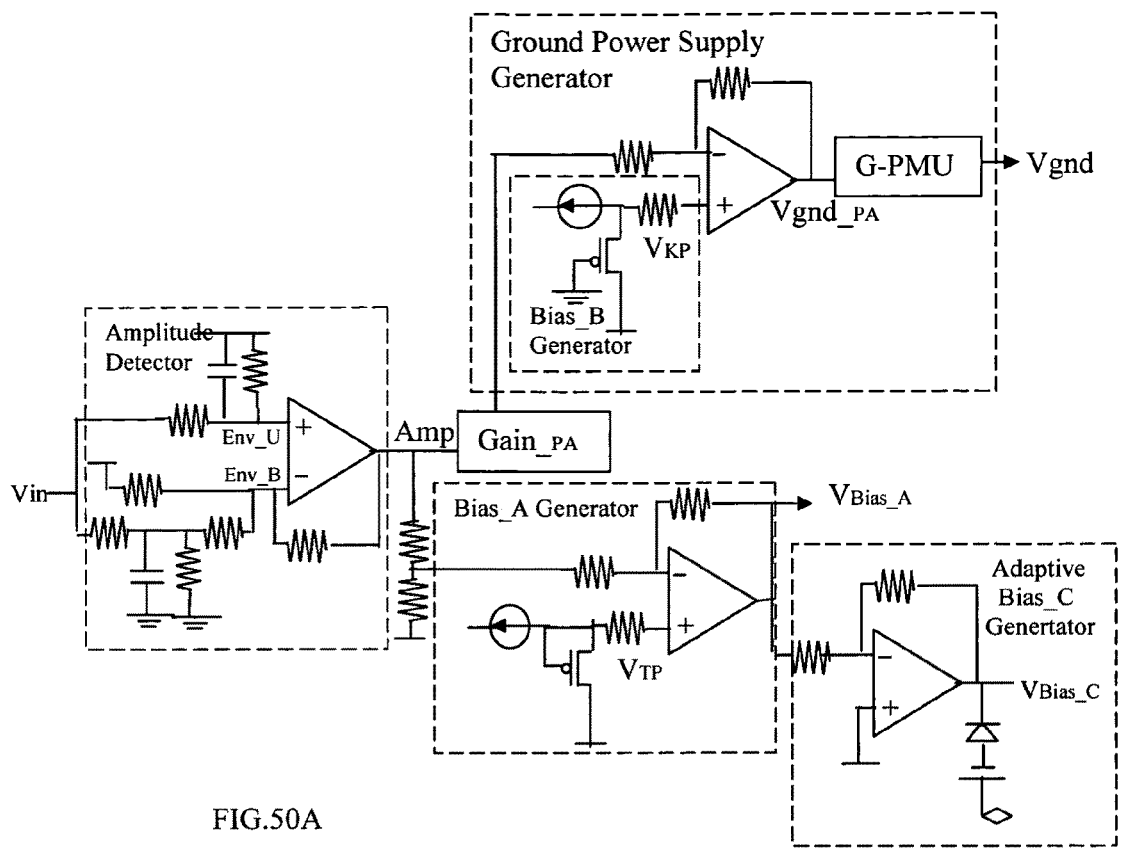

FIG. 50(A) is the biasing voltage generator and the virtual ground power supply, etc for the P-type PMA; (B) is the input voltage plan for the constant ground power supply; (C) is the input voltage plan with the scaling ground power supply.

Figure 51A:
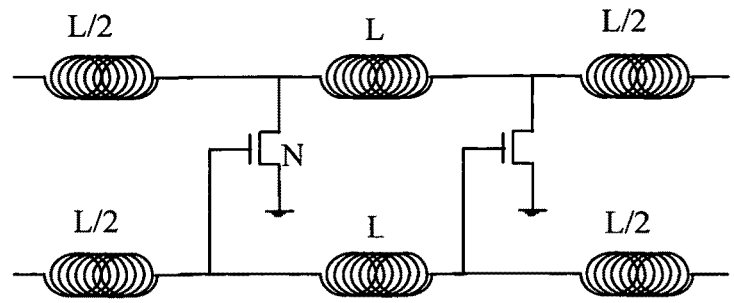

FIG. 51(A) is the N type distributed type microwave power amplifier; (B) is the home network using the power line and provides the charging for battery; (C) is P type distributed type microwave power amplifier.

Figure 52A:
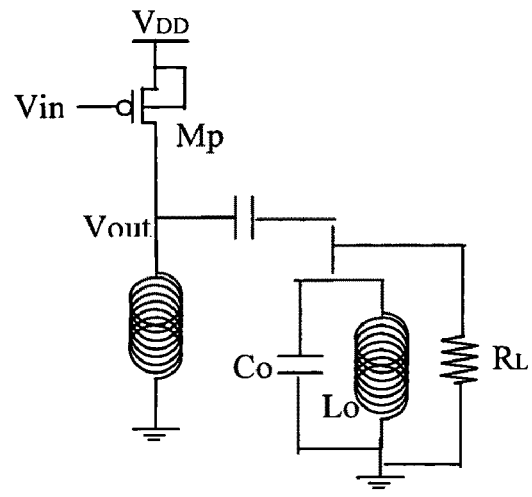

FIG. 52(A) is the A type, B-type, C type PMA-A, PMA-B and PMA-C; (B) is the push-pull A type, B-type, C type PMA-A, PMA-B and PMA-C; (C) is the push-pull A type PMA with balun.

Figure 53A:
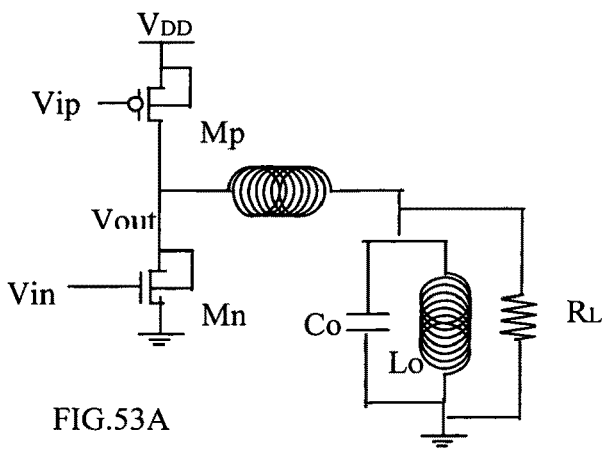

FIG. 53(A) is the D type PMA-D; (B) is the push-pull D type PMA; (C) is the push-pull A,B,C and D type PMA.

Figure 54A:
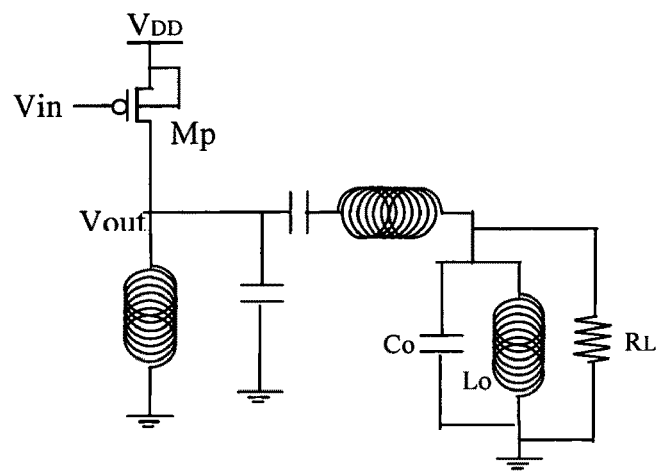

FIG. 54(A) is the E type PMA; (B) is the F type PMA; (C) is the $3^{rd}$ order two stage F type PMA.

DESCRIPTION AND OPERATION

Figure 1:
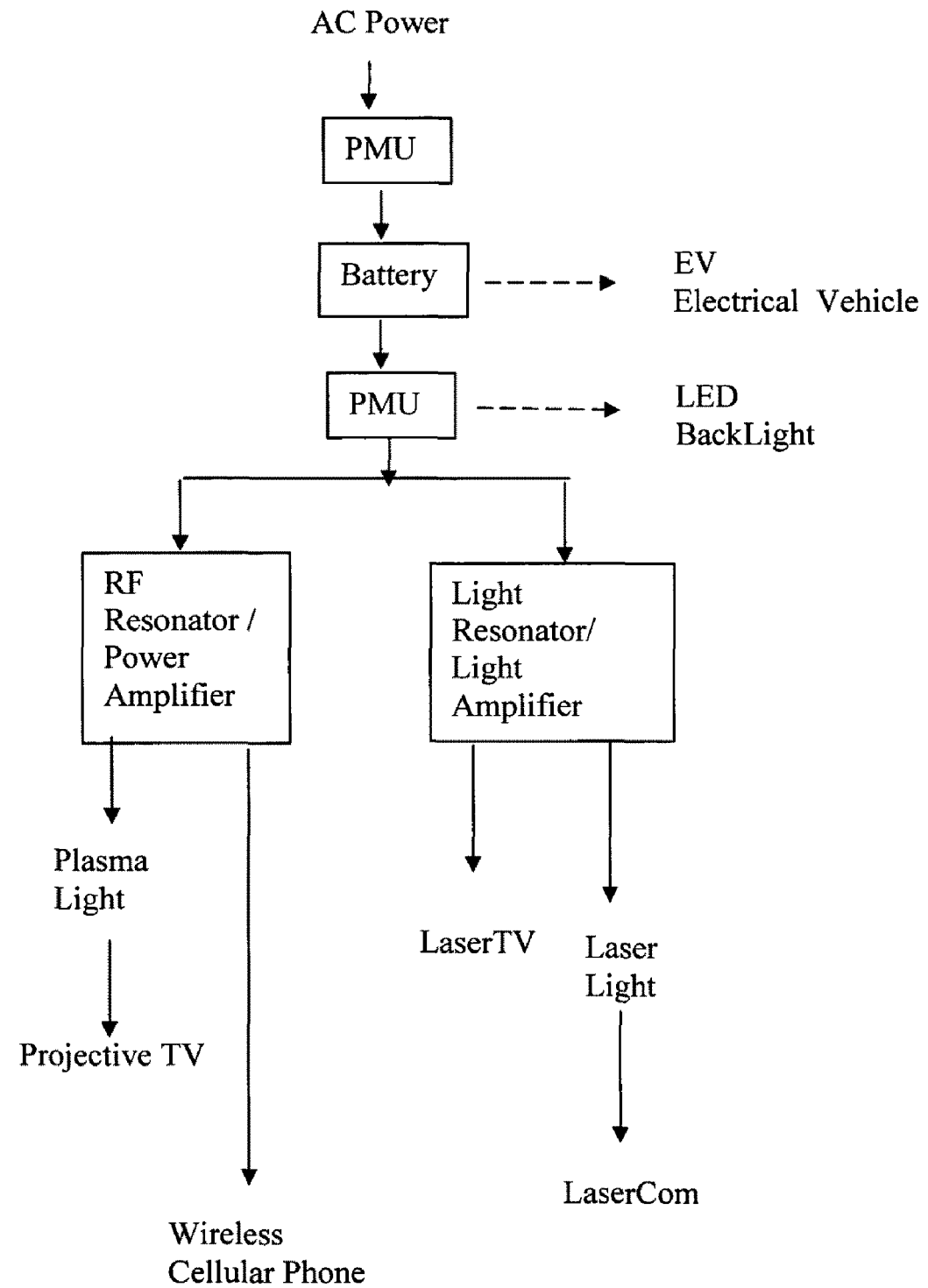

The green technology is to save the earth. The green technology includes both the recycling of the resource and saving energy. To save the energy, we need to save the electricity of the power consumption. We use a unified approach to develop the green technology to save the power consumption to save the earth. As shown in FIG. 1, it is the power flow in the modern society. The power flows from the AC adaptor to Power Management Unit (PMU) then to different electrical devices. The power conversion process is not efficient. The electrical devices power efficiency is not efficient, either. It wastes a lot of power. To have the green technology, we develop the unified green circuit technology platform which can apply across the different fields. First, we have to recognize the power efficiency problems in the versatile electrical facilities.

Figure 2A:
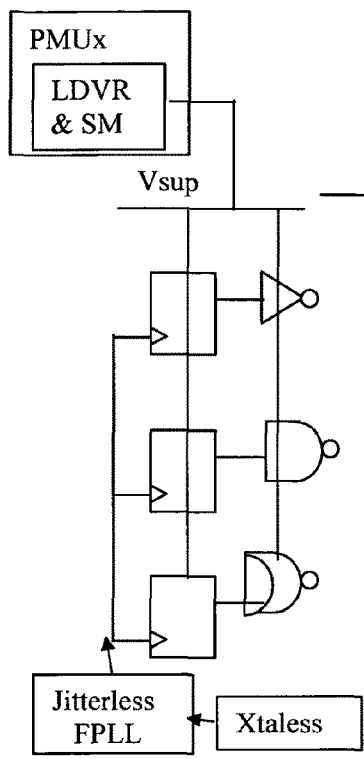
Figure 2B:
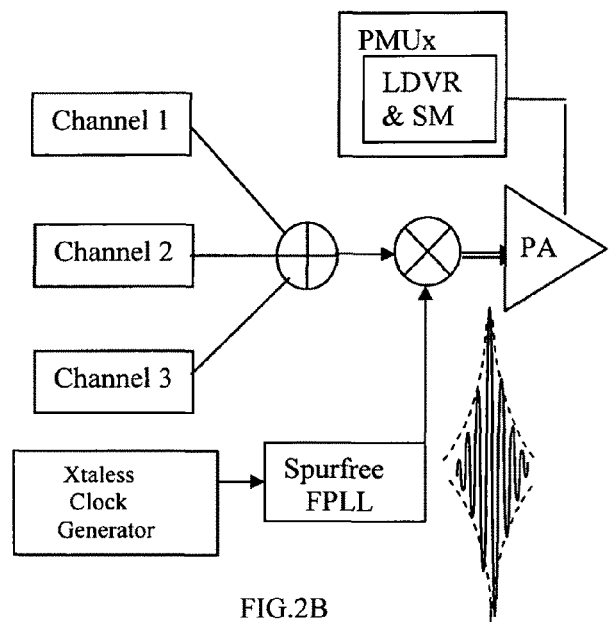
Figure 2C:
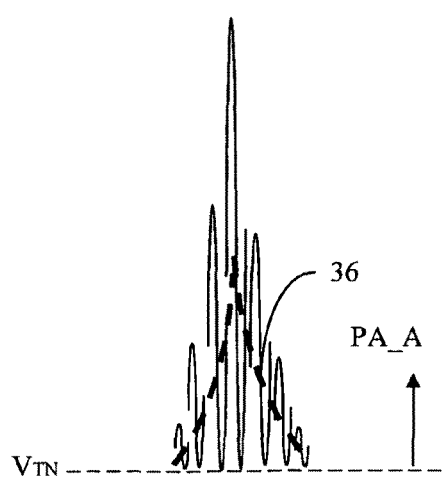
Figure 2D:
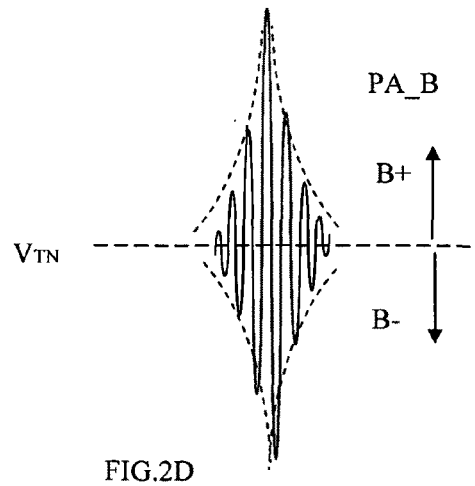
Figure 2E:
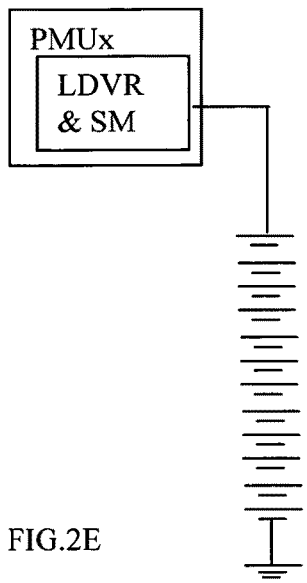
Figure 2F:
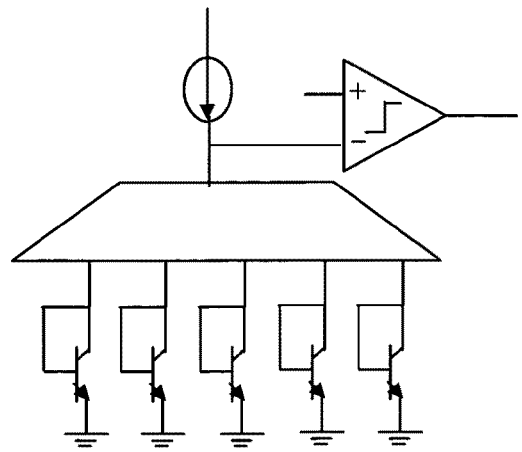
Figure 2G:
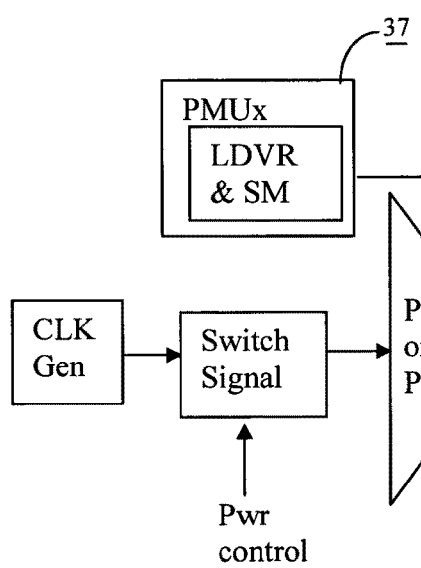
Figure 2H:
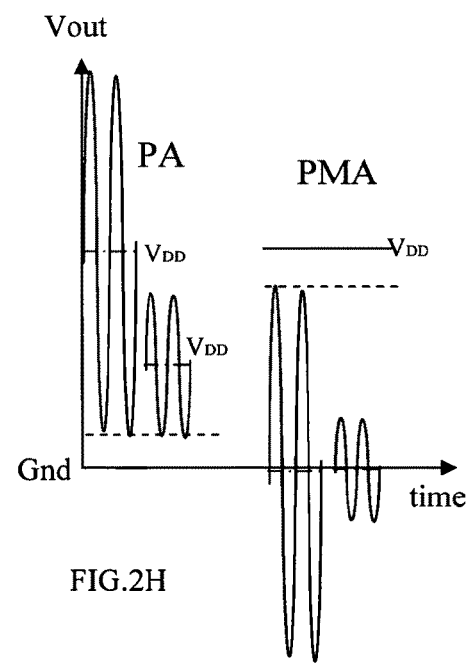

FIG. 2A shows the clock driven microprocessor, graphics chip, etc having the instantaneous voltage drop of the power supply at the clock edge. FIG. 2B shows the modern communication OFDM has the instantaneous amplitude varies causing the power efficiency problem. FIG. 2C shows the instantaneous amplitude is transformed to be the adaptive biasing problem of A-type power amplifier (PA-A) problem. The dotted line 36 is the adaptive bias voltage for the PA_A. FIG. 2D shows the instantaneous amplitude is transformed to be the differential end problem of B-type power amplifier PA-B problem. The B+ portion is the waveform for the positive input Vin+ and the B− portion is the waveform for the positive input Vin−. The combination of Vin+ and Vin−, the amplifier the complete Vin information at any instant. Keeping all the information of the input signal Vin is the fidelity problem of amplifier design. FIG. 2E shows the power management unit (PMU) charging the electric battery which has both the power efficiency and thermal run-away explosion security problems. FIG. 2F shows the temperature monitor for many batteries in the electrical vehicle (EV). FIG. 2G shows the plasma light system which the electrical power is converted to the RF (radio frequency) to light the plasma light bulb 34. The frequency is determined by the resonant cavity. To dimmer the plasma light, as shown in FIG. 2H, the supply power voltage must be able to change for PA type power amplifier. For the PMA type power amplifier, we can use the variance of the switch input amplitude to make the dimmer of the plasma light. So, from the illustrative examples, the green circuit design includes problems of power efficiency, power linearity, fidelity, dynamic transient response, safety, etc.

Figure 3A:
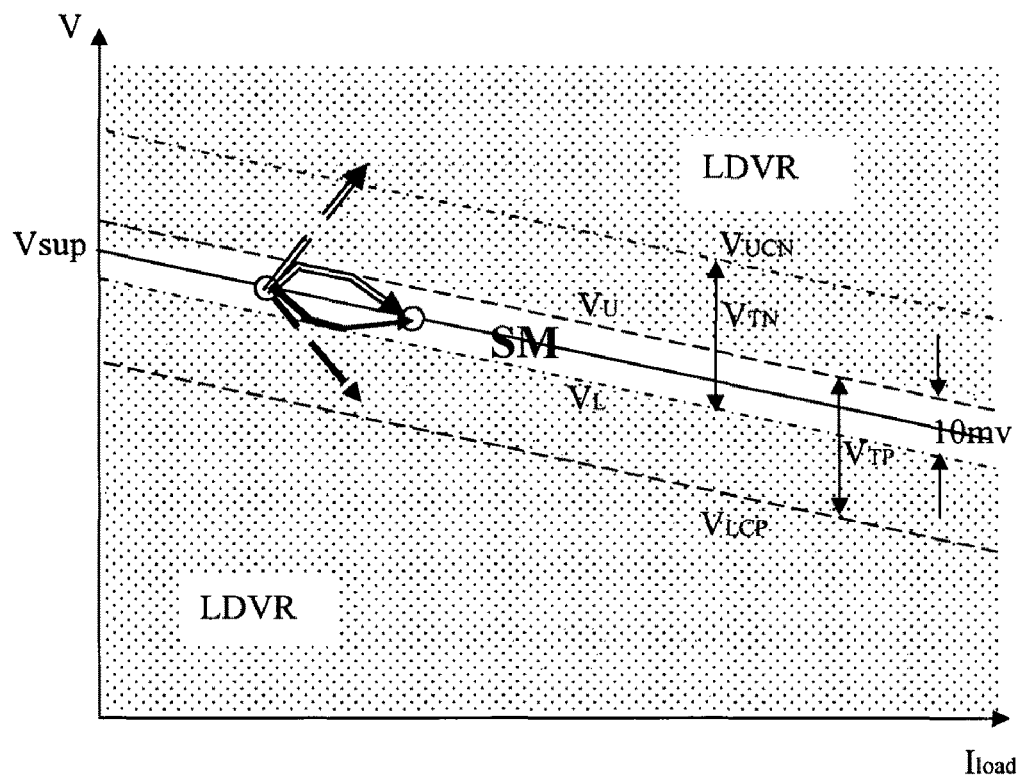
FIG. 3(A) is the load current-supply voltage characteristics curve; (B) is the generic structure of the buck regulator.
Figure 3B:
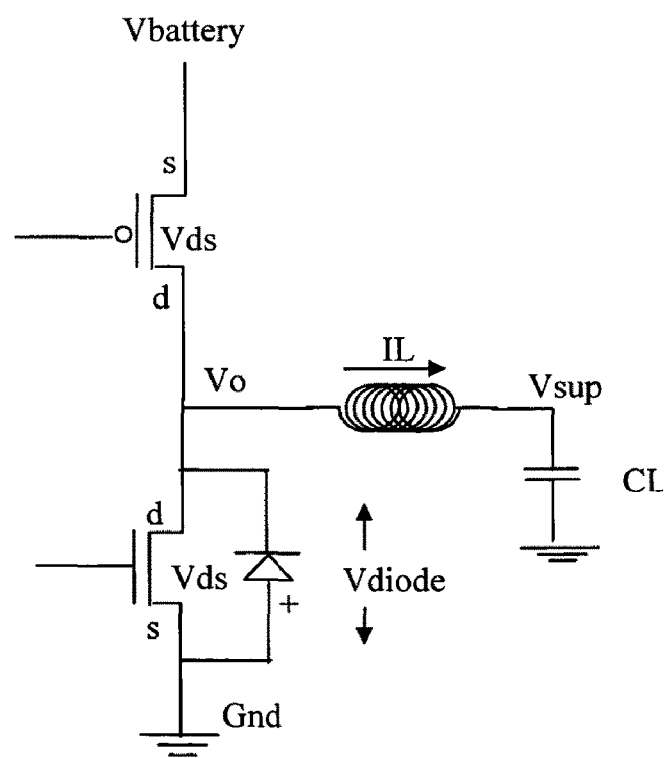

FIG. 3A is the industrial power management unit specification for the microprocessor to address on the power loading $I_{load}$ and power voltage $V_{sup}$ requirements. It relies the on-board capacitor to damp out the ripples in the power line. However, for the power management unit having large capacitor, it doesn't have the fast response for the cellular phone power management unit requirement. For the cellular phone, the power management unit voltage has to vary at least in mega-hertz bandwidth range for crest factor correction for the high Peak to Average Ratio (PAR) signal in the baseband signal modulation. As shown in FIG. 3B, it is the output driver of the power management unit. To minimize the resistance induced resistive loss in output devices, the voltage drop across the PMOS or NMOS is less than 30 mv, i.e., Vds<30 mV. Therefore, the output device is large. To switch the large output devices, it takes a lot of energy and it causes the switch loss of the power management unit. Therefore, for the PMU design, we have two losses to consider, the resistive loss and the switch loss.

Figure 4A:
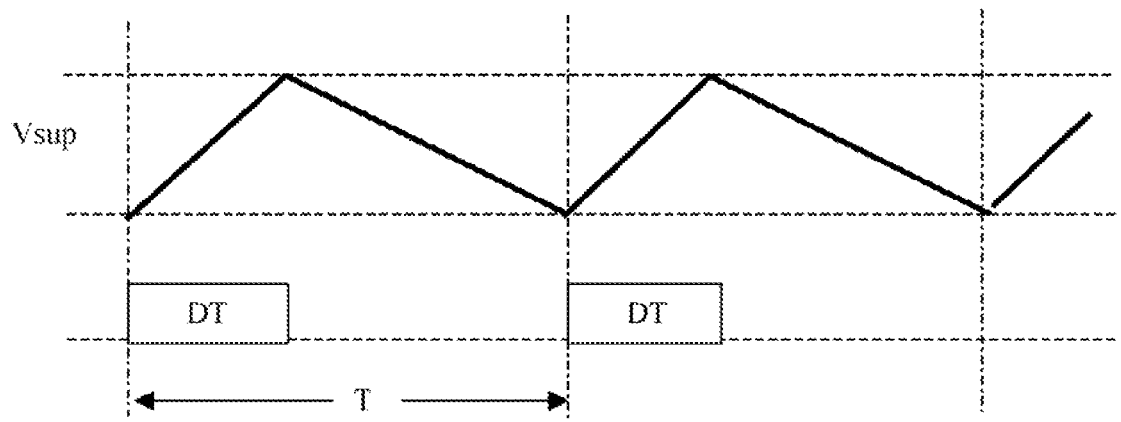
FIG. 4(A) is the generic waveform of the voltage regulator in PWM (Pulse Width Mode); (B) is the multi-phase voltage regulator to minimize the ripple of power supply; (C) is the multi-frequency voltage regulator to minimize the ripple of power supply.
Figure 4B:
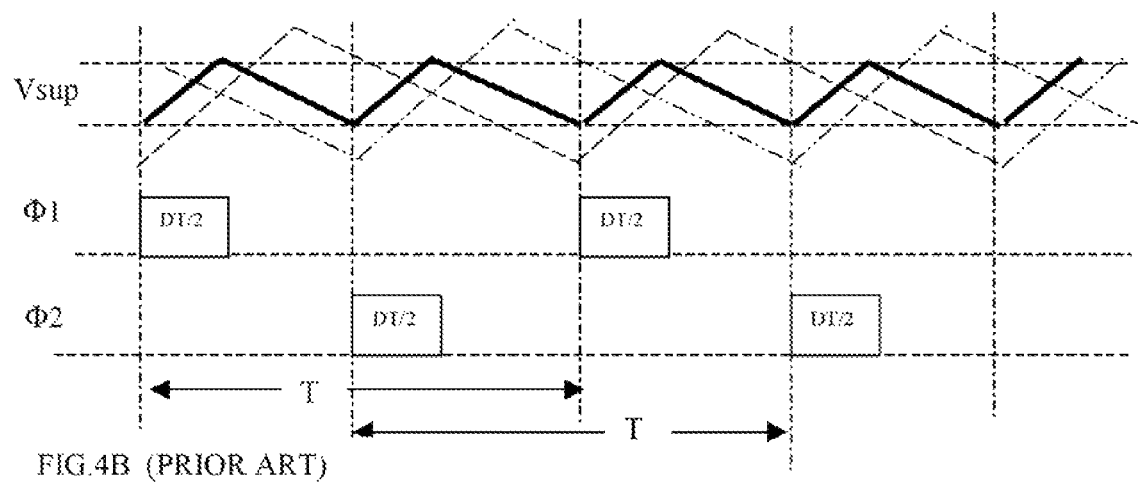
Figure 4C:
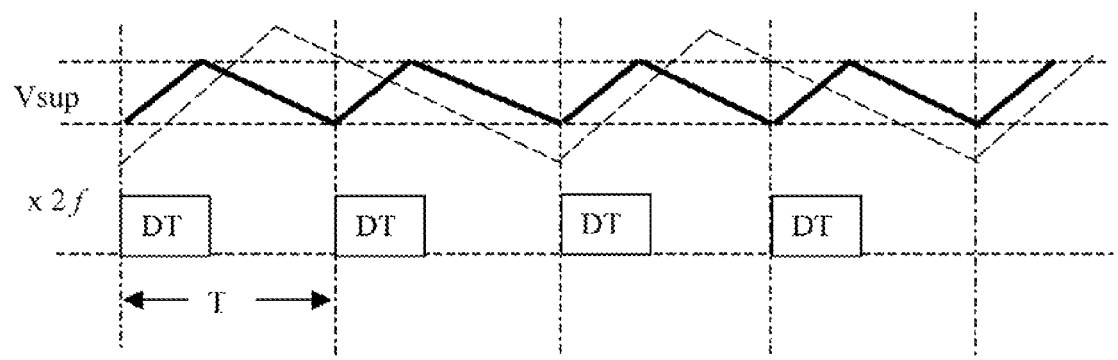

FIG. 4A shows the conventional pulse width modulation (PWM) for the power management. The switching frequency of PWM is fixed. To reduce the ripple of the power supply, as shown in FIG. 4B, the multi-phase power management unit is adopted by the most power chip manufactures today. It uses multiple drivers in parallel. However, this is not good solution. As shown in FIG. 4C, we can increase the switching frequency to be multi-frequency having the same effect to reduce the voltage ripple of power supply. Comparing the number of the switch period of the multi-phase PMU with the number of the switch period of the multi-phase PMU, the switching times are the same. In other words, the switching loss of the multi-frequency PMU is the same as the multi-phase PMU. Therefore, even the multi-phase PMU uses more components, the switching loss is still the same. Therefore, the multi-frequency PMU is much better solution than the multi-phase PMU solution. Furthermore, even the switching loss is proportional to the switching times, with the green technology of switch inductor, the switching loss is not proportional to the switching times. With the switch inductor green technology, the switching energy recycles in the switching circuit. Therefore, the multi-frequency PMU does not have the switching loss problem. As the switching frequency increases, the component sizes of PMU can be reduced a lot. However, the multi-phase PMU doesn't have this benefit at all. The frequency is still kept the same, the sizes of the components are still kept the same. Since the multi-phase PMU has multiple drivers, it is very difficult for each driver to have the individual switch inductor driving circuit. Therefore, all the power chip industry has run in the wrong direction of the multi-phase switch mode voltage regulator.

Furthermore, even the multi-phase PMU solves the voltage ripple problem, it still doesn't solve the fast transient of PMU voltage shift problems. The fast transient of PMU voltage shift problems has two phases. One phase is for the wireless application. The PMU voltage is needed to shift from one voltage level to another voltage level. The other phase is for the microprocessor application which has the power surges. Therefore, the PMU needs to have much complex dynamic design. To meet the dynamic switching requirement of PMU, the event-driven state transition diagram is needed to develop for the green technology.

Figure 5A:
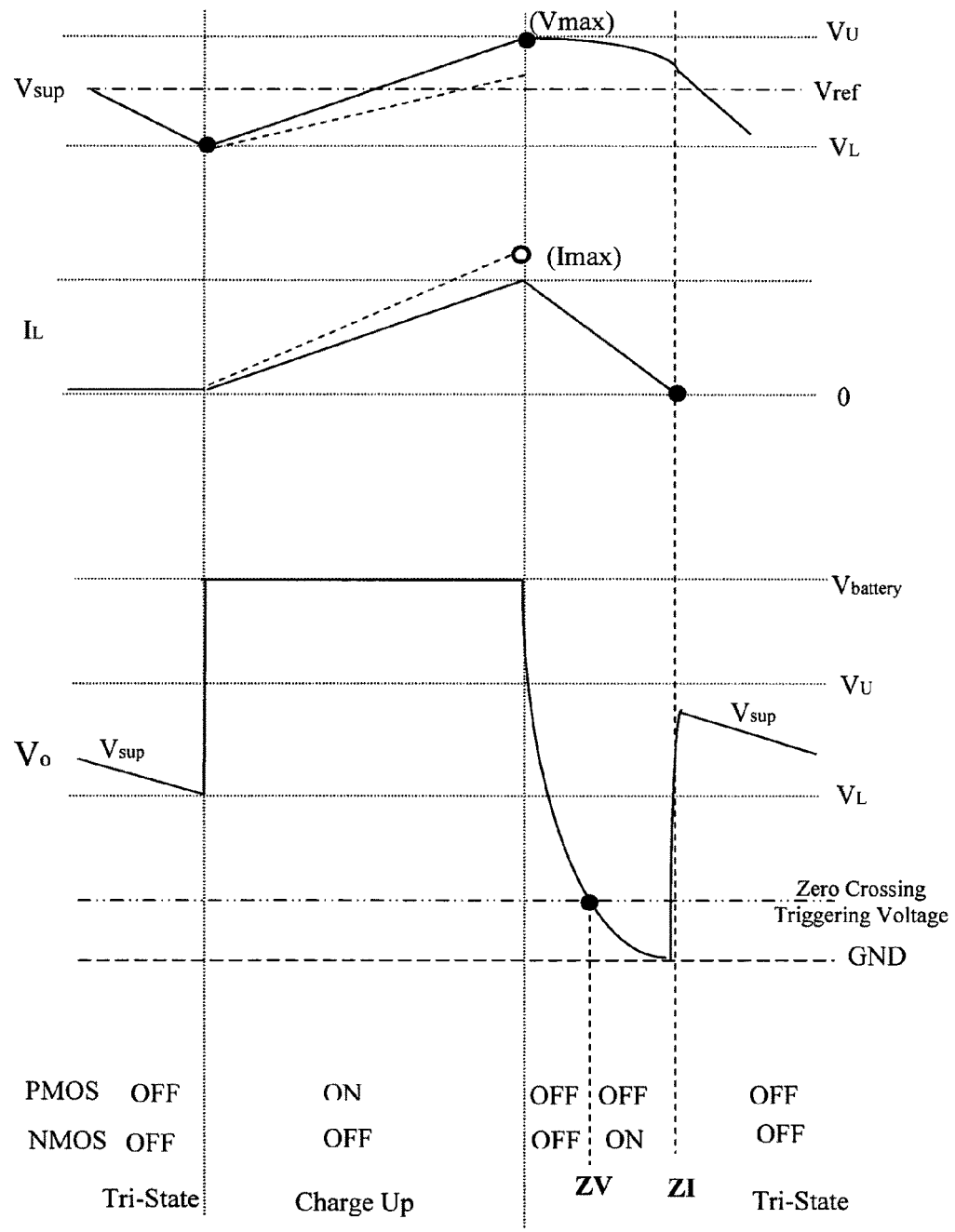
FIG. 5(A) is generic characteristic curve of the buck regulator as shown in FIG. 3B; (B) is the buck regulator without the proper switch timing; (C) is the buck regulator with the proper switch timing.

Referring to FIG. 3B and FIG. 5A, as the charging device (PMOS) is turned on, the inductor current $I_L$ and the power supply voltage $V_{sup}$ increase. As shown in FIG. 3A and FIG. 5A, as the $V_{sup}$ is larger than the voltage Vu, the PMU charging device is switched off and the output voltage Vo and inductor current $I_L$ decrease. As the output voltage Vo is equal to the ground voltage, it is the zero-voltage crossing (ZV) and the discharging device (NMOS) can be turned on without the worry of the crowbar current of shorting $V_{battery}$ to Ground. As the discharging device (NMOS) is turned on, the inductor current $I_L$ flows through the discharging device (NMOS) to pump the charges from the ground. It converts the inductor energy to the energy stored in the capacitor as the form of charge. This is the current-boosting effect in the buck regulator. This is the energy recovering process.

$$\text{Power} = I_{battery} * V_{battery} = I_L * V_{sup}$$

$$I_L = I_{battery} * V_{battery} / V_{sup} > I_{battery}$$

Figure 5B:
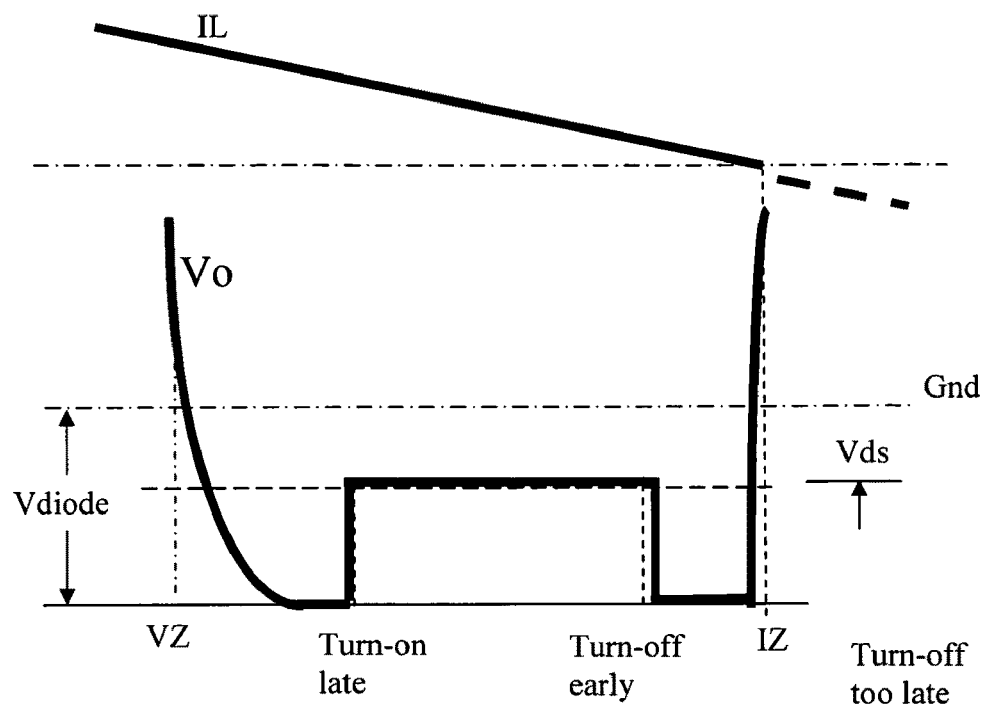
Figure 5C:
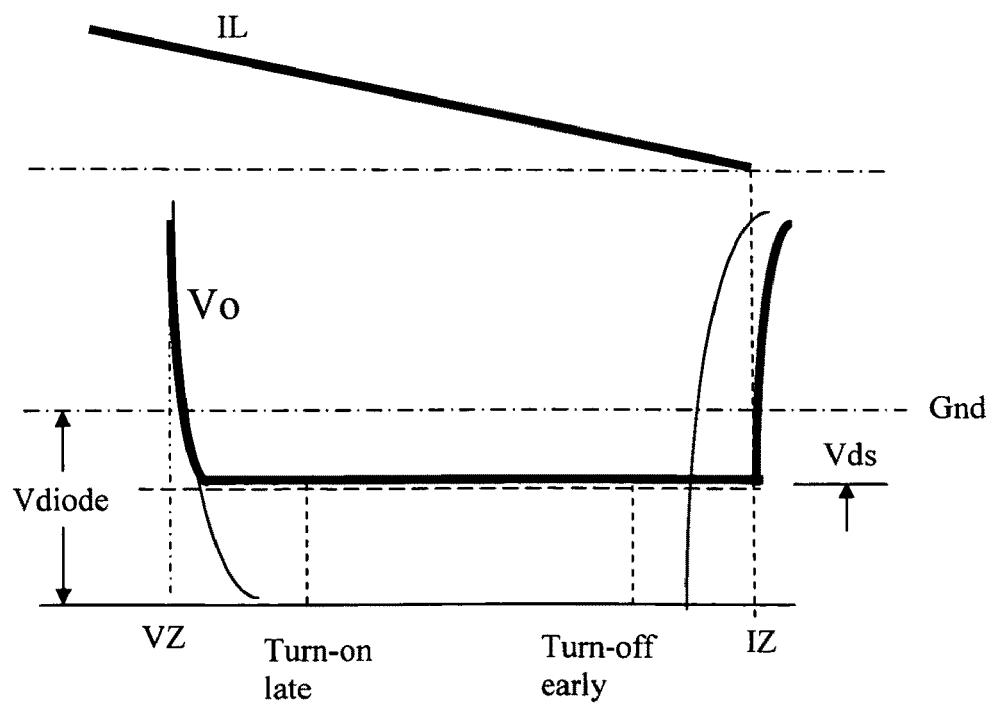

As the inductor current $I_L$ is zero, crossing the zero-current (IZ) point, it needs to turn off the discharging device (NMOS). If the discharging device (NMOS) turns off late, the $I_L$ will reverse the flow direction and withdraw the charge and energy from the capacitor. This is the self-timing event-driven timing control. The control has to be timing accurate. FIG. 5B shows the discharging device (NMOS) turns on late and turn-off early cases. In both case, the inductor IL still has energy to drive the current to flow through the body diode of the discharging device (NMOS). The voltage Vo drops to be the negative diode voltage. It causes the energy conversion efficiency loss. FIG. 5C shows the perfect timing at the VZ and IZ events. There are no voltage dips from the $(-V_{ds})$ voltage to $(-V_{diode})$ voltage.

Figure 6A:
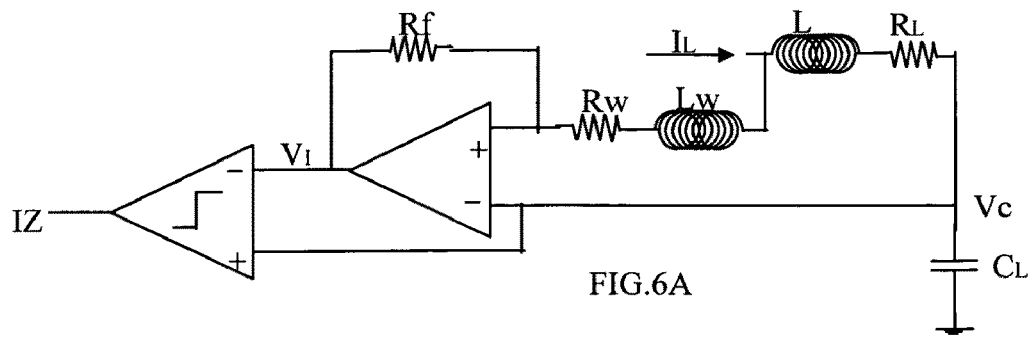
FIG. 6(A) is the resisterless Zero Current (IZ) timing control circuit; (B) is the alternative design of resisterless Zero Current (IZ) timing control circuit; (C) is the alternative design of resisterless Zero Current (IZ) timing control circuit; (D) is the alternative design of resisterless Zero Current (IZ) timing control circuit.

To detect the IZ event, it had better not to use the extra resistor to detect the large current flowing through $I_L$ to save the energy. The current measurement is referred to be resistorless current detector. FIG. 6 is the schematic of the resistorless IZ detector. There are versatile forms of IZ detector. As shown in FIG. 6A, the measured voltage $V_I$ is $$V_I = (R_L + sL) * [R_f / (R_w + sL_w)]$$
$$= R_L * R_f / R_w$$

with $$(L/R_L) = (L_w/R_w)$$

Figure 6B:
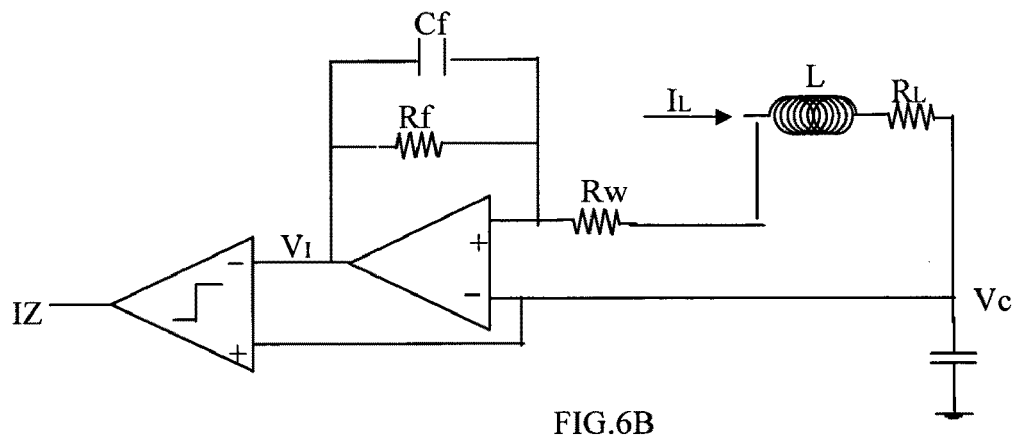

As shown in FIG. 6B, the measured voltage $V_I$ is $$V_I = (R_L + sL) * [R_f / ((sC_f R_f + 1)R_w)]$$
$$= R_L R_f / R_w$$

with $$(L/R_L) = C_f R_f$$

Figure 6C:
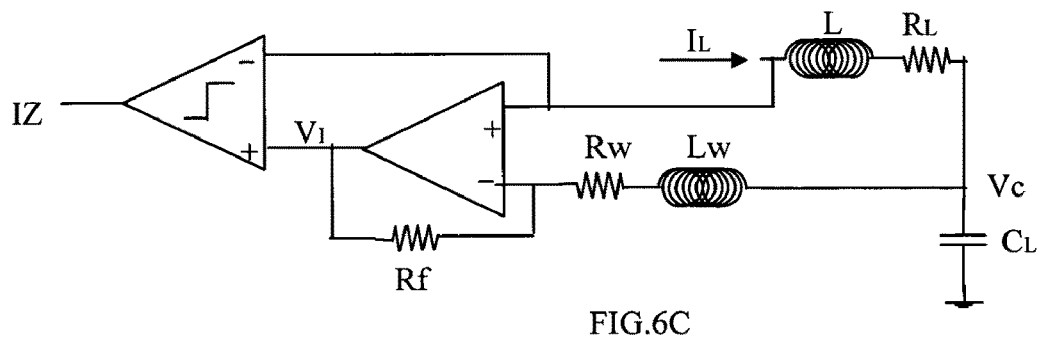

As shown in FIG. 6C, the measured voltage $V_I$ is $$V_I = (R_L + sL) * [R_f / (R_w + sL_w)]$$
$$= R_L * R_f / R_w$$

with $$(L/R_L) = L_w R_w$$

Figure 6D:
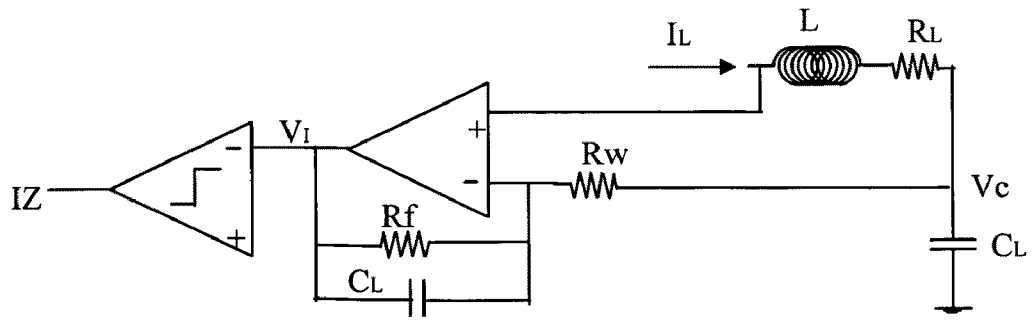

As shown in FIG. 6D, the measured voltage $V_I$ is $$V_I = (R_L + sL) * [R_f / ((sC_f R_f + 1)R_w)]$$
$$= R_L R_f / R_w$$

with $$(L/R_L) = C_f R_f$$

As the $V_I$ is larger then the reference voltage $V_{sup}$, the comparator triggers the IZ signal to notify the zero crossing.

Figure 7A:
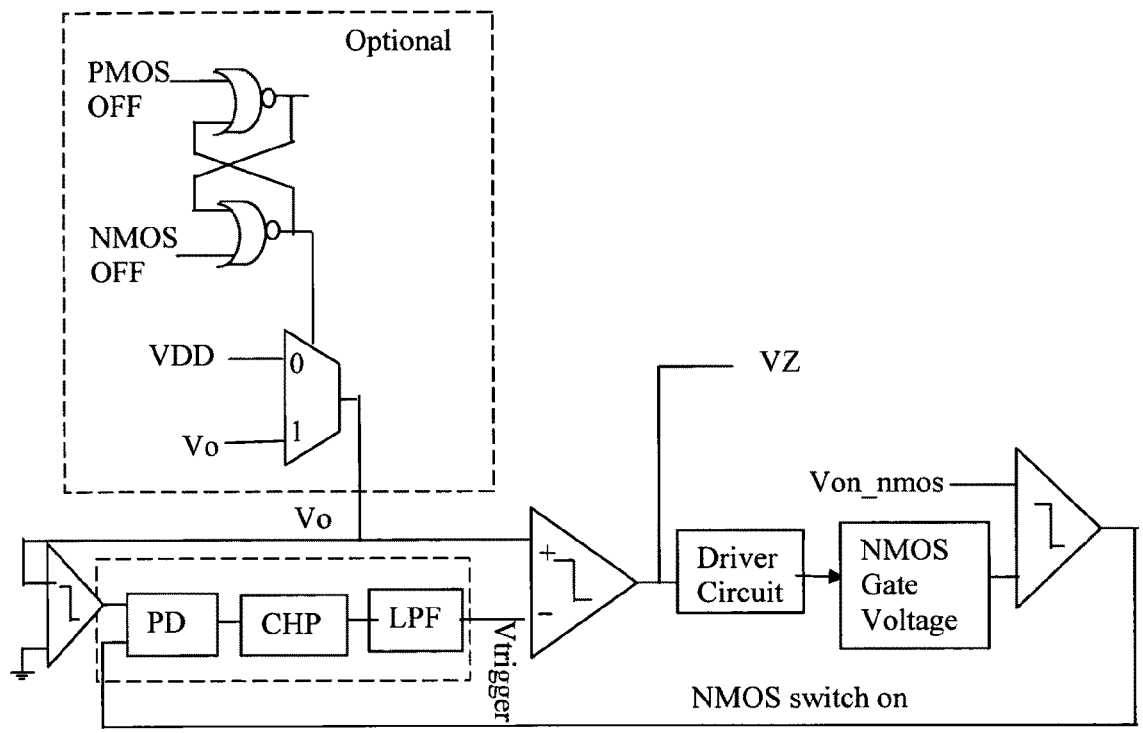
FIG. 7(A) is the Zero Voltage (VZ) crossing timing control circuit; (B) is the alternative design for the triggering voltage of the Zero Voltage (VZ) crossing timing control circuit.
Figure 7B:
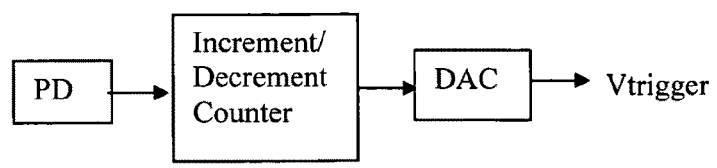
Figure 28B:
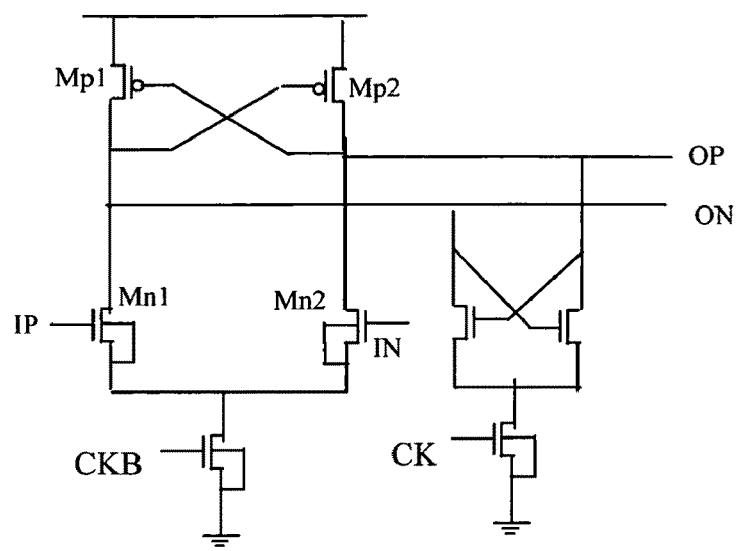
Figure 28C:
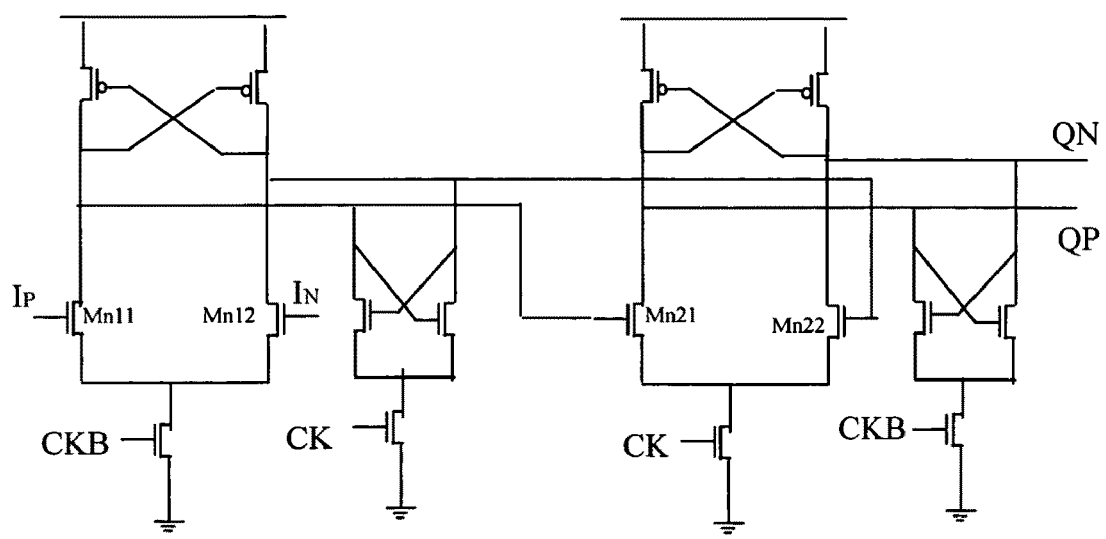
Figure 28D:
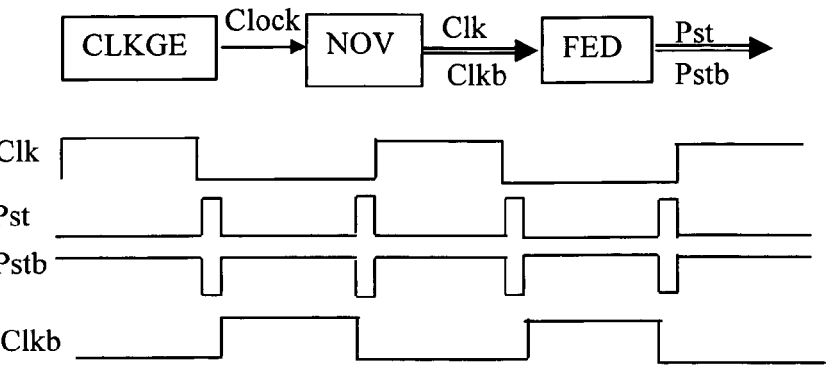
Figure 28E:
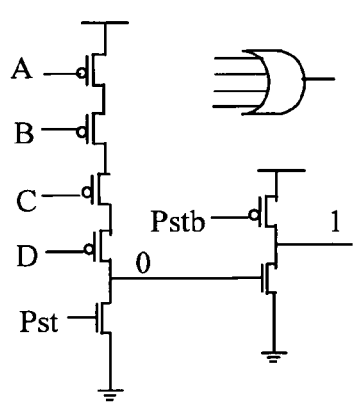
Figure 28F:
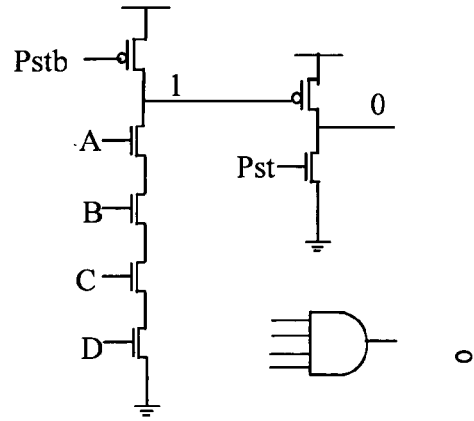

FIG. 7 is the cross-zero voltage VZ detector. The most difficult problem for the VZ detector is the driver circuit switch circuit delay. At the time of Vo is zero, the discharging device (NMOS) needs to switch on at the same time. The driver circuit switch circuit delay must be counted in the VZ event that the switching time for the output voltage is $Vo = V_{switch} > 0$. So, as the voltage Vo is equal to voltage $V_{switch}$, the switching command being issued. To determine the voltage $V_{switch}$ is an adaptive process. The discharging device (NMOS) switch-on time is compared with the Vo zero-crossing time. If the time is earlier, decreases the switching voltage $V_{switch}$ to trigger the switch later. If the time is late, increase the voltage $V_{switch}$ to trigger the switch earlier. This mechanism can be performed with the Phase detector (PD), Charge Pump (CHP) and Low Pass Filter (LPF). As shown in FIG. 7B, the same function can be implemented with the alternative design of Phase detector (PD), Increment/Decrement Counter and digital to analog converter (DAC). VZ detector had better to implemented with the low power high-speed circuit as shown in FIG. 28E and FIG. 28F.

As shown in FIG. 8A, there are the conventional PMU technologies. The Low Drop Voltage Regulator (LDVR) and the Switch Mode Buck Regulator (SM) are two independent circuits. The Low Drop Voltage Regulator (LDVR) is equivalent to the analog level shift circuit. There is no analog buffer. It is noted that the LDVR doesn't have the analog buffer stage. If the unit gain amplifier buffer is added to be the third stage, it actually has the same circuit configuration of the $2^{nd}$ stage level shift. Furthermore, the LDVR is only working in the pull up voltage supplying mode. It is no use to have the pull down mode. It is the single side operation. Therefore, today's LDVR has the $3^{rd}$ stage analog buffer is omitted. The $2^{nd}$ stage level shift serves as the analog buffer, too. This omission of the $3^{rd}$ stage of amplifier causes the stability-induced problems such as rushing-in current, over-voltage, etc. Therefore, today LDVR has the serious analog architecture and circuit configuration problems. However, the industry just follows the same mistake. Until now, there is nobody want to correct this fundamental mistake. The fundamental problem is that there is no correct analog buffer design except the unit gain buffer.

We make the fundamental breakthrough in analog buffer. Furthermore, with the analog buffer, we can integrate the LDVR with SM to be one voltage regulator to have the fast transient response to meet the requirements of both microprocessor and wireless high PAR OFDM cellular phone. As shown in FIG. 8B, the digital level shift circuit has three stages. Similarly, as shown in FIG. 8C, the analog level shift circuit of LDVR should have the analog buffer to be three stages analog architecture and circuit configuration. With the analog level shift circuit of LDVR in FIG. 8C and the switch Mode Buck Regulator (SM) in FIG. 8A, we can have the unified PMUx architecture as shown in FIG. 8D which is corresponding to FIG. 3A. The unified PMUx architecture can have the fast transient, minimum error and power efficiency. As shown in FIG. 9, it shows the detailed architecture of the unified PMUx.

As shown in FIG. 9, there are the Switch Inductor Recycling Driver (FIG. 15), LDVR Controller (FIG. 17), VZ Adaptive Zero-Crossing Detector (FIG. 7), IZ Zero-Current Detector (FIG. 6), Switch Mode Power Control and Unified PMU Control (FIG. 18) including SM & LDVR Re-synchronizer. The Switch Inductor Recycling Driver is the key technology of the green circuit design to minimize the switch loss of PMU. For high frequency operation of the PMUx, the switching energy of the output driver is recycling that the PMUx switch loss will not increase as switching frequency increases.

A green means to deliver energy comprises an energy cycling mechanism. The energy cycling mechanism recycles the residual energy in the green energy means. Instead of discharging the residual energy, the energy cycling mechanism moves the residual energy to other portion of the green energy means. The switch inductor is the combination of two switches SC, SG and one inductor. As shown in FIG. 10, there are four states, H1, H0, SG and SC. H1 means the gate voltage is in the hold state 1. The pull up P device is on to hold the gate at 1 state. H0 means the gate voltage is in the hold state 0. The pull down N device is on to hold the gate at 0 state. The SG state means the gate SG is turned on. The SC state means the gate SC is turned on. The Cgate represents the capacitor of the driver device. To recycle the gate charge in Cgate, the gate charge in Cgate is transferred to the stored capacitor Cstor completely. Without the switch inductor, between the same two capacitors Cgate=Cstor, the charging process is just charge sharing and having the energy loss. With the switch inductor, the charge can be completely transferred from one capacitor to another capacitor without energy loss.

In the H1 state, the gate is held in 1 state. The positive charge is stored in the parametric gate capacitor. $C_{gate}$. The pull up P device is on.

As shown in the state SG, the pull up P device is off. The switch SG is connected to the ground to build up the inductor current to store the energy in the inductor current. The double threaded arrow represents the flow direction of the current.

Then as shown in the state SC, the switch SC switches on to transfer the charge to the capacitor $C_{stor}$.

As the inductor current becomes zero, as shown in the state H0, the switch SC turns off to finish the transfer of energy from capacitor $C_{gate}$ to capacitor $C_{stor}$ completely. At the same time, the pull down N device turns on to hold the state at 0 state.

Figure 10E:
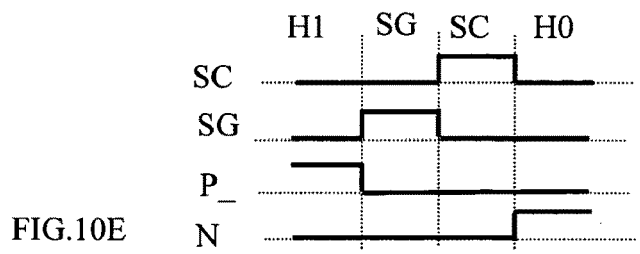
Figure 10A:
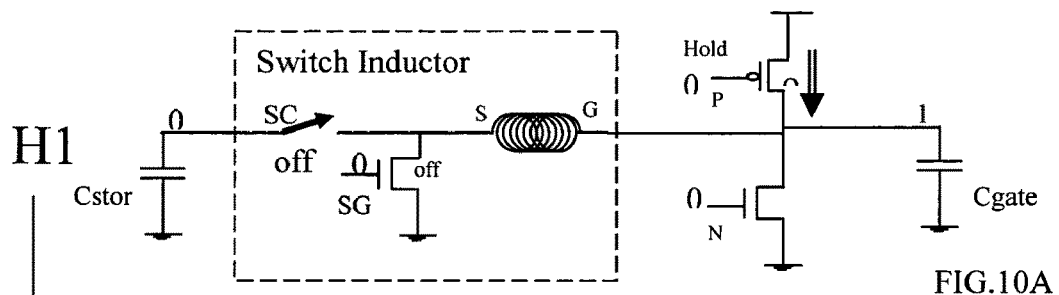
Figure 10B:
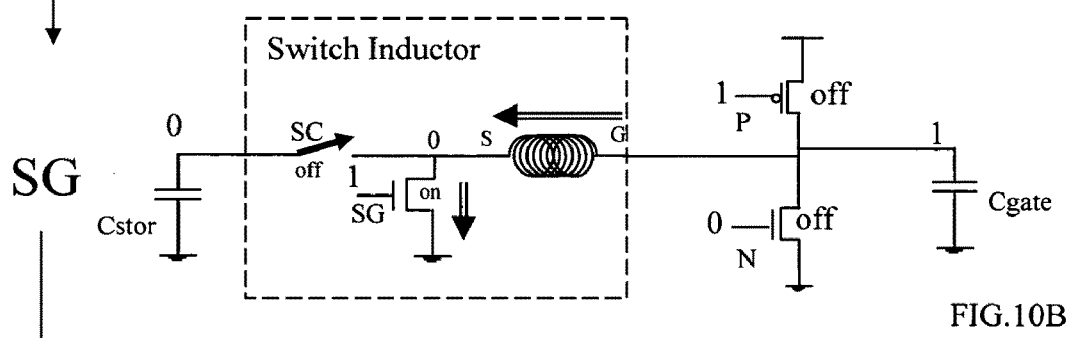
Figure 10C:
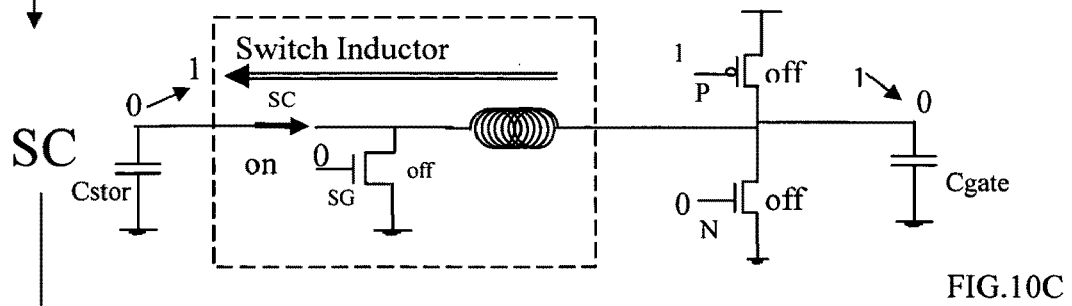
Figure 10D:
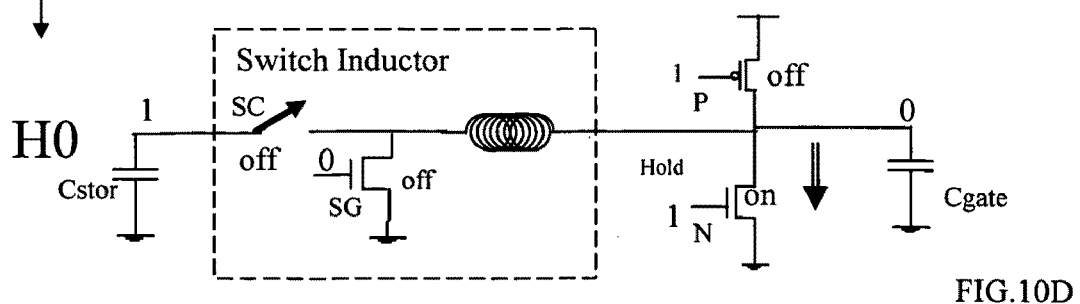
Figure 11E:
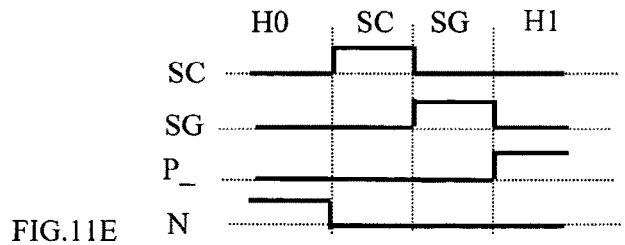
Figure 11A:
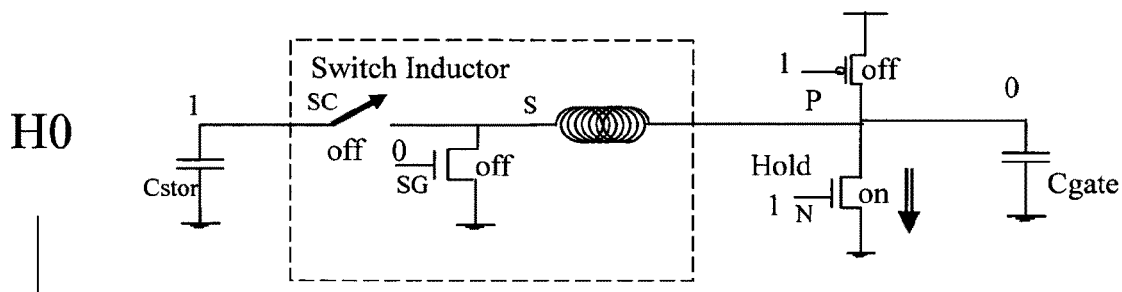
Figure 11B:
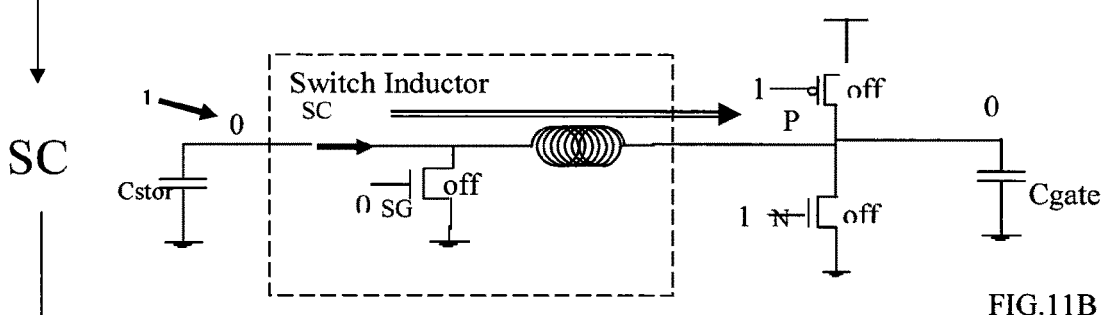
Figure 11C:
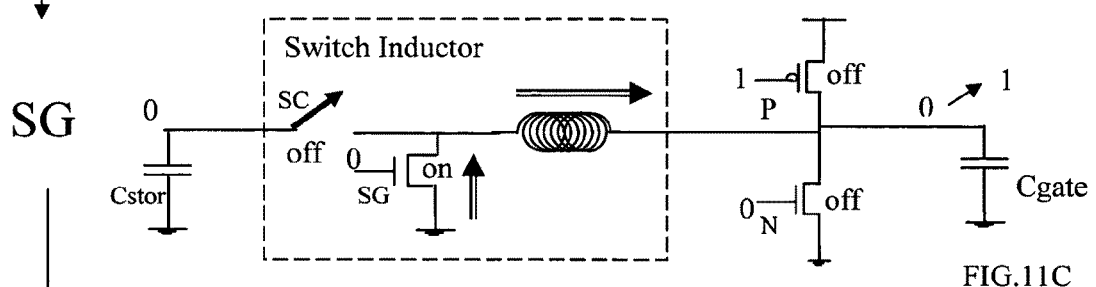
Figure 11D:
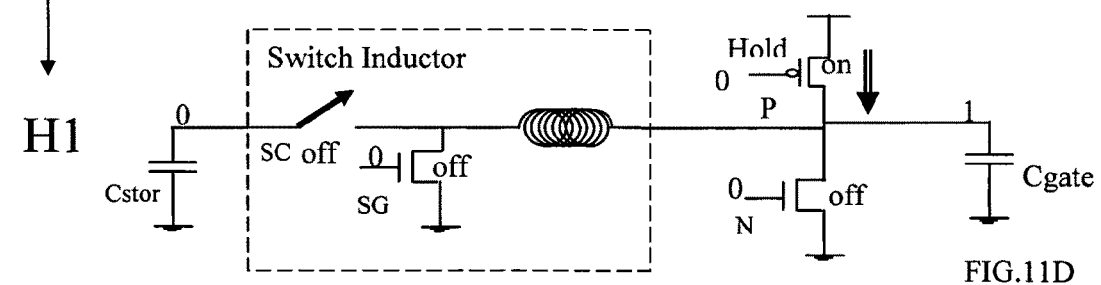

FIG. 10E shows the waveform of the switches SC, SG, P__ and N in the four states of H1, SG, SC and H0. FIG. 11 shows the recycling switch driver switches from the 0 state to 1 state. At H0 state, the pull down device is on to hold the gate voltage at 0 state. At the SC state, the pull down device N is turned off and the switch SC is turned on. The inductor current flows from the capacitor $C_{stor}$ to the gate $C_{gate}$. As the voltage of the capacitor $C_{stor}$ is zero, the state is transferred from SC state to be the SG state. The switch SC is turned off and the gate SG is turned on. The current flows from the ground to the $C_{gate}$. As the inductor current $I_L$ is zero, the state is transferred from the SG state to the H1 state. The switch SC is off and the pull up device P is on to hold the gate $C_{gate}$ at 1 state.

As shown in FIG. 12, it shows the global view of the timing relation between the switch mode buck regulator and the switch inductor. As shown in FIG. 9, the P drive MP is the P device of the buck regulator; the MP__ is the waveform of the inverse signal of the gate signal MP. The N drive MN is the N device of the buck regulator; the MN is the waveform of the gate signal MN. In one cycle of period T, the duty cycle is DT. There are four events: (1) Vsup=VL; (2) Vsup=VU; (3) VZ (Vo=0); (4) IZ (IL=0). For the switch inductor, the switch delay can be compensated with the preset time to trigger the switch action earlier. Just as the case of VZ to have the delay loop compensation for the switch delay, all the other events can be compensated the switch delay with the same way.

Figure 13D:
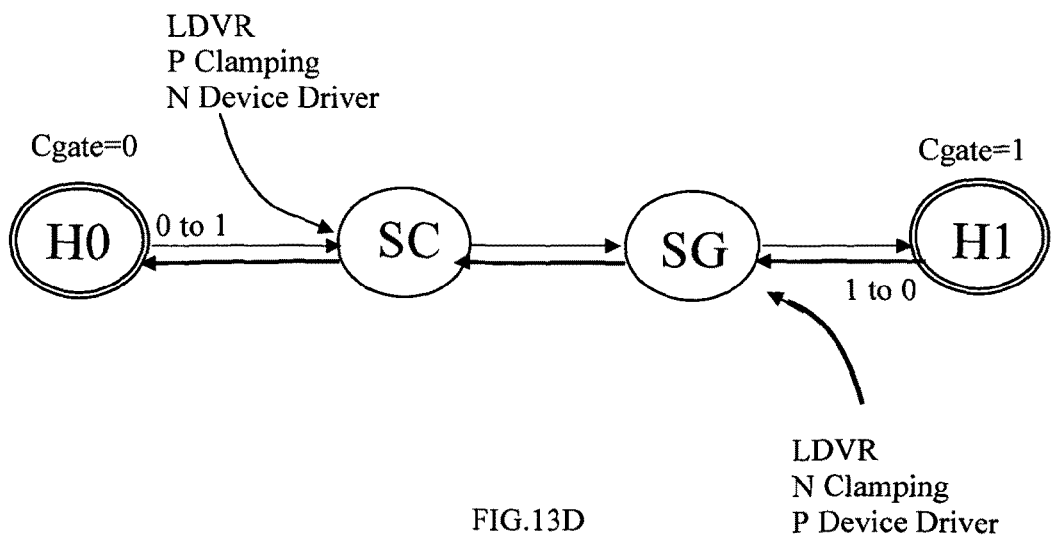

In the FIG. 12, we see the P drive switch repeats with the pattern of H0,SC,SG,H1,SF,SC,H0; the N drive switch also repeats with the pattern of H0,SC,SG,H1,SF,SC,H0. We can find the way to unify the control for the switch inductor. As shown in FIG. 13A, it is the transition from H1 to H0 state diagram. As shown in FIG. 13B, it is the transition from H0 to H1 state diagram. As shown in FIG. 13C, we combine the FIG. 13A with FIG. 13B, the transitions is recycling in the state diagram. Referring to FIG. 9 and FIG. 17, as shown in FIG. 13D, we can add the extra LDVR driven switching activations in the state diagram, too.

Figure 14B:
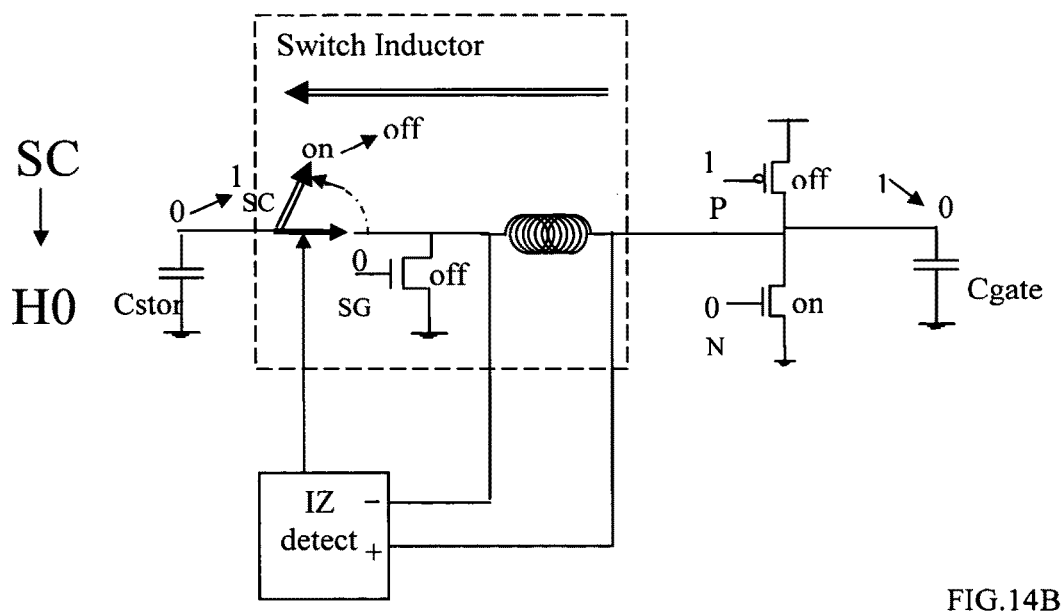
Figure 14C:
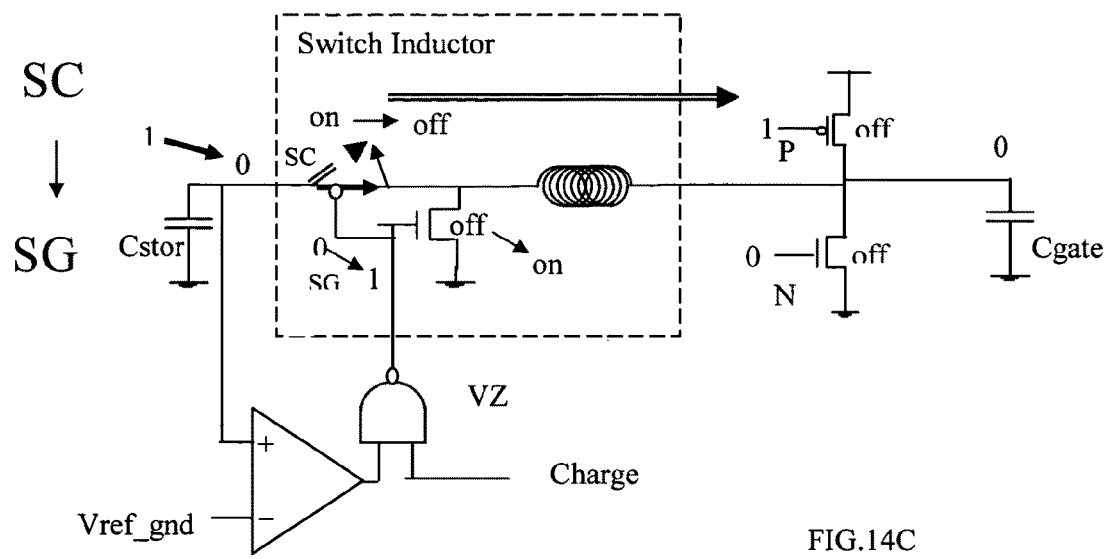
Figure 14D:
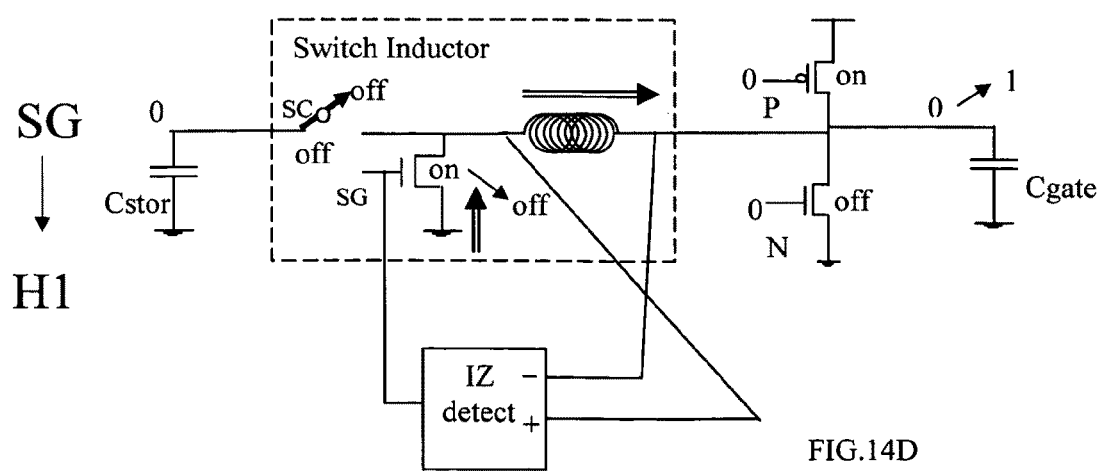

The transition among the switch inductor switch state diagram is event-driven. As shown in FIG. 14A, the transition from SG to SC is the Zero-Voltage Crossing VZ event. As $C_{gate}$ voltage is zero, turn off the SG and turn on SC. As shown in FIG. 14B, the transition from SC to H0 is the Zero-Current Crossing IZ event. As the inductor current is zero, turn off the switch SC then turn on N device to hold Cgate at H0 state. As shown in FIG. 14C, the transition from SC to SG is the Zero-Voltage Crossing VZ event. As $C_{stor}$ voltage is zero, turn off the SC and turn on SG. As shown in FIG. 14D, the transition from SG to H1 is the Zero-Current Crossing IZ event. As the inductor current is zero, turn off the switch SG then turn on P device to hold Cgate at H1 state.

As shown in FIG. 15, to have the resource sharing, we can unify the switch inductor drive system. As shown in FIG. 15A, the state transition between SC and SG can share with one VZ detector circuit. As shown in FIG. 15B, the transition from SC to H0 and the transition from SG to H1 can share one IZ detect circuit. With the multiplex, we can configure the IZ detector and VZ for different event driven state diagram transition. As shown in FIG. 16, the logic table for the event driven switch inductor drive is summarized in the Table of Energy Recycling Drive.

The SM is power efficient but slow transient response. The analog buffer of the LDVRx as shown in FIG. 17 is low power and has fast transient response. Therefore, the PMUx of the hybrid LDVRx-SMx has both the power efficient and fast transient response. Furthermore, the fast LDVR transient current will convert to be the SM switching current that the energy is recycling and the LDVRx still has the SMx power efficiency. FIG. 18 is the global view of the hierarchical state transition diagram of the green PMU circuit design. Even the state diagram looks so complex, it is noted that a lot of state transition is embedded in the architecture and system itself. So, the implementation has been simplified a lot. As shown in FIG. 3A, FIG. 9, FIG. 12 and FIG. 17, the LDVR upper triggering voltage VUCN (upper N device clamping voltage) is larger than VU. The LDVR lower triggering voltage VLCP (lower P device clamping voltage) is less than VL. In other words, as the LDVR is triggered, the switch inductor drive is already triggered. The SM & LDVR Re-synchronizer in FIG. 9 is only to keep the relation of VUCN>VU>VL>VLCP. So the synchronization of LDVR and SM is embedded in the architecture and system design.

Referring to FIG. 1, FIG. 19A and FIG. 38A, the output power Vsup of PMU is provided to the RF power amplifier to be VDD. FIG. 19A is the generic power amplifier of all the power amplifier design today. The input Vin is AC coupled with the input N device. The load for the power amplifier is the inductor L. Adjusting the bias of input Vin, the power amplifier works as A, B and C different modes.

Figure 19B:
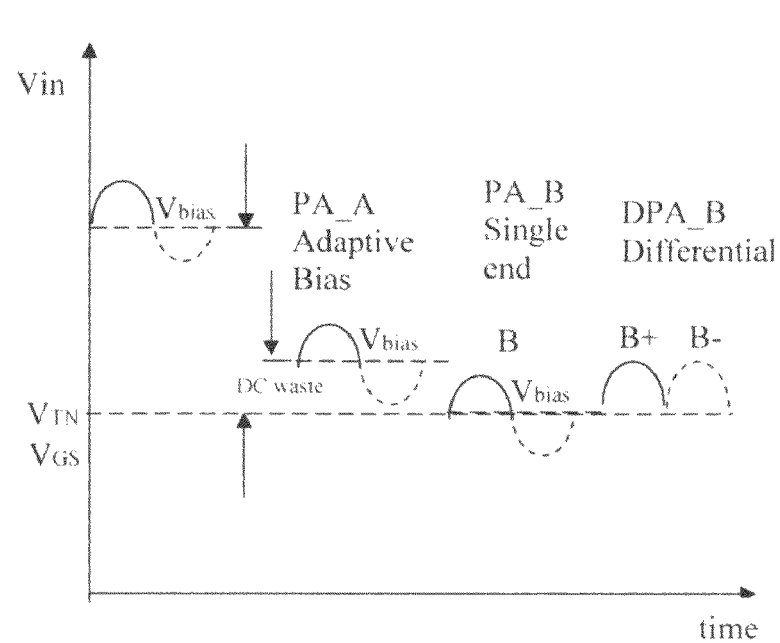

FIG. 19B shows the Vin with different bias conditions. $V_{TN}$ is the threshold voltage of the N device. It is the $V_{GS}$ for the NMOS device and $V_{BE}$ for the bipolar device. To make analysis, the input Vin is assumed to be $$V_{in}=V_{bias}+A\sin(\omega t)$$

$$V_{in\_eff}=(V_{bias}-V_{TN})+A\sin(\omega t)=V_{DC}+A\sin(\omega t)$$

Figure 19C:
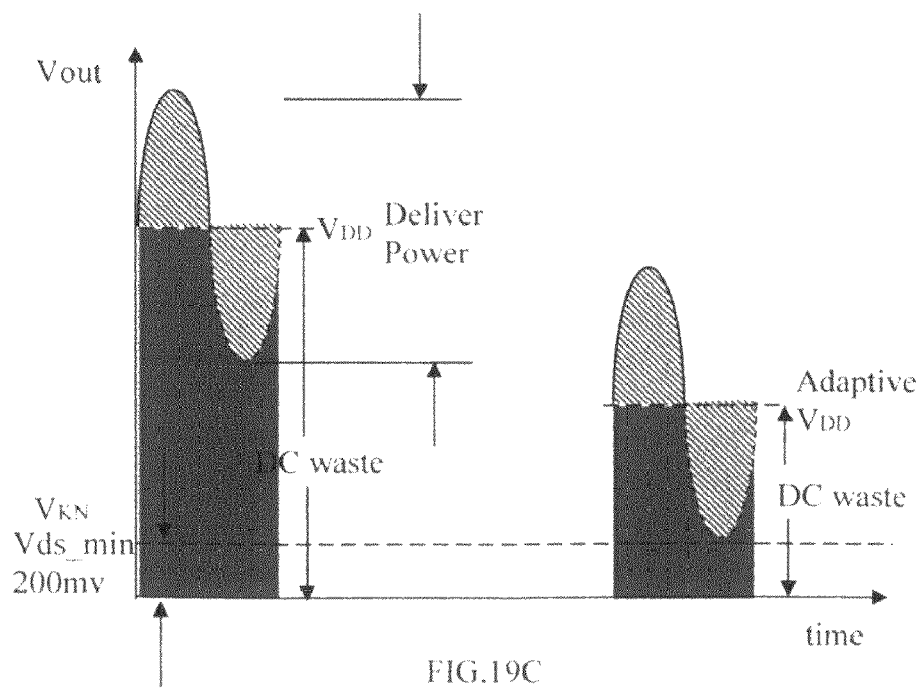

The $V_{DC}$ induces the $I_{DC}$. The $V_{DC}$ induces the DC current $I_{DC}$ dissipation which causes the waste of power energy. So, in the $V_{in}$, we want to have the $V_{DC}$=0. It is the B type power amplifier PA-B. The conventional PA-B power amplifier only has half period of modulation. For the unsymmetrical OFDM modulation signal, etc, it will lose the signal information and lose the fidelity of the signal. Therefore, we need to have the differential B type power amplifier DPA-B for the OFDM signal. The differential has two-fold effects of (1) fidelity to have the high linearity effect; (2) power recycling to have high power efficiency effect FIG. 19C shows the Vout of the PA power amplifier. Since $L(dI_{DC}/dt)$=0, the output voltage Vout is the sinusoidal curve oscillation with the $V_{DD}$ as the central line. The amplitude of the sinusoidal curve oscillation is the delivery power. The $V_{KN}$ is the kink voltage which is the minimum of the output voltage for N type device. The kink voltage $V_{KN}$ is the $V_{DS}$ for the NMOS device and $V_{CE}$ of the bipolar device. The DC area below the line $V_{DD}$ is the waste energy. To reduce the waste of the power, we can adaptive adjust the power according to the Vin input waveform to reduce the voltage of the power supply $V_{DD}$.

Figure 20A:
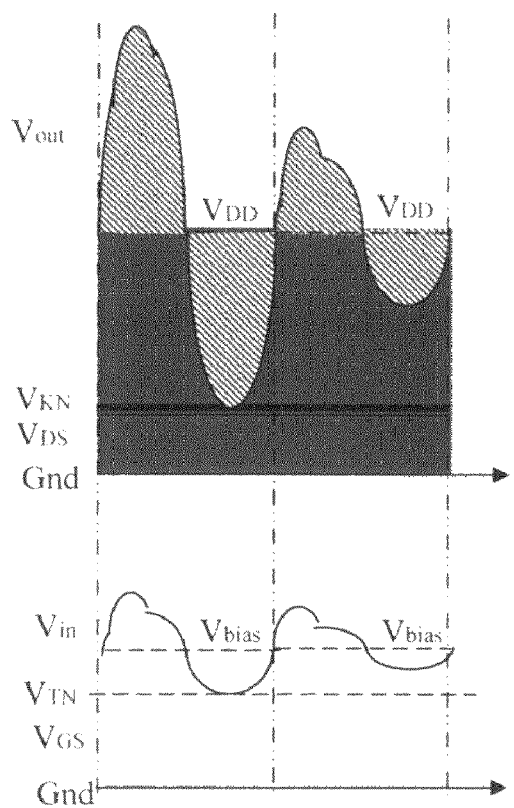
Figure 20B:
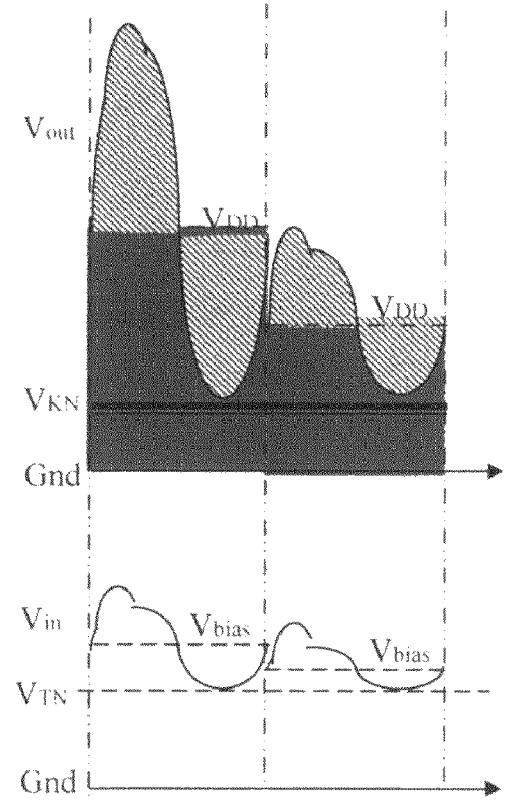
Figure 20C:
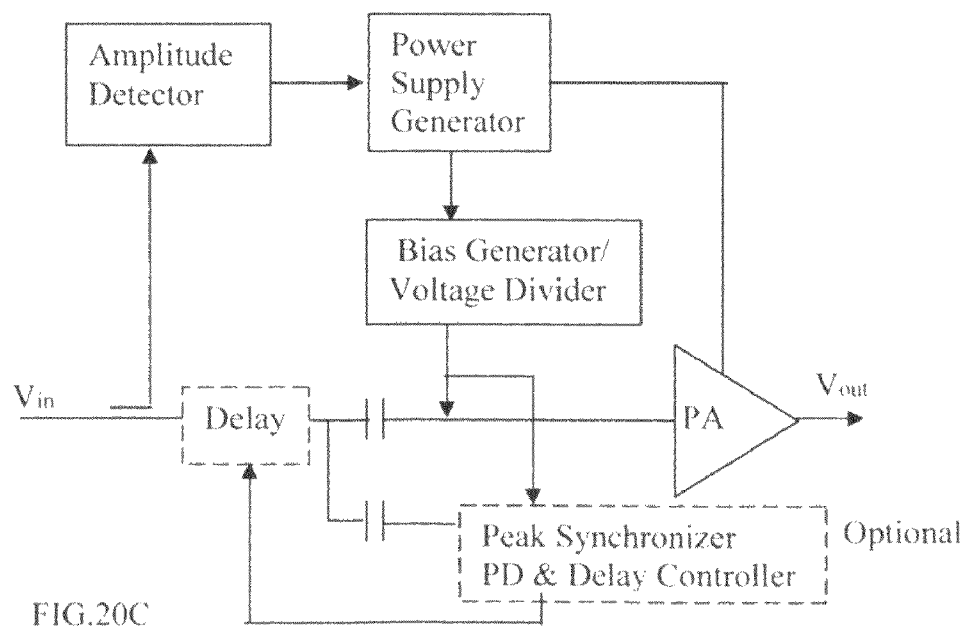

To enhance the RF power efficiency, as shown in FIG. 20, it is the adaptive power and bias A type power amplifier APB-A-PA. As shown in FIG. 20A, the input Vin has the unnecessary waste of energy due to the DC bias $V_{bias}$. As shown in FIG. 20B, we can reduce the voltage level of the bias $V_{bias}$ to reduce the DC waste. Furthermore, as shown in FIG. 20A, the Vout waveform must be higher than the kink voltage $V_{KN}$. As the amplitude of $V_{out}$ is small, as shown in FIG. 20B, we can reduce the voltage level of the power supply $V_{DD}$ to reduce the DC power waste. Both the $V_{DD}$ and $V_{bias}$ can be scaled and adjusted according to the amplitude of the input signal Vin. As shown in FIG. 20C, the amplitude detector detects the amplitude of the input signal $V_{in}$. The amplitude detect sends the amplitude information to the Power Supply Generator to generate the adaptive scaling power $V_{DD}$. The adaptive scaling power $V_{DD}$ is send to the Bias Generator to generate the adaptive bias for the power amplifier. The Bias Generator can be as simple as a Voltage Divider. To match the adaptive power and bias delay, a delay circuit can be inserted in the signal path of Vin. There is the synchronization mechanism of Peak Synchronizer Phase Detector (PD) & Delay Controller to adjust the delay to match the $V_{in}$ with the adaptive bias and adaptive power.

Figure 21B:
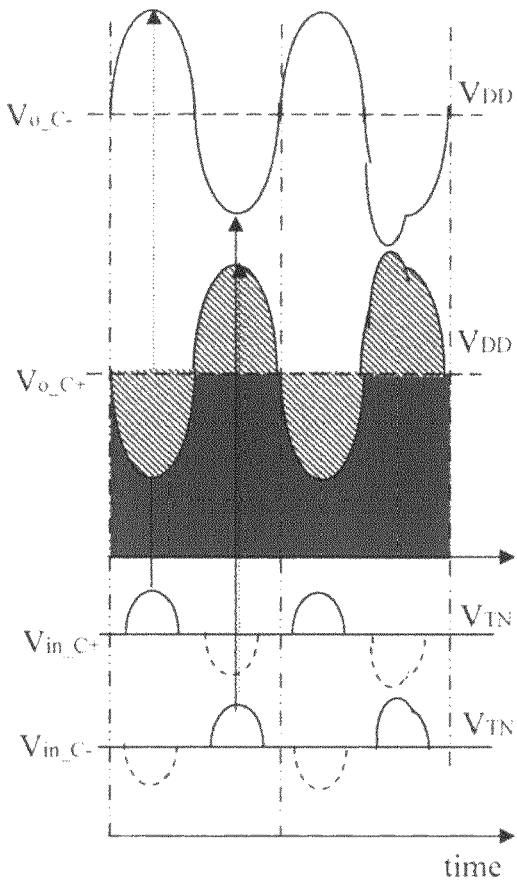
Figure 21C:
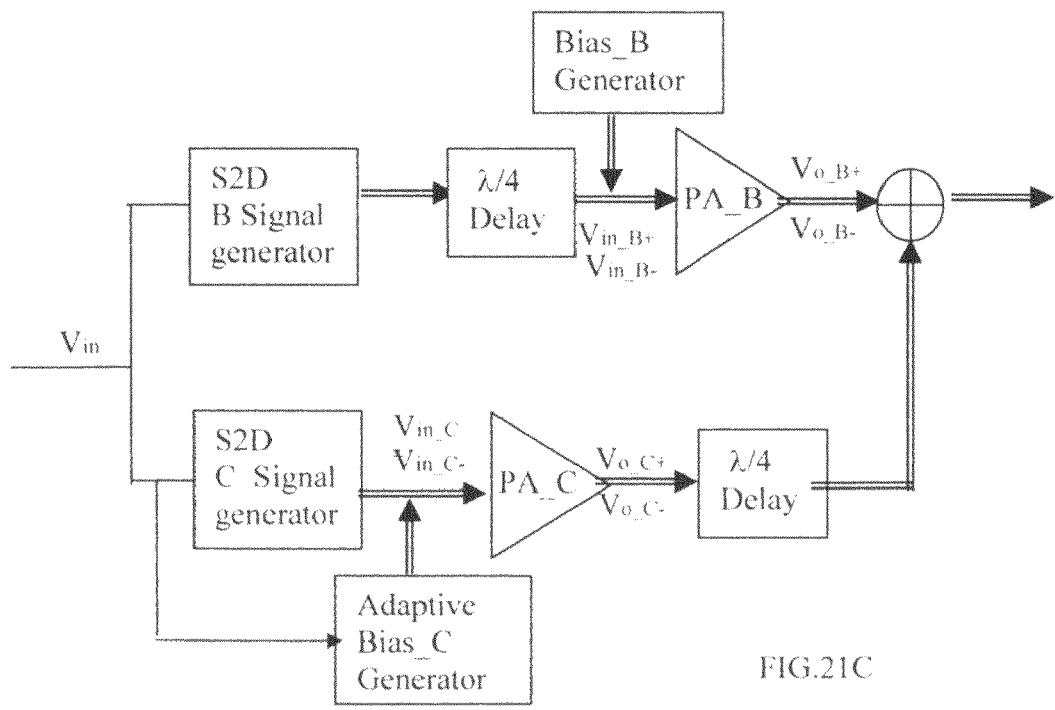
Figure 25B:
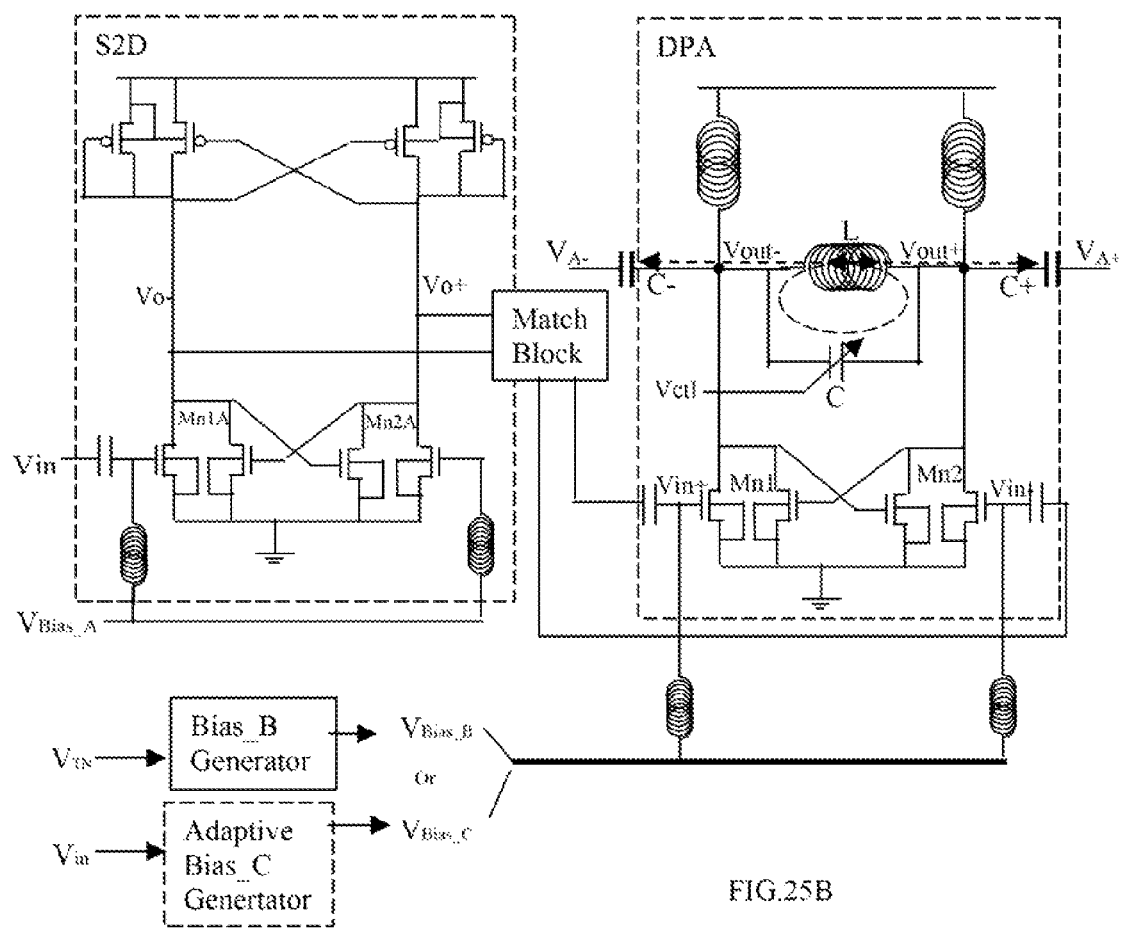

FIG. 21 shows the differential B type and C-type power amplifier DPA-B, DPA-C to work as the high linearity Doherty Amplifier. As shown in FIG. 2D, FIG. 21A and FIG. 25B, the differential power amplifier DPA-B input $V_{in\_B+}$ and $V_{in\_B-}$ are biased at the threshold voltage level VTN. The output voltage $V_{o\_B+}$ and $V_{o\_B-}$ oscillate with the power supply level $V_{DD}$ being the centerline. As shown in FIG. 21B, the differential power amplifier DPA-C input $V_{in\_B+}$ and $V_{in\_B-}$ are biased below the threshold voltage level $V_{TN}$. The output voltage $V_{o\_B+}$ and $V_{o\_B-}$ oscillate with the power supply level $V_{DD}$ being the centerline. FIG. 21C is the schematics for the differential Doherty Power amplifier. The single end signal $V_{in}$ is converted to be the differential signal $V_{in\_B+}$ and $V_{in\_B-}$ with the B Signal Generator. The single end signal $V_{in}$ is converted to be the differential signal $V_{in\_C+}$ and $V_{in\_C-}$ with the C Signal Generator. The differential power amplifiers DPA-B and DPA-C generate the differential RF outputs and merge them together.

Figure 22B:
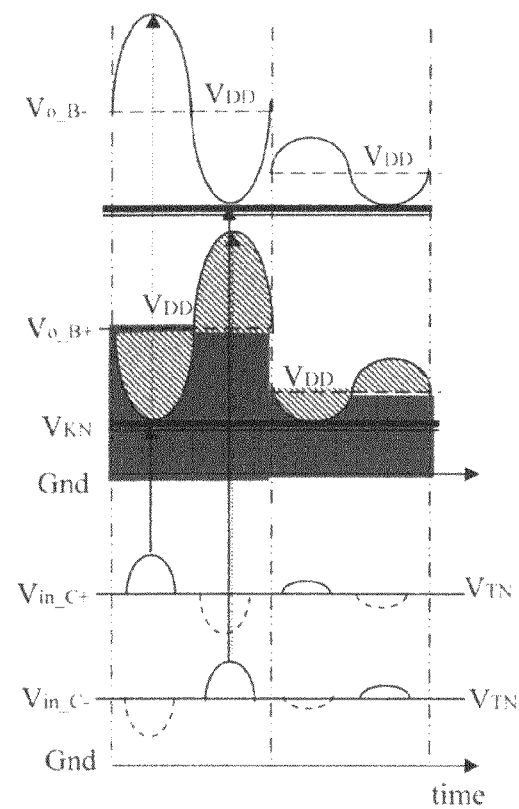
Figure 22C:
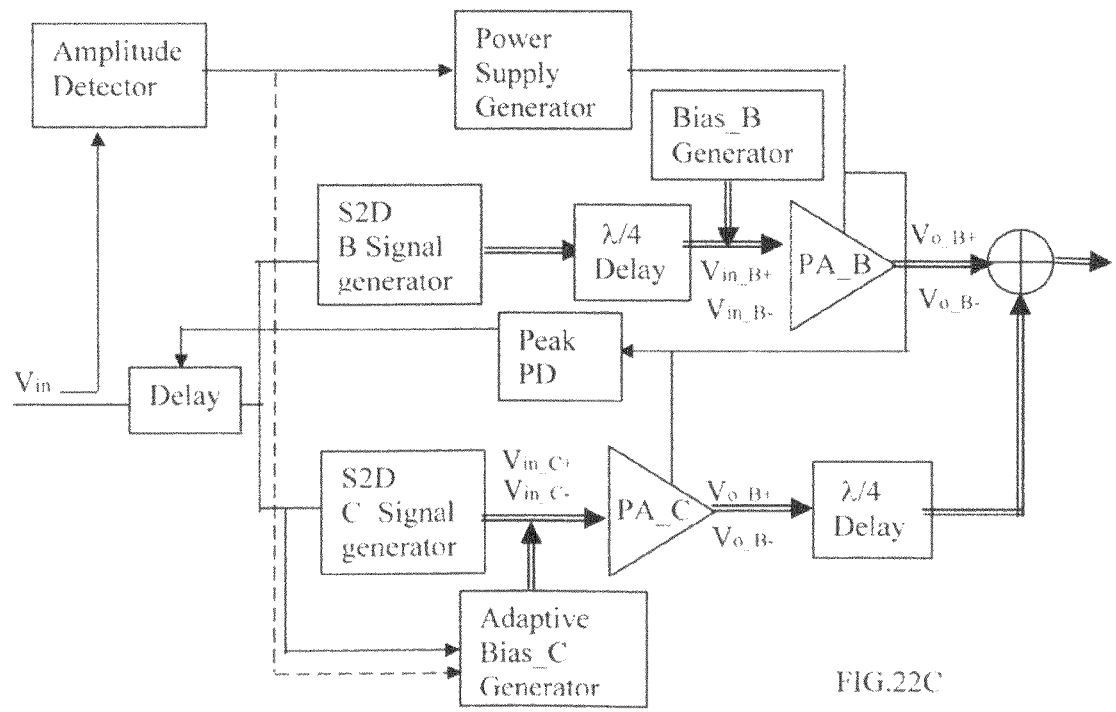
Figure 23A:
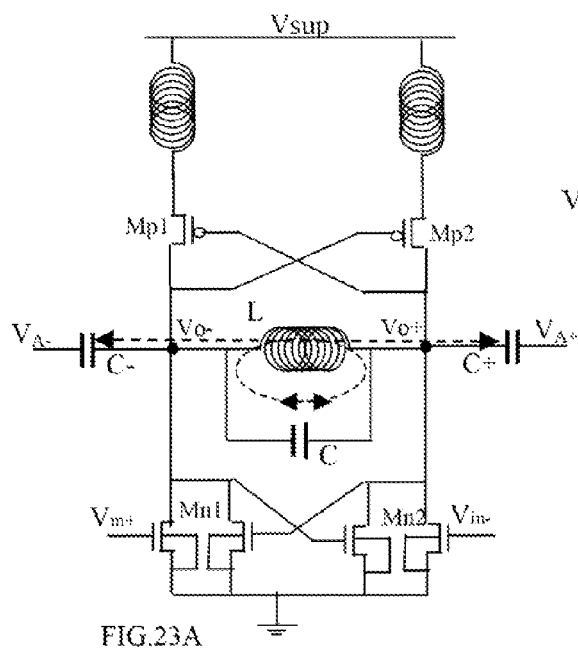
Figure 23B:
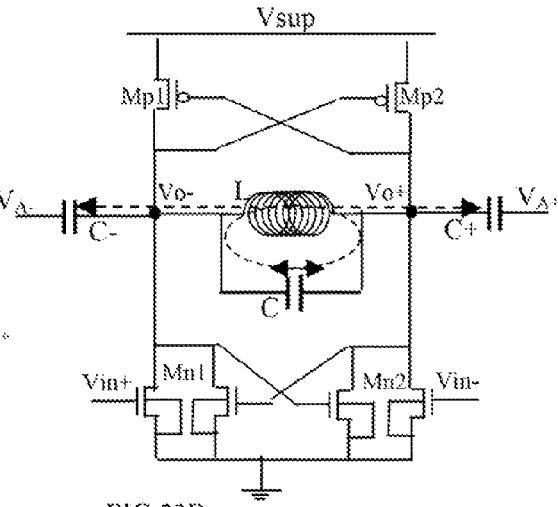
Figure 23C:
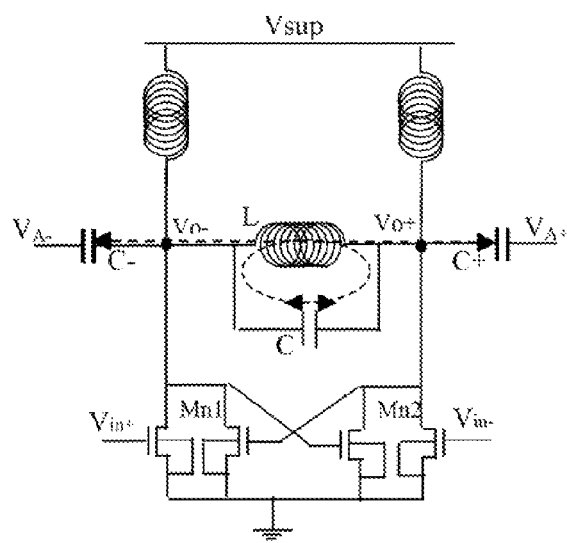
Figure 23D:
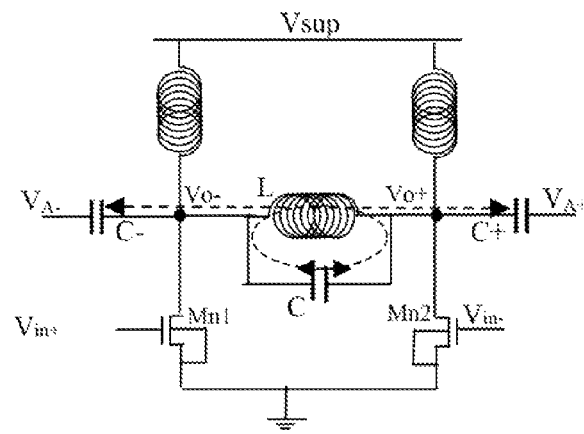
Figure 23E:
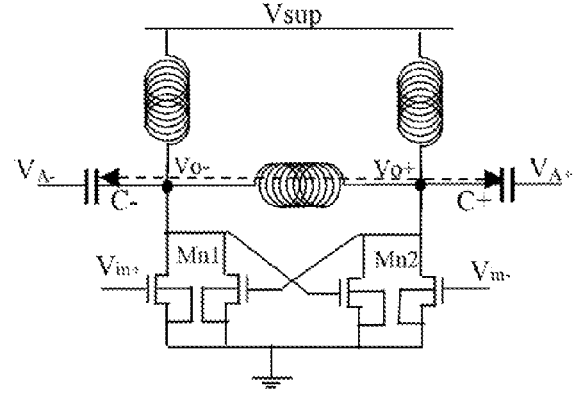
Figure 24A:
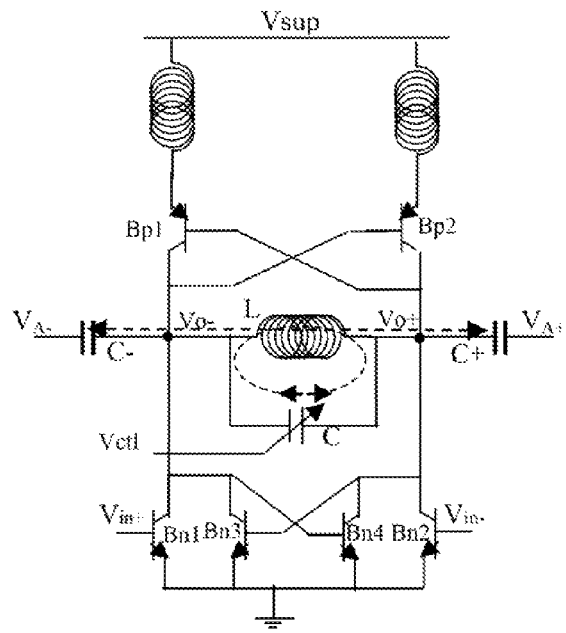
Figure 24B:
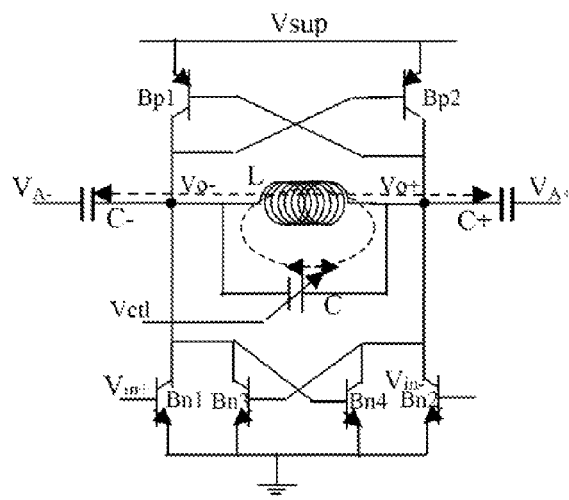
Figure 24D:
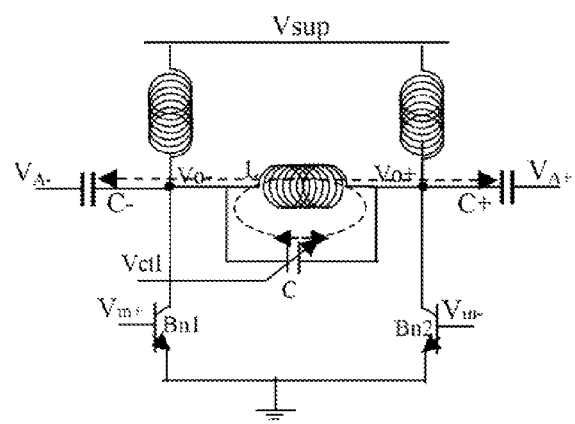
Figure 24C:
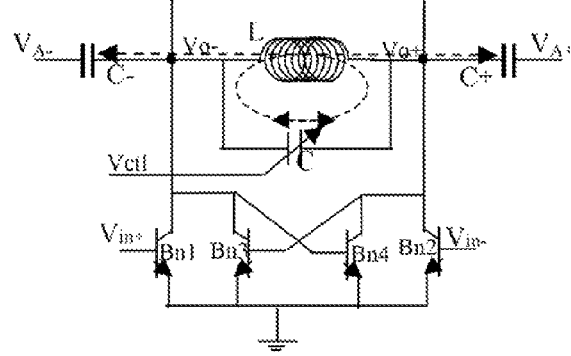
Figure 24E:
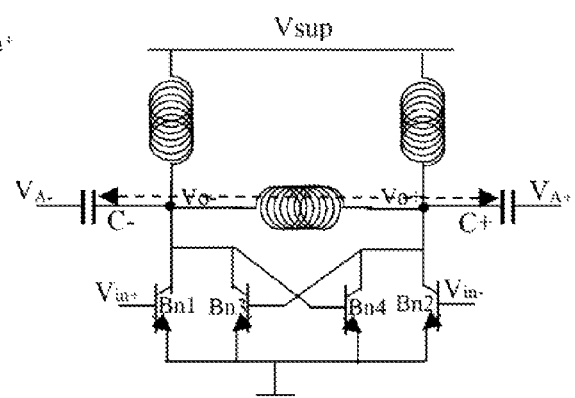

To save the energy of the Doherty Power amplifier, the scaling power supply and adaptive bias techniques are adopted. As shown in FIG. 22, the differential B type and C-type power amplifier DPA-B, DPA-C to work as the high linearity Doherty Amplifier with the scaling power supply and adaptive bias techniques. As shown in FIG. 22A, the differential power amplifier DPA-B input $V_{in\_B+}$ and $V_{in\_B-}$ are biased at the threshold voltage level $V_{TN}$. The output voltage $V_{o\_B+}$ and $V_{o\_B-}$ oscillate with the scaling power supply level $V_{DD}$ being the centerline. As shown in FIG. 22B, the differential power amplifier DPA-C input $V_{in\_C+}$ and $V_{in\_C-}$ are adaptively biased below the threshold voltage level $V_{TN}$. The output voltage $V_{o\_C+}$ and $V_{o\_C-}$ oscillate with the scaling power supply level $V_{DD}$ being the centerline. FIG. 22C is the schematics for the differential Doherty Power amplifier with the scaling power supply and adaptive bias. The amplitude detector detects the amplitude of the input signal Vin and generates the amplitude of Vin. The Vin amplitude information is sent to the Power Supply Generator to generate the scaling power supply $V_{DD}$ for the power amplifier. The Vin amplitude information is also sent to the Adaptive Bias_C Generator to generate the adaptive bias voltage for the power amplifier DPA-C. The single end signal Vin is converted to be the differential signal $V_{in\_B+}$ and $V_{in\_B-}$ with the B Signal Generator. The single end signal $V_{in}$ is converted to be the differential signal $V_{in\_C+}$ and $V_{in\_C-}$ with the C Signal Generator. The differential power amplifiers DPA-B and DPA-C generates the differential RF outputs and merge them together.

The differential power amplifier DPA is as shown in FIG. 23. With the different bias conditions, the differential power amplifier DPA can operates as A type DPA-A, B type DPA-B and C type DPA-C. The input is a pair of NMOS device. $V_{in+}$ and $V_{in-}$ are the inputs; $V_{o+}$ and $V_{o-}$ are the outputs. FIG. 23A is the complete set of the DPA which has the inductor load, cross-coupling PMOS, cross-coupling NMOS, the energy recycling LC tank. FIG. 23B is the DPA which has the cross-coupling PMOS, cross-coupling NMOS, the energy recycling LC tank. The LC tank has the dual function of energy recycling and inductor load. FIG. 23C is the DPA which has the inductor load, cross-coupling NMOS, the energy recycling LC tank. FIG. 23D is the DPA which has the inductor load, and the energy recycling LC tank. FIG. 23E is the DPA which has the inductor load, cross-coupling NMOS and the energy coupling inductor.

The Bipolar differential power amplifier DPA is as shown in FIG. 24. With the different bias conditions, the differential power amplifier DPA can operates as A type DPA-A, B type DPA-B and C type DPA-C. The input is a pair of NPN device. $V_{in+}$ and $V_{in-}$ are the inputs; $V_{o+}$ and $V_{o-}$ are the outputs. FIG. 24A is the complete set of the DPA which has the inductor load, cross-coupling PNP, cross-coupling NPN, the energy recycling LC tank. FIG. 24B is the DPA which has the cross-coupling PNP, cross-coupling NPN, the energy recycling LC tank. The LC tank has the dual function of energy recycling and inductor load. FIG. 24C is the DPA which has the inductor load, cross-coupling NPN, the energy recycling LC tank. FIG. 24D is the DPA which has the inductor load, and the energy recycling LC tank. FIG. 24E is the DPA which has the inductor load, cross-coupling NPN and the energy coupling inductor.

Figure 25C:
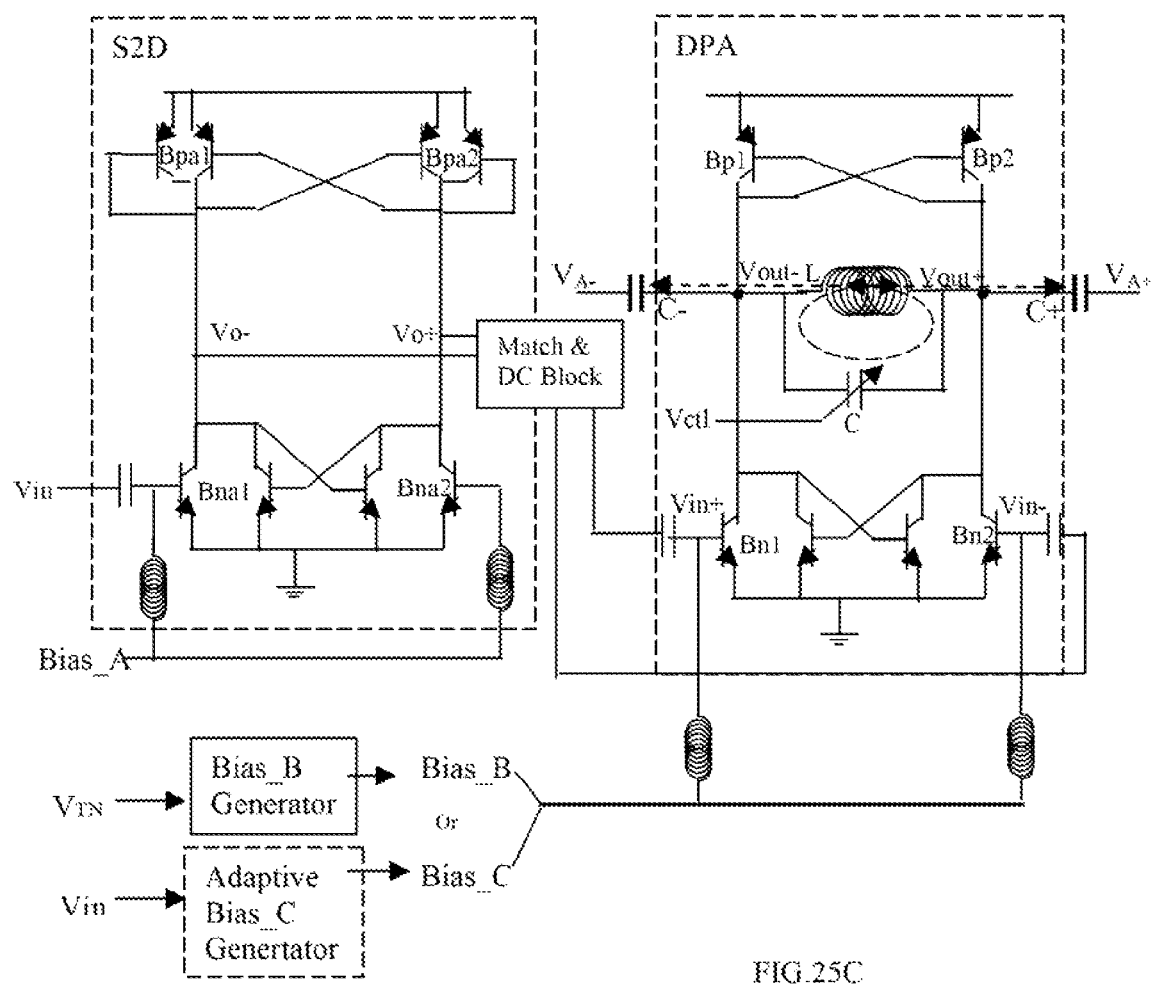

As shown in FIG. 2B, after the mixer, the signal is sent to the RF power amplifier. The output of the mixer is differential end. There is no need to have the single end to differential ends conversion. However, today most power amplifiers still are the single end that there is a need to convert the single end RF signal to the differential ends. As shown is FIG. 25A, it is the balun to convert the single end to differential ends. However, to convert the single end differential signal to be the B-type and C-type differential signals, we need to use the special circuits. As shown by the S2D in FIG. 25B, the single end signal is convert to the differential end signals with the differential amplifier which is biased at the A-type biasing voltage $V_{Bias\_A}$. The $2^{nd}$ stage is the differential power amplifier DPA. FIG. 25C is Bipolar version of the S2D and DPA.

Figure 26B:
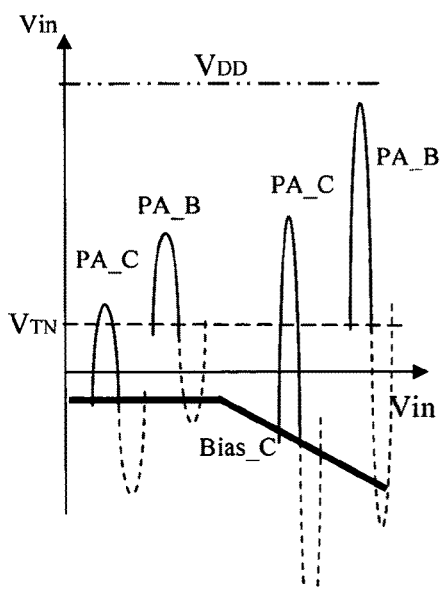
Figure 26C:
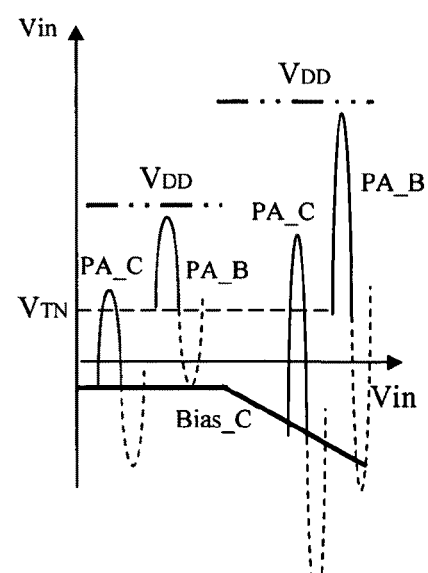

As shown in FIG. 21 and FIG. 22, the Doherty power amplifier uses a lot of scaling power generator and bias generator. As shown in FIG. 26A, there are the Amplitude Detector, Bias_A Generator, Bias_B Generator, Bias_B Generator, Adaptive Bias_C and Generator Power Supply Generator. As shown in FIG. 26B, it is the plan for the input Vi of the Differential Doherty power amplifier as shown in FIG. 21. As shown in FIG. 26C, it is the plan for the input Vi of the scaling power and adaptive bias voltage Differential Doherty power amplifier as shown in FIG. 21.

As shown FIG. 2B, the Xtaless Clock Generator and Spur-free FPLL are the important green circuit designs. Crystal clock consumes a lot of energy that it has to be replaced with the Xtaless Clock Generator. As shown in FIG. 27. the green circuit design of Xtaless Clock Generator and Spurfree FPLL can be implemented on-chip to save both resource and energy.

The circuit has many fundamental mistakes before. The argument for the on-chip low Q inductor L cannot generate high Q LC resonator. Actually, any active resonator has Q to be infinity. The Q definition for LC resonator is $$Q = \frac{\text{Average Stored Energy}}{\text{Dissipation Energy}}$$

$$= \frac{LC \text{ tank Stored Energy}}{[R \text{ Dissipation}+(-R) \text{ Energy Injection}]}$$

$$= \frac{LC \text{ tank Stored Energy}}{0}$$

$$= \text{infinity}$$

Therefore, as shown in FIG. 28A, with the gain-boost green circuit design technology, we can use the on-chip low Q inductor to build the high Q LC resonator. The capacitors $C_{lam}$ and $C_{onj}$ are to clamp the $v_{com}$ and $g_{com}$ to be constant voltage to reduce the oscillation self-induced switching noise. Furthermore, as shown in FIG. 27A and FIG. 27B, adjust the capacitor C 8 series resistance $R_C$ 8R to be equal to the parametric resistance $R_L$ of the inductor L, the oscillation frequency of the LC tank 1 will be independent of the temperature. So, the clock frequency reference LC tank is compensated with the capacitor resistance 8R and the frequency variation is adjusted with FPLL, the Xtaless Clock Generator has both temperature and frequency high performance.

Figure 28G:
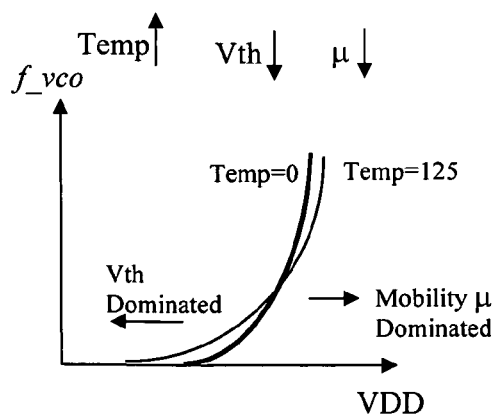
Figure 28H:
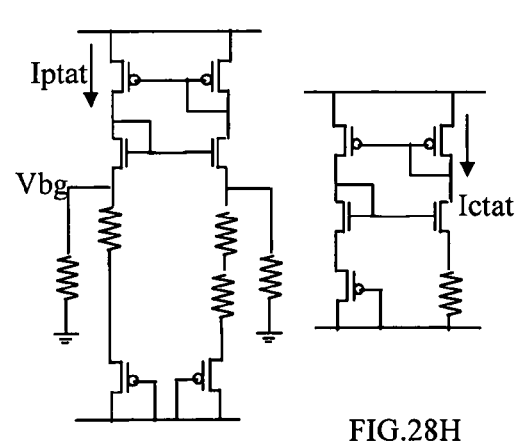

For the Giga Hertz (GHz) range high frequency LC resonator, the high frequency divider is very important. The speed of the conventional CMOS DFF is too slow. The high-speed Current Mode Logic (CML) FF consumes a lot of energy. Therefore, the green circuit design for the high frequency divider is as shown in FIG. 28B. FIG. 28B is the high-speed latch (HSL) of green flip-flop GFF. A green means comprises a fast latch. The fast latch comprises a pair of cross-coupling p type device and a pair of n type device being activated by one clock. A pair of cross-coupling n type device being activated with the reverse phase of the clock. FIG. 28C is the green flip-flop (GFF) made of two high-speed latch (HSL). As shown in FIG. 28C, the green flip-flop GFF has high speed and low power characteristics. A green means comprising a fast flip-flop, The flip-flop comprises a pair of latches. A pair of output terminals of the first latch are connected to a pair of inputs of the second latch. The clock of the first latch and the clock of the second latch are in reverse phase. FIG. 28D show the green logic circuit design. The clock generator generates the non-overlapping clock. At the falling of the non-overlapping clock, the preset signals are generated to preset the NOR/OR gates in FIG. 28E and the NAND/AND gates in FIG. 28F. A green means has high-speed low power logic, A clock generator means generating non-overlapping clocks and pre-setting signal. The pre-setting signal is in an interval between said non-overlapping clocks. The pre-setting signal presets the logic gates in pre-setting states and evaluates in an interval of the non-overlapping clocks. FIG. 28G shows the characteristics curve of the submicron logic circuit speed with the frequency of VCO of ring oscillator. As the temperature increases, both the threshold voltage $V_{th}$ and the mobility µ decrease. As the VDD is small, Vth dominates the speed of logic circuit. As VDD is high, mobility µ dominates the speed of logic circuit. As shown in FIG. 28G, there is a cross point on the $f_{-vco}$ vs $V_{DD}$ curve. This curve is important to identify the worst corners in the PVT simulations. As shown in FIG. 27 and FIG. 28H, it shows the green circuit design for the low power bandgap reference for the $I_{ptat}$, $I_{ctat}$, $I_{bg}$ and $V_{bg}$ where $I_{bg}=I_{ptat}+I_{ctat}$ is constant over the temperature.

Figure 29B:
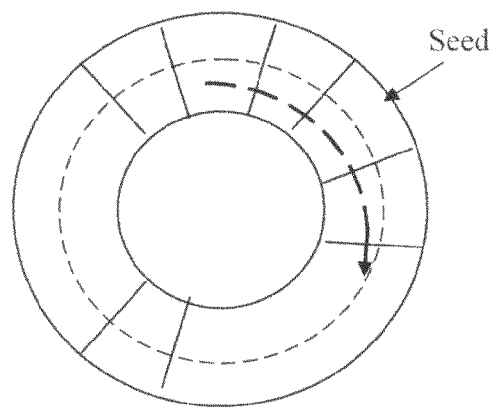
Figure 29C:
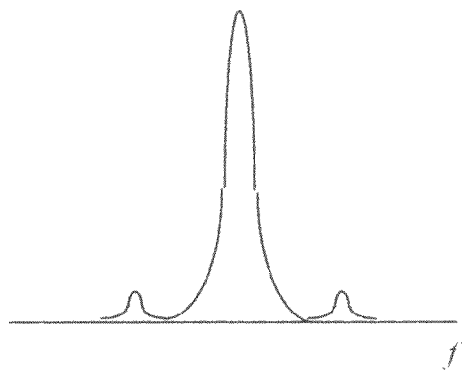

As shown in FIG. 29A, the conventional Phase Lock Loop PLL has many fundamental conceptual mistakes. As shown in FIG. 29B and FIG. 29C, the PLL has a lot of jitter and spur which cannot eliminate due the wrong design concepts. As shown in FIG. 30A, it is the correct green circuit design of the FPLL. Comparing the FPLL with conventional PLL, it shows the fundamental mistakes in the conventional Phase Lock Loop PLL design. First, the LC VCO (LCO) is the resonator has the $2^{nd}$ order filter effect. It is a noise filter. In the phase based small phase signal model never consider the LCO filter effect. Second, from the ΣΔ converter viewpoint, the PFD generates UP and DOWN is the ΣΔ converter type noise signal. It cannot inject these UP and DOWN noise type signal into LC VCO directly. It needs the ΣΔ DAC converter to average these UP and DOWN noise signal to be the average signal value first. Then the average value is injected the LC VCO. Today PLL just injects the UP and DOWN noise directly into LC VCO. It is the fundamental mistake in today PLL design.

Figure 30B:
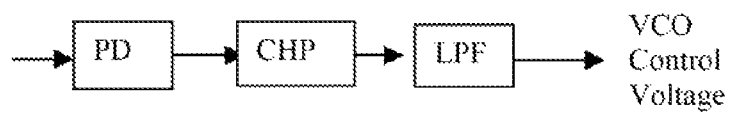
Figure 30C:
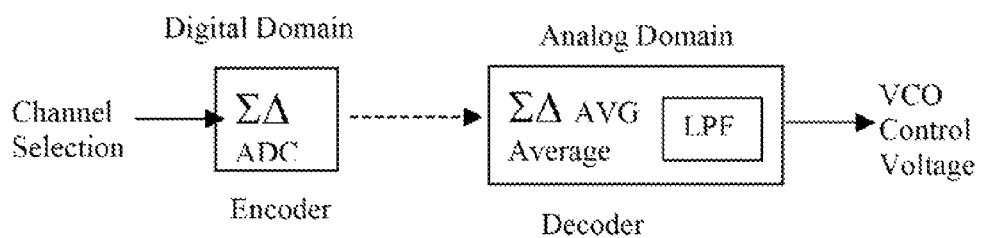

As shown in FIG. 29A, the conventional factorial Phase Lock Loop PLL has the ΣΔ ADC. As shown in FIG. 30B, the conventional factorial Phase Lock Loop PLL still uses the phase detector PD, charge pump CHP and Low Pass Filter LPF. In other words, in the conventional factorial Phase Lock Loop PLL has the ΣΔ ADC, but it doesn't have the analog average signal process ΣΔ AVG. However, from the fundamental principles of communication theory, there should be the symmetry in the encoder and decoder path as shown in FIG. 30C. The conventional factorial Phase Lock Loop PLL has only ΣΔ ADC. It does not have the analog average signal process ΣΔ AVG. In other words, the conventional factorial Phase Lock Loop PLL completely violates the fundamental principle of the communication theory.

Figure 29D:
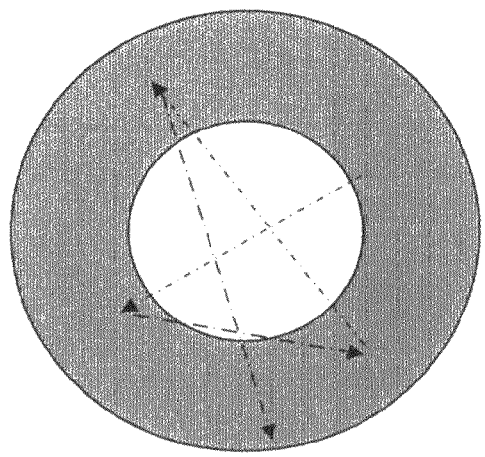
Figure 29E:
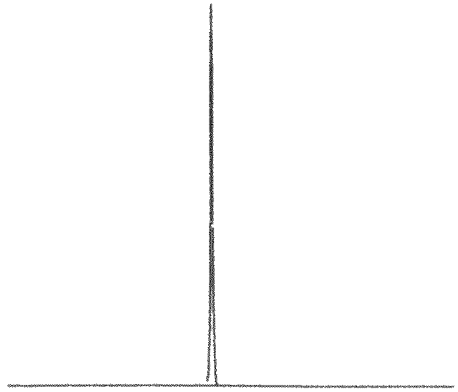

Furthermore, as shown in FIG. 29A, the conventional factorial Phase Lock Loop PLL uses the Pseudo-Random Number Generator (PRNG). It is well know that the Pseudo Random Number Generator (PRNG) has the fixed patterns as shown in FIG. 29B. Furthermore, from the chaotic theory, the PRNG generates the chaos cannot use as the Random Number Generator (RNG). The state in PRNG is step one by one. The randomness distance between two successive states is only one. Therefore, the chaos has very similar repetitive pattern. The repetitive pattern will generate the spur in the spectrum as shown in FIG. 29C. As shown in FIG. 30A, the green circuit FPLL uses the on-chip CMOS compatible True Random Number Generator (TRNG). The TRNG is generated with randomized chaos, not chaos only. In other words, the chaos has been further processed with the randomized process to be randomized chaos. As shown in FIG. 29D, the state of TRNG is infinite in analog voltage and continuous time domains. Furthermore, the state is jumping in the state domain. The randomness distance between two states is far away. The pattern never repeats itself that it is spurfree as shown in FIG. 29E.

Figure 30D:
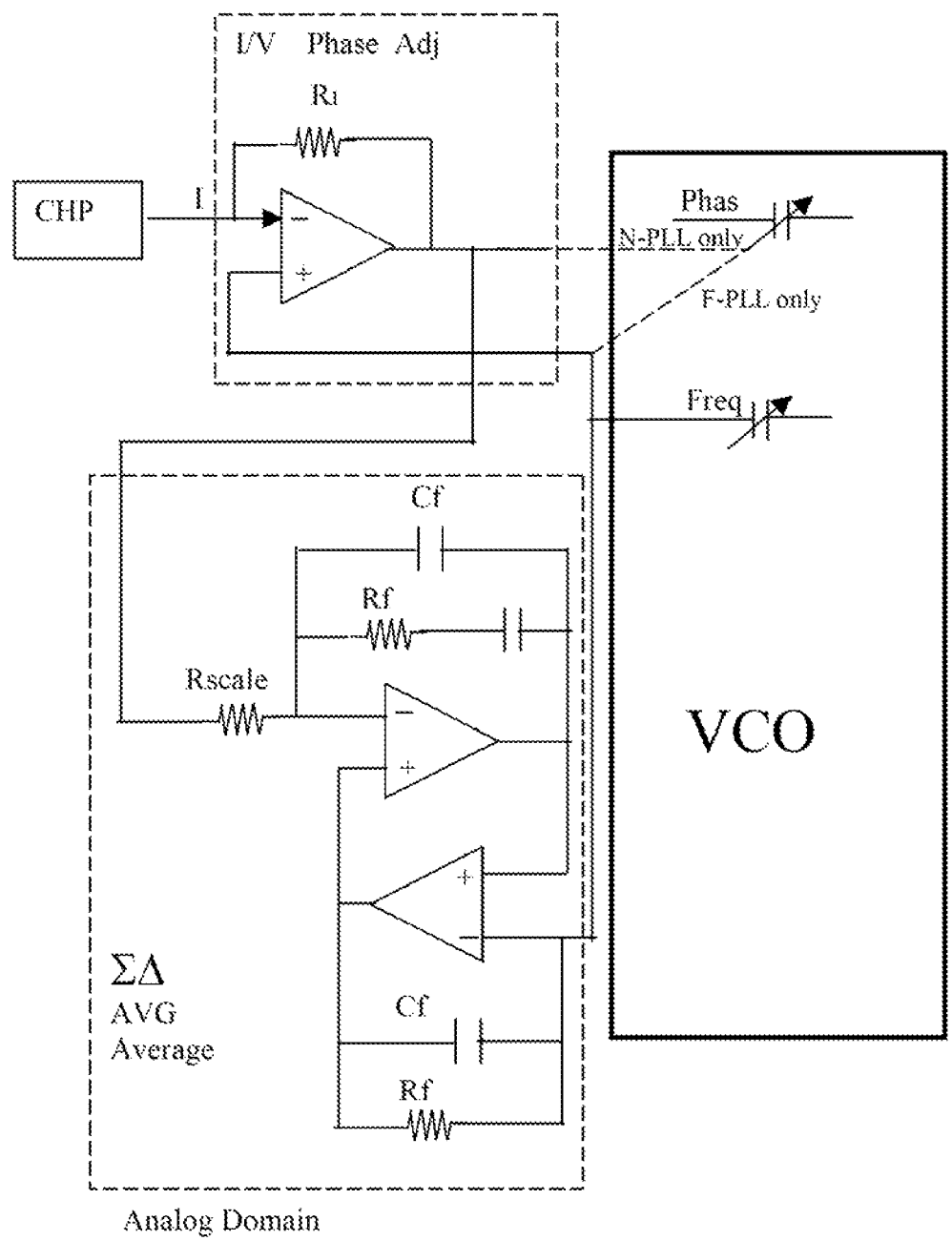

As shown in FIG. 30A, the green design of frequency and phase lock loop FPLL adopts the analog average signal process ΣΔ AVG and TRNG that it is jitterless in time domain and spurfree in frequency domain. The analog average signal process ΣΔ AVG is shown in FIG. 30D. To eliminate the switch noise, the analog average signal process ΣΔ AVG is implemented with the continuous in time analog circuit.

The Xtaless clock generator is very important in the green circuit design for the electronic power plasma lighting industry, too. The resonator cavity has specified wavelength. It is corresponding to the switch signal has the specified frequency which is derived from the Xtaless clock generator. As shown in FIG. 2G, FIG. 2H and FIG. 31A, the power management unit (PMUx) supply the power to the power amplifier. The power amplifier delivers the resonate power to the antenna in the RF resonator. The power amplifier is the resonator in time domain; RF resonator is the resonator in space domain. The wavelength in space domain determines the frequency in time domain. To generate the frequency correctly for the electronic plasma light, it needs the Xtaless clock generator.

For the PA power amplifier, to have the maximum efficiency, as shown in FIG. 2H, the oscillation amplitude is operated at the full range of the power supply. To have the oscillation amplitude is full range of the power supply, it is to adjust the pulse width of power amplifier. To dimmer the light intensity, it is to reduce the voltage level of the power supply. In summary, the lighting material energy band gap structure will determine the frequency of the oscillation in the RF resonator. The dielectric material in the RF resonator and the frequency of the oscillation determines the size the RF resonator. The frequency of the oscillation determines the switch frequency of the input-switching signal of the power amplifier. To control the light intensity, use the voltage level of the power supply. To get the most efficiency, use the pulse width of the switching signal.

To control the switch of the power amplifier, as shown in FIG. 31A, there is the maximum peak detector and the minimum detector to detect the output RF power of the power amplifier. If the amplitude is less than the full range, increase the pulse of modulation. To detect the RF power is full range or not, it is to compare the upper half of the amplitude and the lower half of the amplitude. If the upper half of the amplitude is larger than the lower half of the amplitude, the lower half of the amplitude is truncated with the kink voltage $V_{KN}$. It is to reduce the pulse width. If the upper half of the amplitude is less than the lower half of the amplitude, the amplitude is less than the full span. It is to increase the pulse width. If the minimum peak voltage is larger than the kink voltage, it is not full span and increases the pulse width directly.

Figure 32A:
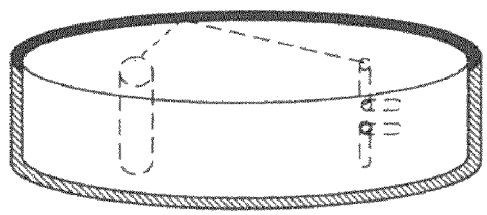
Figure 32B:
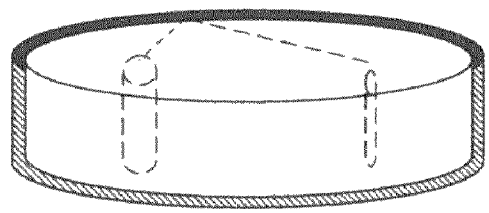
Figure 32C:
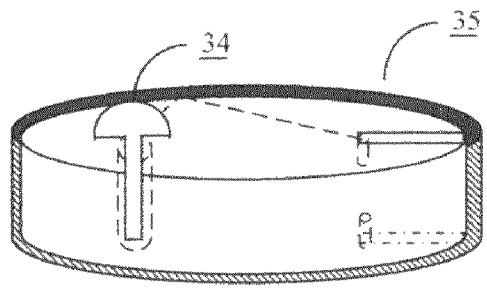
Figure 32D:
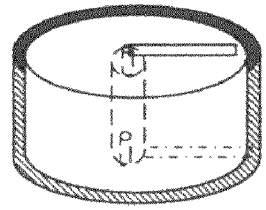
Figure 32E:
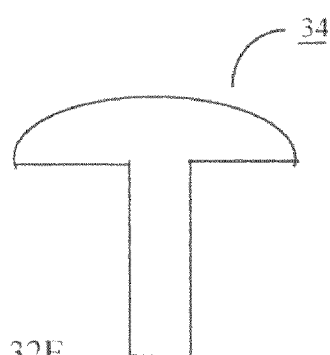
Figure 32F:
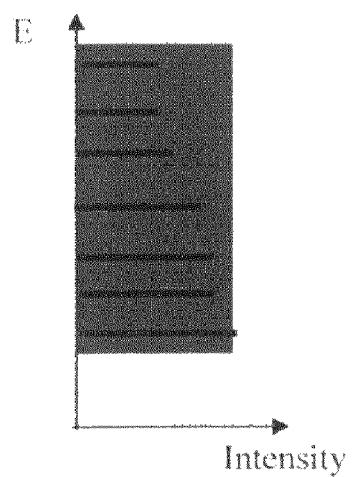

There are multi-wavelength and multi-frequency of the oscillation. To reduce the ripple of the power supply, it can increase the clock frequency to reduce the Vsup ripple. FIG. 32 shows the different design of the RF resonator. To reduce the size of the RF resonator, the resonator uses the high dielectric material to fill in the cavity. There is coating of RF reflective material on the surface or using the cassette cavity to reflect the RF wave to confine the RF wave in the cavity to save the RF energy. The cavity is in the elliptic shape that wave emitting from the antenna at the source focus point to the plasma light bulb at the sink focus point of the elliptical resonant cavity. This is two-way resonant. The RF energy is sent from the power amplifier to cavity. The RF energy in the resonant cavity also reflects from the cavity to the power amplifier. Therefore, the Q of the two-way resonance is much higher and the efficiency to convert the RF energy to be the molecular/atom energy band is much higher. Therefore, the light efficiency is much higher. The antenna can be dipole antenna as shown in FIG. 32A. In FIG. 32B, it shows the single pole antenna. In FIG. 32C, it shows the di-pad antenna. In FIG. 32D, it shows the di-pad antenna in the concentric resonant cavity. FIG. 32E shows the bulb of the plasma light. It has the enlarged end to have the radiated plasma to stay outside the oscillation tube. The thin rod is inside the oscillatory cavity. The wave inside the oscillatory cavity is plane wave. With such kind alignment, the leakage of the RF energy from the resonant cavity is minimized. FIG. 32F shows the energy band structure of the plasma light bulb. There are three components in the plasma light bulb, the gas, liquid mercury and halide salts. The RF energy ionizes the gas molecules create gas plasma. The gas plasma vaporizes the mercury and halide salts. The mercury generates the distinguished energy bands. The halide salts smashes the distinguished energy bands to be the continuous spectrum of the white light.

As shown FIG. 2E, FIG. 2F and FIG. 33, the PMU charges the multiple batteries for the electric vehicle (EV). Any battery being short and thermal runaway will cause the disaster of explosion. For the safety purpose, we need to monitor all the cells. FIG. 33A shows one design for the battery safety. The clock generator continues increasing the counter to be the address to be scan. The decoder decodes the address 41 to select the switch in the 1:n multiplex 43 to turn on. The current $I_{an}$ injects into the bipolar device 38 to measure the temperature in the individual battery. If the temperature is too high and trigger the detect and alarm signal, the detect signal stop the clock and the alarm signal 42 changes the switch to light LED 39 with the 1:2 multiplex 45 to indicate the fault battery.

Figure 33B:
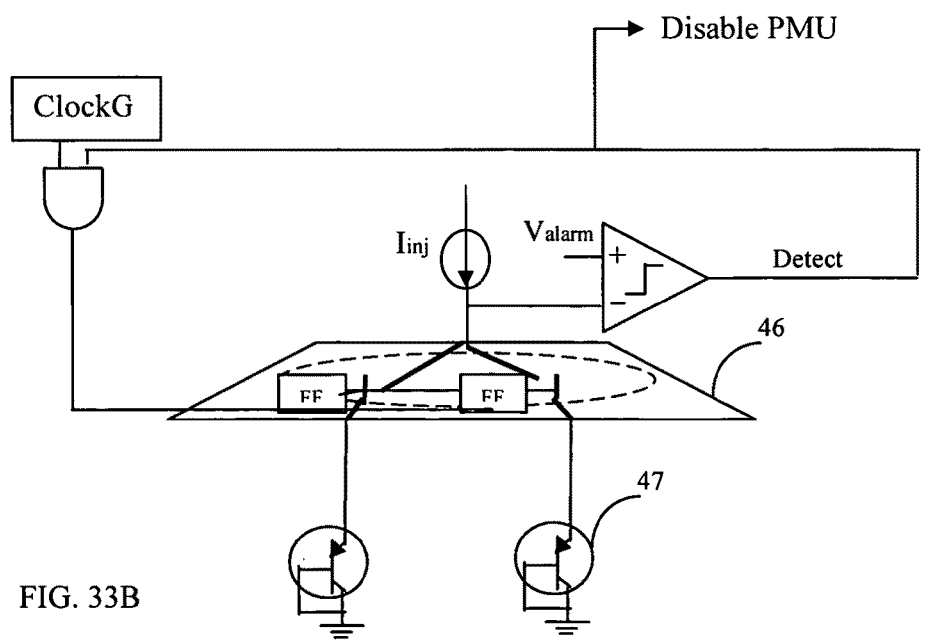

A green energy means comprises a temperature sensitive LED 47, As the current flowing said temperature sensitive LED 47, the voltage crossing the temperature sensitive LED 47 is varied. As shown in FIG. 33B, it is the simplified design. The thermal detect and LED shared the same device. There is the one-hot cycling ring type FIFO 46. Only one signal is in 1 state in the ring type FIFO chain and the rest is 0 state. The current $I_{an}$ inject the bipolar thermal LED. The bipolar thermal LED 47 has the dual function of light and temperature detection. If the temperature is larger than the specified safety margin, the detect signal is triggered and stop the clock of the one-hot cycling FIFO chain 46 and stop the charging operation of PMU. The bipolar thermal LED 47 has the steady light to indicate the fault battery.

As shown in FIG. 1, the projective TV and lasercom is the lighting processing technology consuming a lot of power. The lighting processing technology needs the green design. First, to toggle the light micro-mirror is the high voltage operation. The charging and discharging of the light micro-mirror consumes a lot of power. As shown in FIG. 34, a green energy means comprises a light micro-mirror 55 and electric pole. The light micro-mirror is doped with electric charge in isolated region 52 to keep storage of the electric charges. As the electric pole 53 is driven with electricity, the light micro-mirror is rotated to change angle. To reduce the voltage swing, as shown in FIG. 34A, the charges are doped in the isolation layers 52. As shown in FIG. 34C, as the charge is programmed on the poles 53 of the bottom plate, the light micro-mirror will rotate to reflect the light in the different directions. Changing the polarity of the charge, the light micro-mirror 55 will rotate in the other direction. FIG. 34B shows the alternative design of the light micro-mirror. Both the isolation layers are doped with the same electricity. As shown in FIG. 34D, injecting these two poles 53 with different polarity of charges to rotate the light micro-mirror. As shown in FIG. 34E and FIG. 34F, for the bonding wafer technology, the light micro-mirrors can be doped with the electricity in the isolation layer first. The mask 51 will protect the other portion which is not needed to be doped. For the micro-mirror as shown in FIG. 34D, the mask is not needed at all. Then the light micro-mirror wafer 55 is bonded with the circuit wafer 54. As shown in FIG. 35A, it is the top view of one light micro-mirror element 55*t* of the projective TV. As shown in FIG. 35B, it is the light micro-mirror 55*t* array for the digital light processing of projective TV. As shown in FIG., the switch inductor technology as shown in FIG. 10 and FIG. 11 can be applied to the digital light processing of projective TV to save the power a lot. There are two ways to implement the switch inductor. The first type is to use the extra capacitor as the store capacitor. The second type is to use the light micro-mirror capacitors as the two capacitors to be the recycling energy capacitors.

As shown in FIG. 1 and FIG. 36, it is the green design for the LaserTV with the light micro-mirror. The modulated laser light shines on the vertical scanning mirror 55*v* first. Then the horizontal scanning light micro-mirror 55*h* array sweeps in the horizontal direction. As the light is projected on the screen, it is the projective TV.

As shown in FIG. 1 and FIG. 37, it is the LaserCom with the adaptive light micro-mirrors technology. The air turbulence causes the defocus dynamically. It induces the blinking in the light transmission. To overcomes the defocus and light fluctuation in light path, the electrical programmable concave micro-mirror 56 and auto light gain control are developed.

Figure 37C:
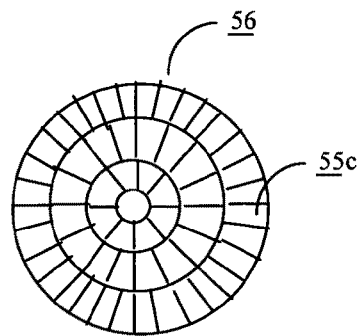
Figure 37D:
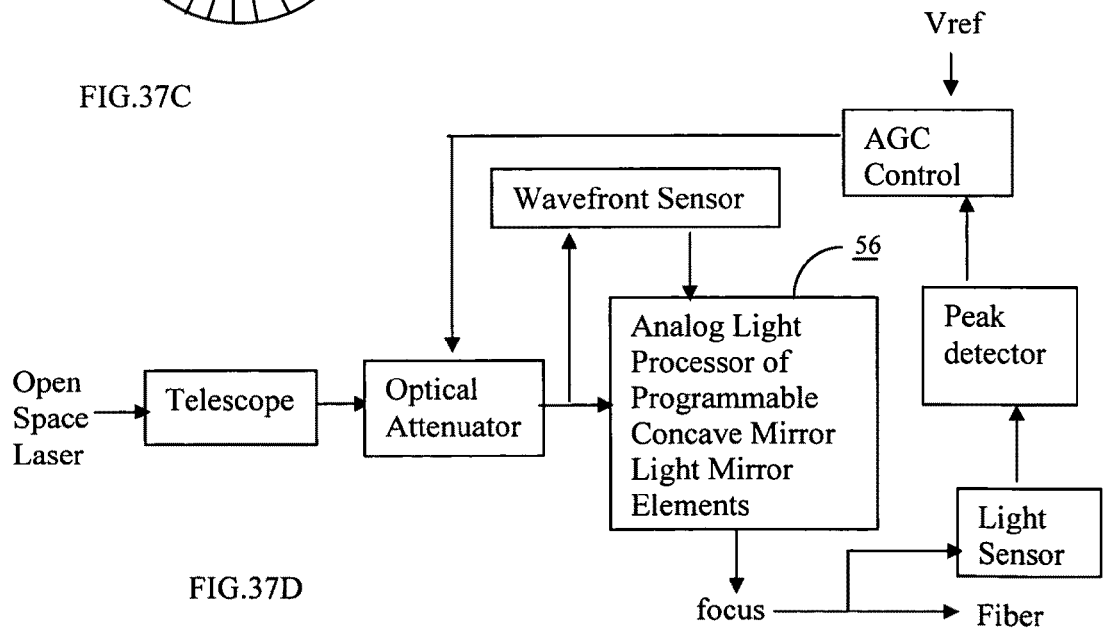

As shown in FIG. 37A, the concave light focus the parallel laser light on the photo sensor locating at the focus point. Making the extension of the reflective light, the inclined tiny light micro-mirror 55*c* at the plan also can reflect the parallel light to the focus point. This is the principle of the light micro-mirror can serve as the programmable concave mirror 56. As shown in FIG. 37C, it is the top view of the circular programmable concave mirror 56. The micro-mirror can tilt to reflect the light on the focus point. FIG. 37D shows the block diagram of the LaserCom. The laser light passes through the telescope lens and the optical attenuator to shine on the Analog Light Processor of Programmable Concave Mirror Light micro-Mirrors. The analog light processor 56 adjusts the light micro-mirror angle according to the wave front detector information to reflect the laser light on the focus. Using the splitter, portion of the light shines on the photo-sensor at the focus point. The photo sensor converts the light intensity to the voltage waveform. The peak detector detects the peak value of the light intensity then send it to the automatic gain control AGC circuit. The automatic gain control AGC set the taps of the Optical Attenuator to change the attenuating factor to keep the light intensity to be constant.

Figure 38B:
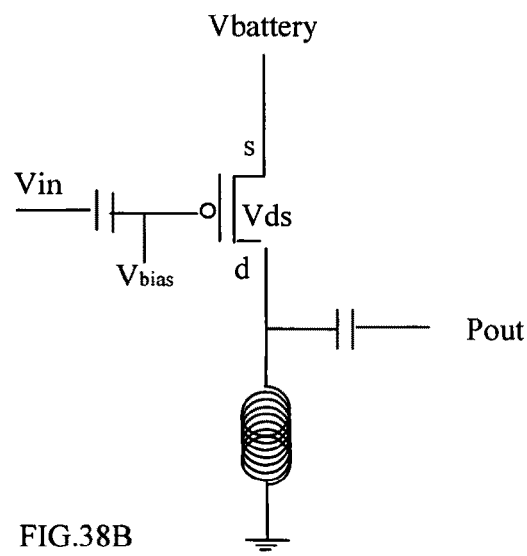

As shown in FIG. 31A and FIG. 38A, the power management unit PMU output driver and the power amplifier PA are drawn together. There are two inductors. There is the power loss in the power management unit PMU and there is power loss in the power amplifier PA, too. To save the energy, instead of two stages of power loss, we merge these to stages to be one stage of the power management amplifier PMA. As shown in FIG. 38B, the PMU output buffer is merged with PA to be the power-managing amplifier PMA. Now, a breakthrough new power amplifier PMA is invented. Even the PMA is derived from the PMU and PA, it has the completely different characteristics from the PMU and PA. The superior power amplifier PMA has power efficiency more than 95% as the PMU does. However, it behaves like the amplifier, not PMU.

For the high voltage operation of PMA, as shown in FIG. 39, the high voltage circuit of PMU technologies can be applied to PMA directly. The circuit can be divided to be two portions, the high voltage HV and the low voltage LV. The modulation signal circuit can be raised up to operate in the high voltage zone. To recycle the energy, there is a middle power VG which serves as the ground of the high voltage HV zone and the power supply $V_{DD}$ of the low voltage LV zone.

How can the PMA has the power efficiency more than 90% and the conventional PA has only the power efficiency less than 30%? Why just changing the NMOS to be PMOS makes so much difference? It is due to the previous PA analytical methodology is not correct that the key points cannot found. We develop new analytical methodology that we easily find out the key issues and make the technology breakthrough in power amplifier technology. As all the other PA designers still struggle for 30% power efficiency and argue how much back off from the saturation point, we make the breakthrough in the power amplifier technology. The PMA has the theoretical power efficiency to be 100%. The PMA power efficiency is even higher than the PMU.

It is well known that the A type power amplifier PA-A has the power efficiency can be 50%; the B type power amplifier PA-B has the power efficiency can be 78%. However, in the real power amplifier chip, the highest power efficiency is never more than 39%. There is a lot of deviation between the theoretical value 78% and the real power efficiency measurement 39%. Nobody bring up the questions why there is a lot of deviation between the theoretical result and the measurement result. Nobody skeptical the theory and analytical methodology are completely wrong. All the RF design research follows the same wrong track and is trapped in the same trap. We have the multi-disciplinary of both PMU and PA. To our intuition, there is no reason for the PMU can have the 96% efficiency and the PA has the 30% efficiency. It must have something wrong. We apply the PMU technology to the PA technology and invent new analytical methodology. Then from the new analytical methodology, it shows the conventional PA should have the efficiency no more than 33%. It is consistent with all the PA data. It proves that the new analytical methodology is correct. Furthermore, the new analytical methodology proves that the new PMA has the same or even better power efficiency than PMU does. The power efficiency of power managing amplifier PMA is 100%.

The analytical methodology is shown as FIG. 40. As shown in FIG. 19A, it is the output voltage $V_{out}$ of the conventional PA. It is the essential characteristic and generic curve of conventional PA to have the inductor connecting the $V_{DD}$. The power delivery is the sinusoidal curve. There are DC energy at $V_{DD}$ level. Therefore, the maximum efficiency for the $V_{out}$ curve is $$\text{Maximum output Efficiency } \eta\_\text{max} = \frac{\text{(Sinusoidal Energy)}}{\text{(Sinusoidal Energy + DC energy)}} = \frac{\left(\frac{1}{2}\right)}{\left[\left(\frac{1}{2}\right)+1\right]} = \frac{1}{3}$$

Figure 40B:
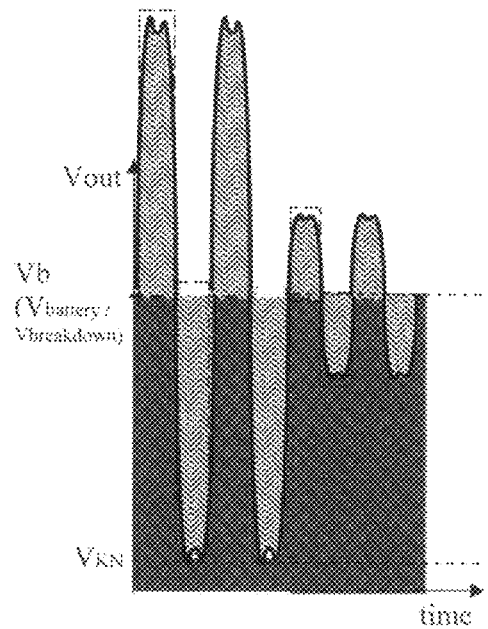

FIG. 40B is the output waveform of the F type PA. To increase the efficiency, the $1^{st}$ and $3^{rd}$ order waveform shaping to make the output waveform more close to the rectangle waveform. For the limit of the F-type PA in the rectangle waveform, the output efficiency is $$\text{Maximum output Efficiency } \eta\_\text{max} = \frac{\text{(Rectangle Energy)}}{\text{(Rectangle Energy + DC energy)}} = \frac{1}{[1+1]} = \frac{1}{2}$$

Figure 40C:
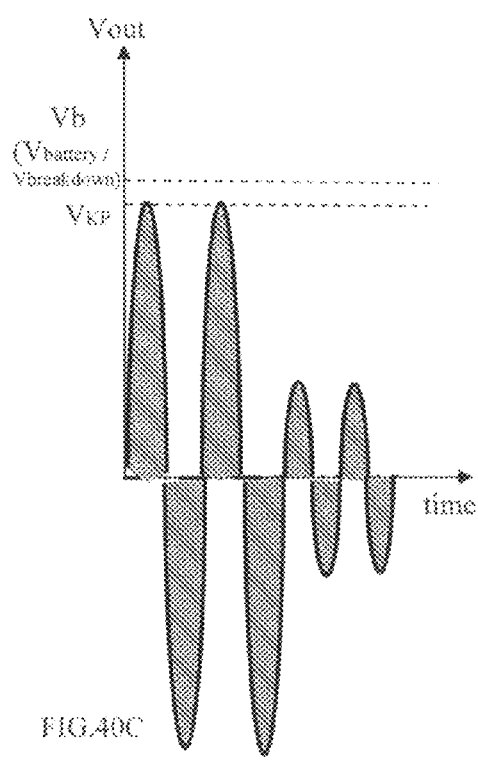

FIG. 40C is the essential characteristic and generic curve of conventional PMA to have the inductor connecting the ground as shown in FIG. 38B. The efficiency for any Vout curve is Output Power Efficiency $\eta$ =(Sinusoidal Energy)/(Sinusoidal Energy)=100%

Figure 40D:
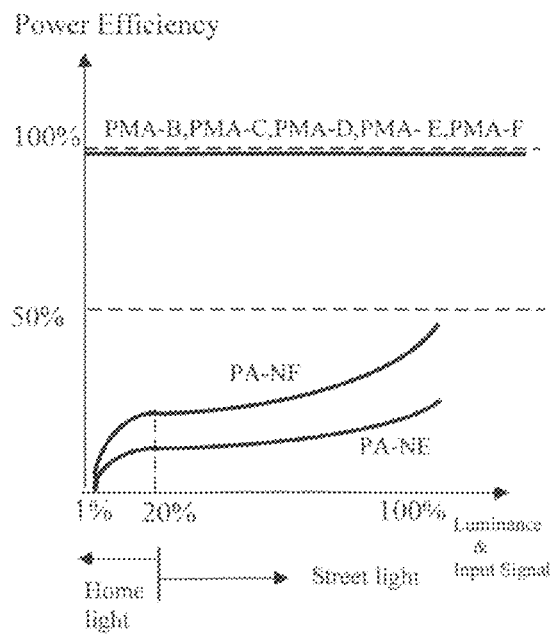

As shown in FIG. 40D, assuming the input bias has no DC energy loss, it is the comparison of the efficiency between the PA and PMA. The PMA has the output power efficiency to be 100%; the PA has the output power efficiency to be from 30% to 50%. Therefore, the power amplifier problem is the circuit configuration problem. All the power amplifier design has used the wrong circuit configuration that they have to struggle with the power efficiency problem. The problem originally came from the RF circuit design doesn't know how to design the circuit in the high voltage zone. If they use the N device connected to the ground, they can walk around the circuit problem in the high voltage zone. The new comer in the RF field just follows the old design way. Nobody dares to challenge the old PA design. However, the power efficiency is the nightmare problem for the PA.

FIG. 41 is the generic circuit and characteristic curves of the PMA. FIG. 41A is the circuit of the PMA. As shown in FIG. 41C, the output efficiency is 100%. However, from the Vout picture doesn't know how the DC waste is. Since L(dl/dt)=0, the DC waste may hide in the picture. Therefore, we need visit the Vin curve to make sure we have no DC component current. FIG. 41B is the input waveform Vin.

$$Vin = V_{DC} + A\sin(\omega t)$$

$V_{DC}$ is biasing voltage counted from $V_{TP}$, where $V_{TP}$ is the threshold voltage of the P type device. As Vin is below $V_{TP}$, the device is cut-off. As Vin is above $V_{TP}$, the device is turned on. As shown in FIG. 41B, the A type PMA-A has the $V_{DC}$ component. There is the power waste. To reduce the power waste, the A type PMA-A needs to have the adaptive bias according to the signal amplitude.

To have the 100% efficiency, the $V_{DC}$ has to be zero. It is B type PMA-B. To keep the fidelity of signal, we use the differential B type PMA-B, the Vin becomes $V_{in+}$ and $V_{in-}$ to have the B+ and B− signals. So, for the correct PA analysis, we need to check both Vin waveform and Vout waveform. For Vin waveform of B type PMA-B, we check the $V_{DC}$=0. There is no DC loss. For the Vout waveform of B type PMA-B, the waveform is 100% efficiency. Therefore, the power efficiency is 100%.

The same analytical methodology is applied to the FIG. 20A of the A-type power amplifier PA-A. From the output waveform, the maximum efficiency is less than 33%. It doesn't matter the PA is A,B,C, etc type. It comes from the generic architecture of the inductor being connected to VDD. For the A-type PA-A, there is the loss of the biasing voltage $V_{DC}$. The $V_{DC}$ power loss is a lot. As the $V_{DC}$ loss makes the deduction from the power efficiency 33%, the net power efficiency is only 10%. The 10% PA efficiency is coming from the field data of the base station. It causes the base station cannot put the PA on the antenna and it needs a lot of cooling facility and power facility. Considering all the added on overhead factors, the total PA power efficiency becomes only 3%. With our green design of PMA, the PMA has the net efficiency more than 90%. The PMA can be installed on the antenna directly. It gets rid of the transmission line loss, the power consumption of cooling facility and power facility. It will save one nuclear power plant for the Germany and several nuclear power plants for US. Therefore, it can see how important the power-managing amplifier PMA is.

The PA and PMA have the conjugated $V_{DD}$-Gnd symmetrical waveform. The PMA has output efficiency to be 100% and PA has output efficiency to be less than 33% and 50%. As shown in FIG. 42, the detailed analysis shows the PA is switch-cap DC energy dissipation and PMA is switch-cap DC energy recycling. It is proved that the analysis of the output power efficiency is valid and the output power efficiency is a good index for the power efficiency of the architecture design of the power amplifier. Here we use the approximation to show the key issues.

As shown in FIG. 42A1, the N type switch is off. L(di/dt)=0 and $V_0=V_{DD}$. The capacitors are charged to store the DC energy in the still LC tank. As shown in FIG. 42A2, the N switch is turned on, the large N device has small resistance that it drains the charges and stored energy in the still LC tank immediately. As shown in FIG. 42A3, the inductor current starts to drain to store the energy in the inductor. As shown in FIG. 42A4, the N switch is turned off and the inductor current is converted to the charge stored in the LC tank. The dissipated energy lost is in FIG. 42A2 is never recovered.

However, as shown in FIG. 42B1, the P type switch is off. L(di/dt)=0 and Vo=Gnd. The energy stored in the LC tank is zero. As shown in FIG. 42B2, the P switch is turned. The resistance of P switch is small that RC time is small. It charges up the capacitor and Vo=$V_{DD}$ immediately. As shown in FIG. 42B3, as Vo is held at voltage VDD, the inductor current starts to build up to store the energy in the LC tank. As shown in FIG. 42B4, the switch is turned off and the stored charge in the capacitor is discharged to be the inductor current. The stored energy is recycled to be the LC tank energy. The stored DC energy in capacitor is not wasted at all.

Therefore, the PA is switch-cap DC-energy dissipation and the PMA is switch-cap DC-energy recycled. That is the reason why PMA has output 100% and PA has output efficiency only 33% or 50%. The output efficiency is a good index for the power efficiency of the power amplifier architecture. The PMA power amplifier has the very important applications in cellular phone and plasma light.

The conventional light bulb has only 10% power efficiency to convert the electricity to light. So far, the plasma has power efficiency to be 70%. The plasma can be dimmed to be 1% light intensity. However, due to the power efficiency is low at low light intensity, the plasma cannot be used as the home light as shown in FIG. 40D. The low efficiency of plasma light at low light intensity is due to the power amplifier. Therefore, to use the high power efficiency to enhance the plasma light efficiency is the most important green design.

Figure 43B:
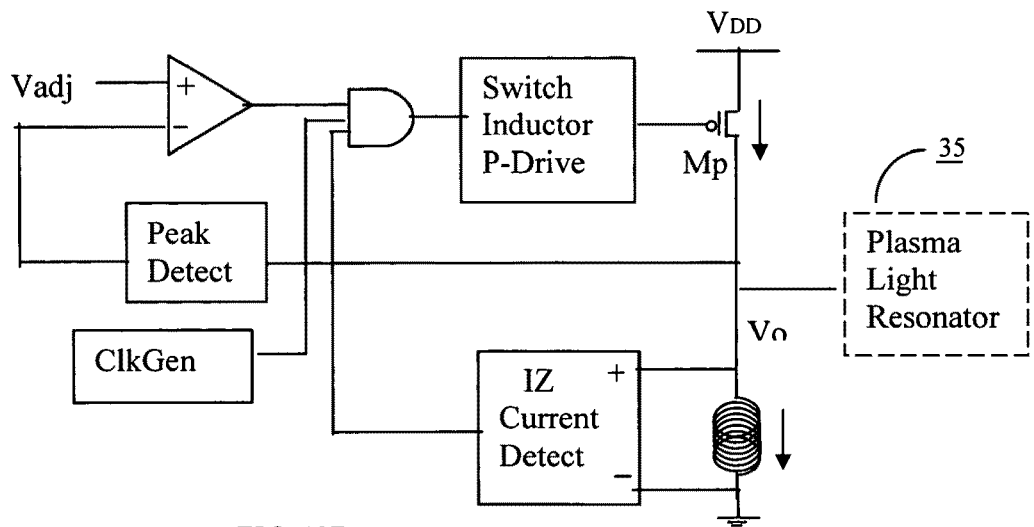
Figure 43C:
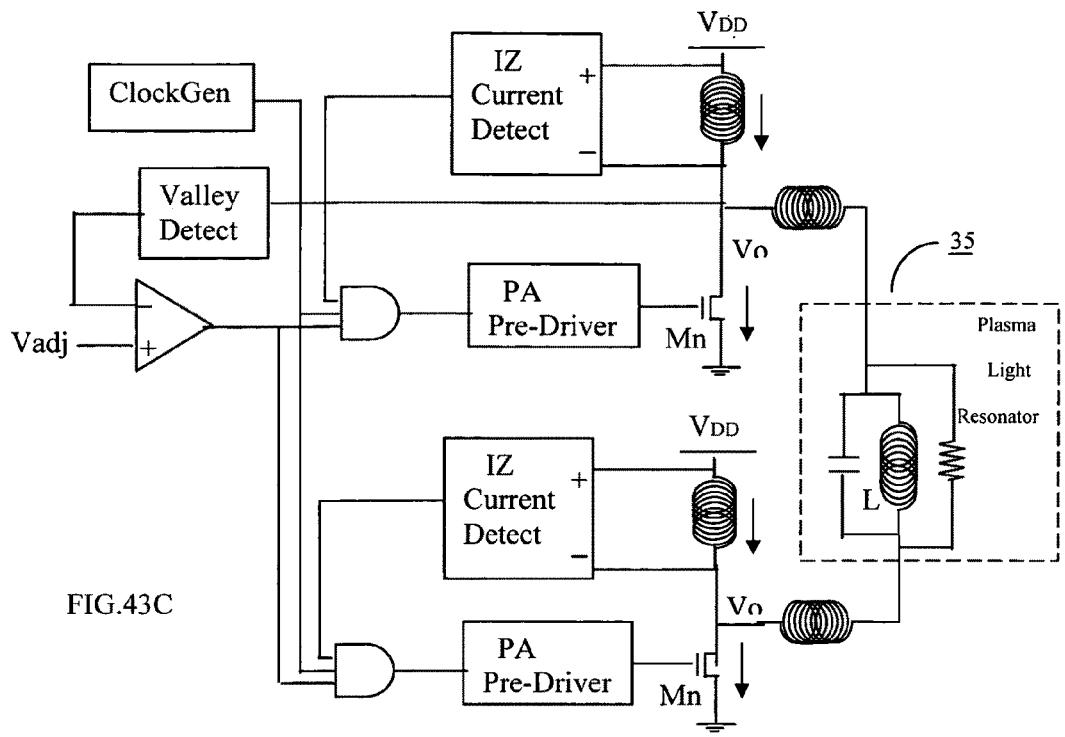
Figure 43D:
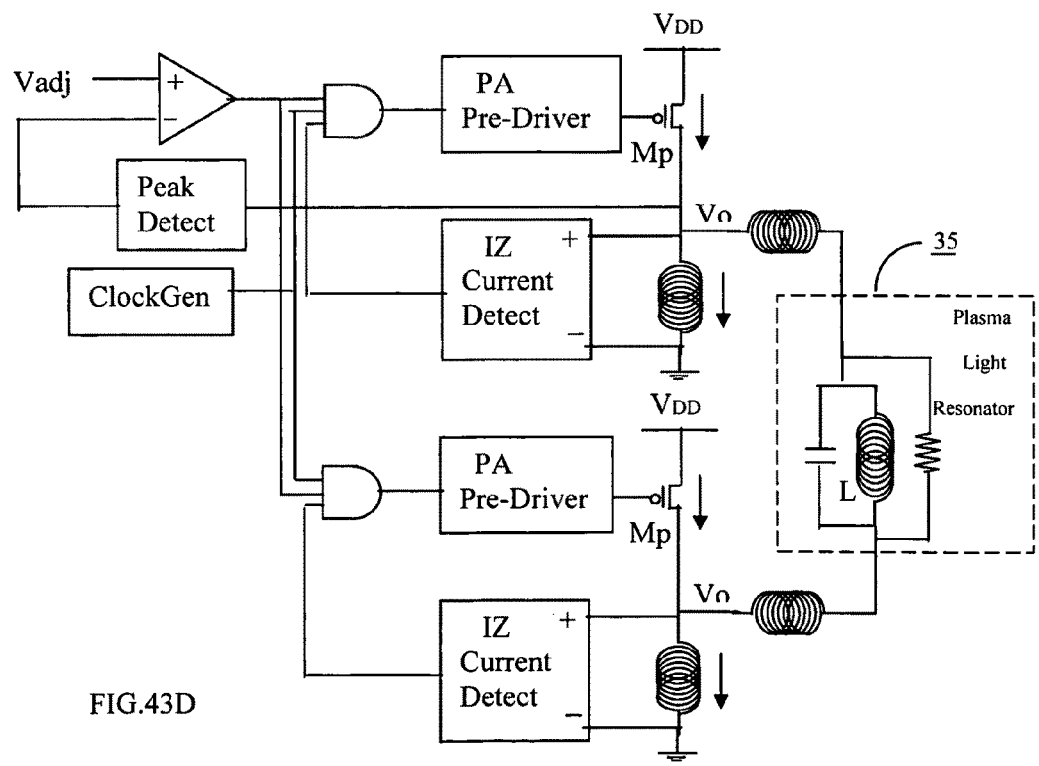

As shown in FIG. 43A, it is the PA type optimum adaptive power amplifier system. The valley detector detects the valley voltage of the Vo or the plasma resonator amplitude. The valley value is compared with the adjusted reference voltage $V_{adj}$ for dimmer. If the valley voltage is larger than the $V_{adj}$, the power amplifier starts to pump the RF energy to the plasma light resonator. As shown in FIG. 43B, it is the PMA type optimum adaptive power amplifier system. The peak detector detects the peak voltage of the Vo or the plasma resonator amplitude. The peak value is compared with the adjusted reference voltage $V_{adj}$ for dimmer. If the peak voltage is smaller than the $V_{adj}$, the power amplifier starts to pump the RF energy to the plasma light resonator. The IZ current detector is to detect the current flow in the inductor to determine the timing to charge the energy into the LC tank synchronously. As the inductor current is in the same flowing direction as switching current, it is time to open the switch. The light resonator has the specific dimension to have the specific wavelength that the power amplifier has the specific switch frequency. The specific switch frequency is set as the clock generator ClkGen. The driver can be the switch inductor drive or the power amplifier pre-drive. As shown in FIG. 43C, it is the differential push-pull PA type optimum adaptive power amplifier system. As shown in FIG. 43D, it is the differential push-pull PMA type optimum adaptive power amplifier system. There are the push-pull recycling mechanisms that (1) the push-pull has the stronger light conversion for the RF energy; and (2) the recycling mechanism has more power efficiency for the power amplifier. Therefore, the differential push-pull PMA type optimum adaptive power amplifier system has the best power efficiency and light efficiency. The differential push-pull PMA type optimum adaptive power amplifier will have the global efficiency of 95%. We can use the plasma light to be the home plasma light to replace the light bulb. Comparing with the convention light bulb has only 10%, the PMA is the most important revolution in the green industry.

Figure 44B:
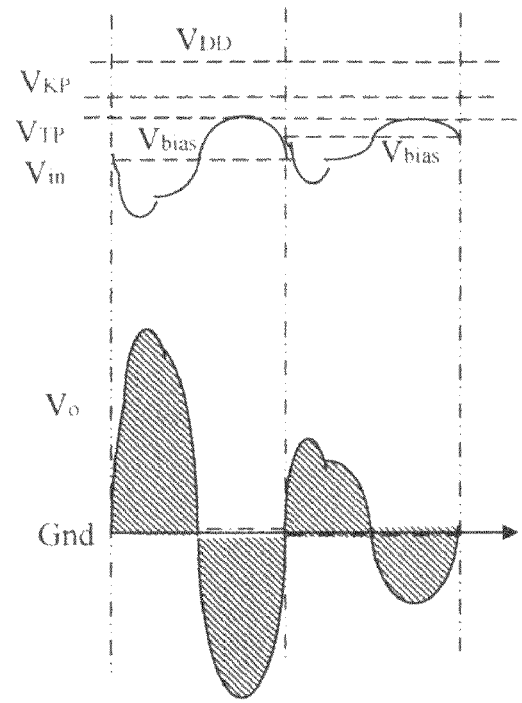
Figure 44C:
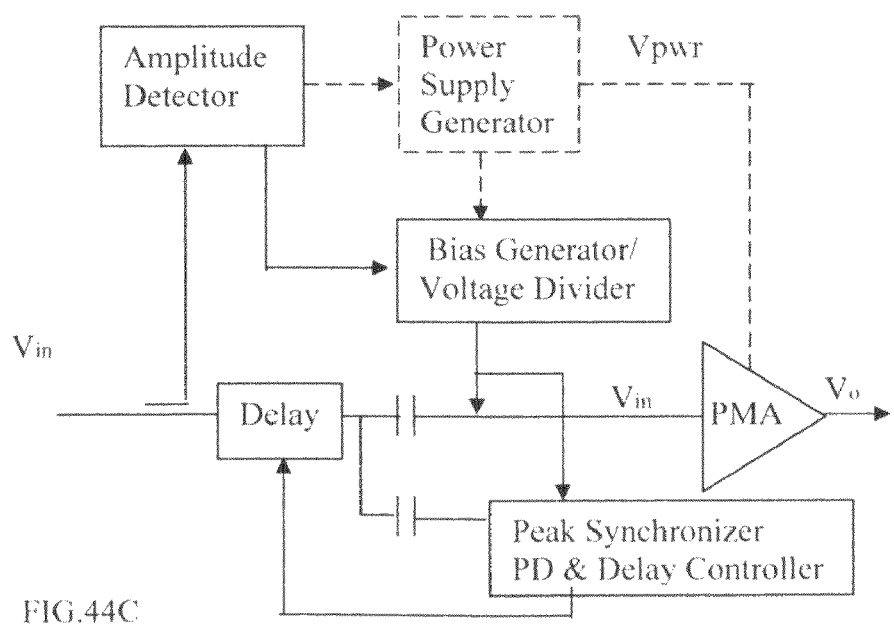

FIG. 44 is the A-type power-managing amplifier PMA. As shown in FIG. 44A, as the biasing voltage is constant, there is more DC power loss. As shown in FIG. 44B, the adaptive biasing voltage is shifted according to the amplitude of the envelope. It can reduce the DC power dissipation to increase the efficiency. As shown in FIG. 44C, the amplitude detector detects the amplitude of the input signal and makes the adaptive adjustment of the biasing voltage. However, for the power efficiency, there is no need for the scaling power for the power-managing amplifier PMA anymore unless for the crest factor for the high PAR.

Figure 45B:
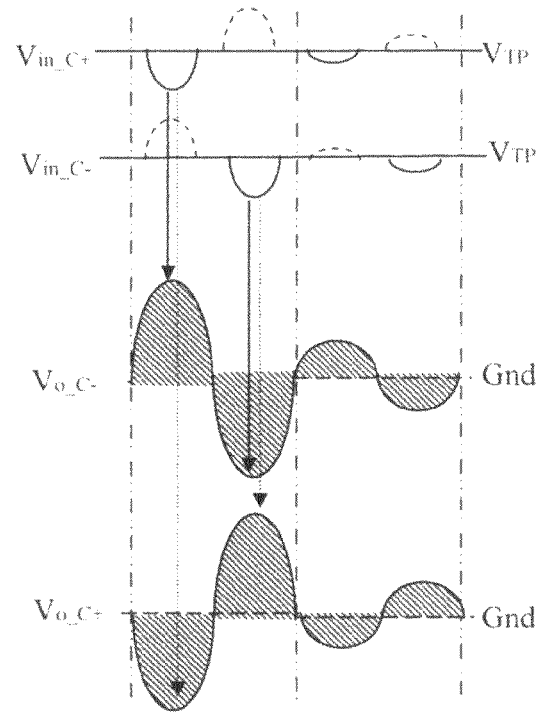
Figure 45C:
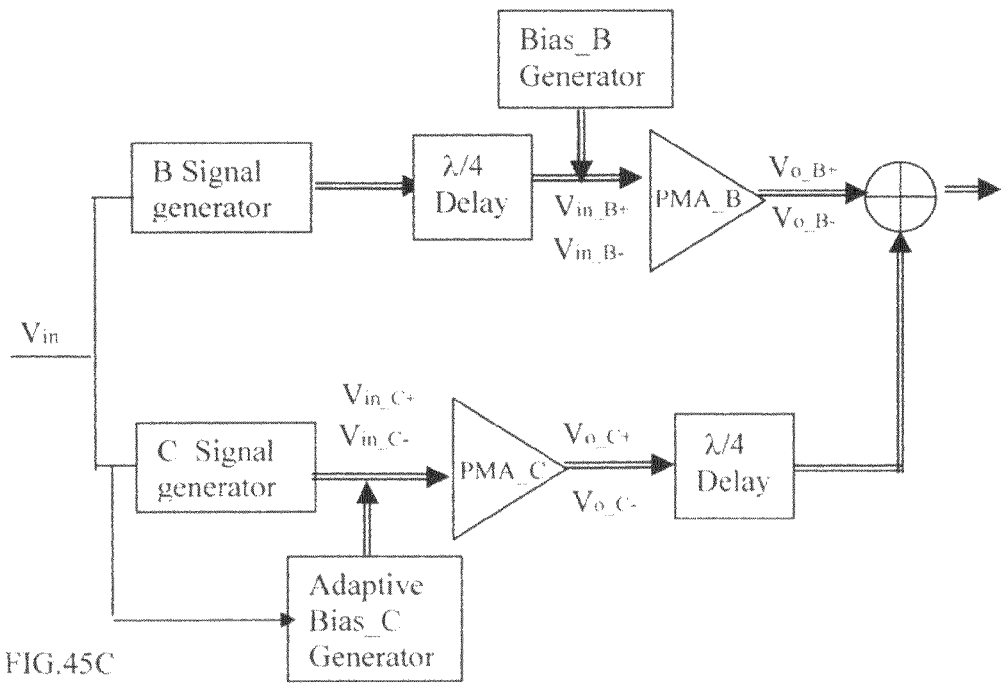

FIG. 45 shows the B-type differential PMA, C-type differential PMA and the differential Doherty PMA made of the B-type differential PMA and C-type differential PMA. As shown in FIG. 45A, it is the waveform of the B-type differential PMA. As shown in FIG. 45B, it is the waveform of the C-type differential PMA. FIG. 45C is the Doherty PMA made of the B-type differential PMA and C-type differential PMA.

Figures 46A, 46B:
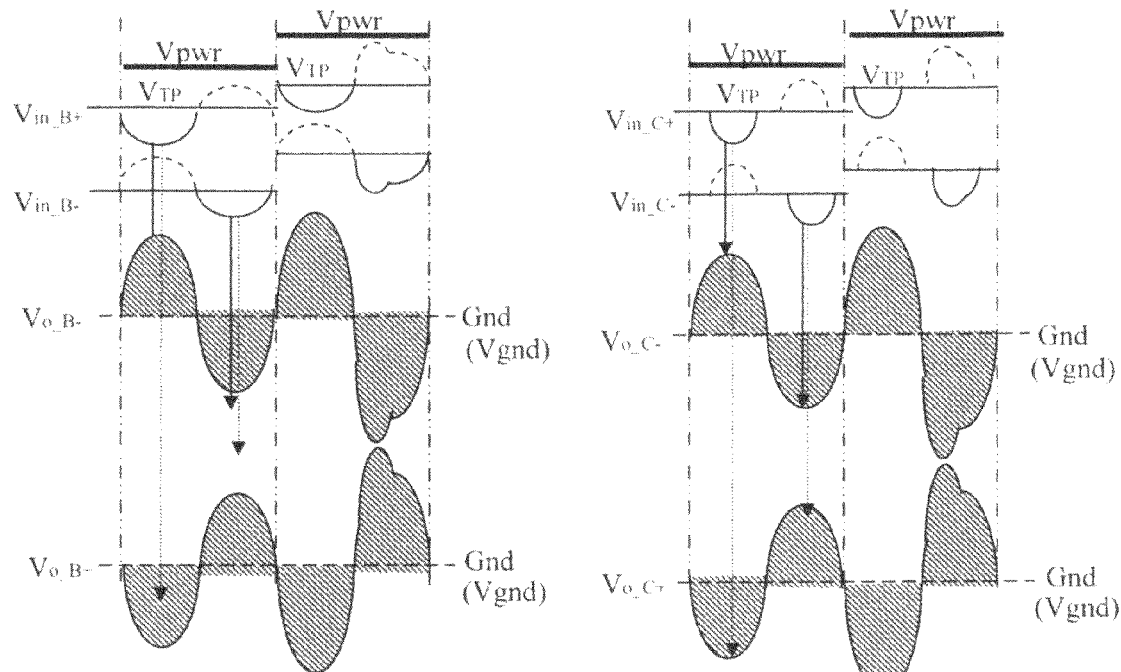
Figure 46C:
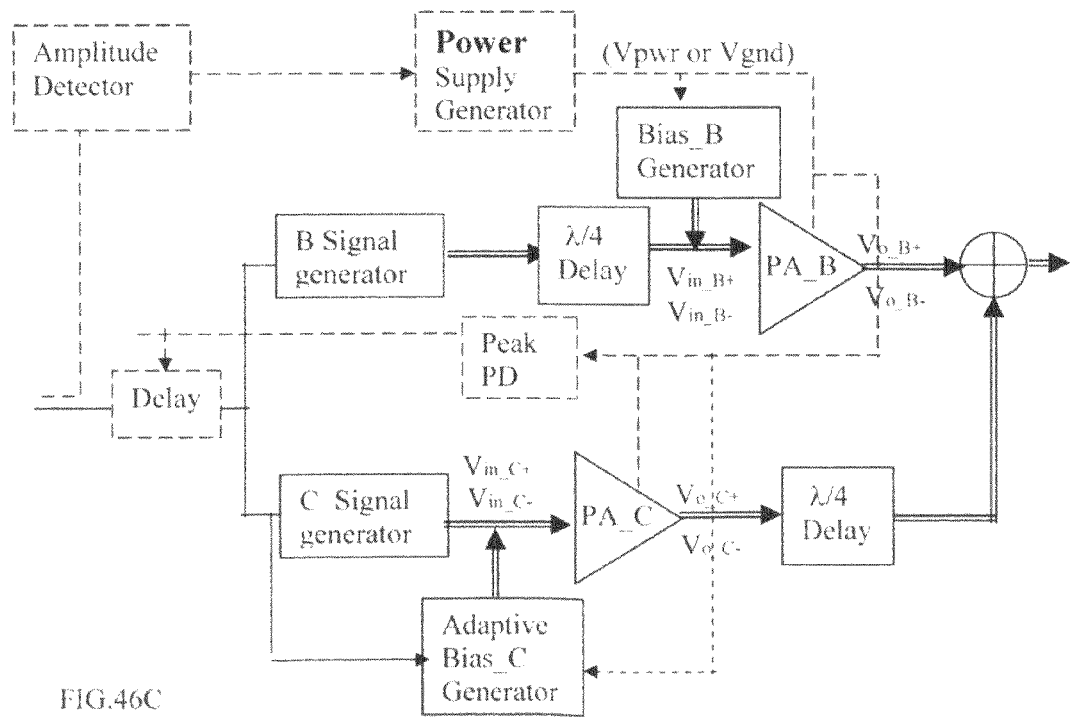

FIG. 46 shows the superiority of the differential Doherty PMA over the differential Doherty PA. FIG. 46A and FIG. 46B have the conjugate curves as FIG. 22A and FIG. 22B but have even better performance than FIG. 22A and FIG. 22B have. As shown in FIG. 46C, the differential Doherty PMA has much simpler circuit than the differential Doherty PA. The components in the dotted lines can be eliminated. As shown in FIG. 26A, FIG. 50A, FIG. 50C, FIG. 46A, FIG. 46B and FIG. 46C, there are multiple different power scaling technologies for the crest factor of the large PAR (Peak to Average Ratio). The $V_{DD}$ and $V_{TP}$ can be dynamically scaled together.

Figure 50B:
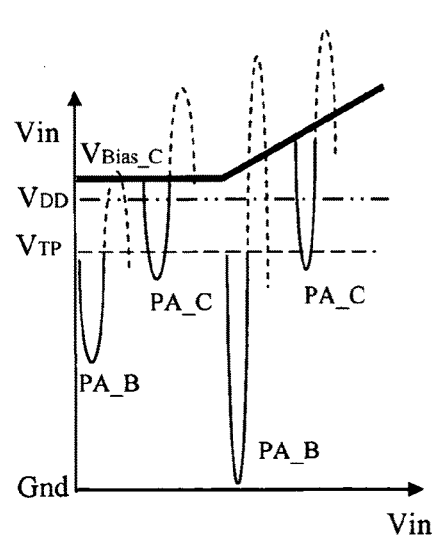
Figure 50C:
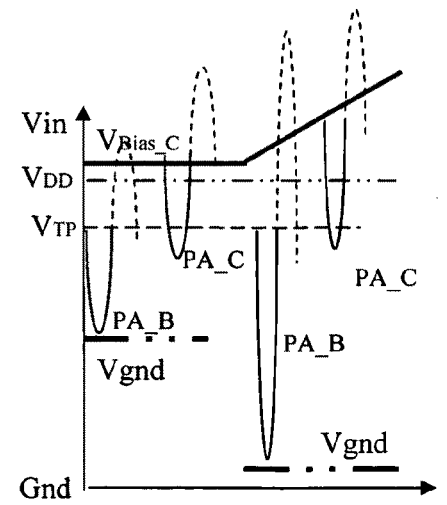

The differential PMA has the superior performance that the Doherty Power amplifier does not need the scaling power supply and adaptive bias techniques. As shown in FIG. 46, the differential B type and C-type power amplifier DPMA-B, DPMA-C to work as the high linearity Doherty Amplifier with adaptive bias technique for DPMA-C. The PMA is the conjugate of PA. So there is the conjugate PMU to be the ground supply generator GPMU to generate the $V_{gnd}$. It is NMOS N type discharging driver. However, as shown in FIG. 50C, the gain for the $V_{gnd}$ is marginal that it is not necessary to implement it.

As shown in FIG. 46A, the differential power-managing amplifier DPMA-B input $V_{in\_B+}$ and $V_{in\_B-}$ are biased at the threshold voltage level $V_{TP}$. The output voltage $V_{o\_B+}$ and $V_{o\_B-}$ oscillate with the ground Gnd or scaling ground supply level $V_{gnd}$ being the center line. As shown in FIG. 46B, the differential power amplifier DPMA-C input $V_{in\_B+}$ and $V_{in\_B-}$ are adaptively biased above the threshold voltage level $V_{TP}$. The output voltage $V_{o\_B+}$ and $V_{o\_B-}$ oscillate with the ground Gnd or the scaling ground supply level $V_{gnd}$ being the centerline. FIG. 46C is the schematics for the differential Doherty Power amplifier with the scaling power supply and adaptive bias for the crest factor of high PAR OFDM. The amplitude detector detects the amplitude of the input signal Vin and generates the amplitude of the Vin. The amplitude information is sent to the Power supply or the Ground Supply Generator GPMU to generate the scaling power of the ground supply $V_{gnd}$ for the power amplifier. The amplitude information is also sent to the Adaptive Bias_C Generator to generate the adaptive bias voltage $V_{BiasC}$ for the power amplifier DPMA-C. The single end signal Vin is converted to be the differential signal $V_{in\_B+}$ and $V_{in\_B-}$ with the B Signal Generator. The single end signal Vin is converted to be the differential signal $V_{in\_C+}$ and $V_{in\_C-}$ with the C Signal Generator.

The differential power amplifiers DPMA-B and DPMA-C generates the differential RF outputs and merge them together.

The differential power amplifier DPMA is as shown in FIG. 47. With the different bias conditions, the differential power amplifier DPMA can operates as A type DPMA-A, B type DPMA-B and C type DPMA-C. The input is a pair of P devices. $V_{in+}$ and $V_{in-}$ are the inputs; $V_{o+}$ and $V_{o-}$ are the outputs. FIG. 47A is the complete set of the DPA which has the inductor load, cross-coupling PMOS, cross-coupling NMOS and the energy recycling LC tank. FIG. 47B is the DPMA which has the cross-coupling PMOS, cross-coupling NMOS and the energy recycling LC tank. The LC tank has the dual function of energy recycling and inductor load. FIG. 47C is the DPMA which has the inductor load, cross-coupling PMOS and the energy recycling LC tank. FIG. 47D is the DPMA which has the inductor load and the energy recycling LC tank. FIG. 47E is the DPMA which has the inductor load, cross-coupling PMOS and the energy coupling inductor.

The Bipolar differential power amplifier DPMA is shown in FIG. 48. With the different bias conditions, the differential power amplifier DPMA can operates as A type DPMA-A, B type DPMA-B and C type DPMA-C. The input is a pair of PNP device. Vin+ and Vin− are the inputs; Vo+ and Vo− are the outputs. FIG. 48A is the complete set of the DPMA which has the inductor load, cross-coupling PNP, cross-coupling NPN, the energy recycling LC tank. FIG. 48B is the DPMA which has the cross-coupling PNP, cross-coupling NPN and the energy recycling LC tank. The LC tank has the dual function of energy recycling and inductor load. FIG. 48C is the DPMA which has the inductor load, cross-coupling PNP and the energy recycling LC tank. FIG. 48D is the DPMA which has the inductor load, and the energy recycling LC tank. FIG. 48E is the DPMA which has the inductor load, cross-coupling PNP and the energy coupling inductor.

Figure 49B:
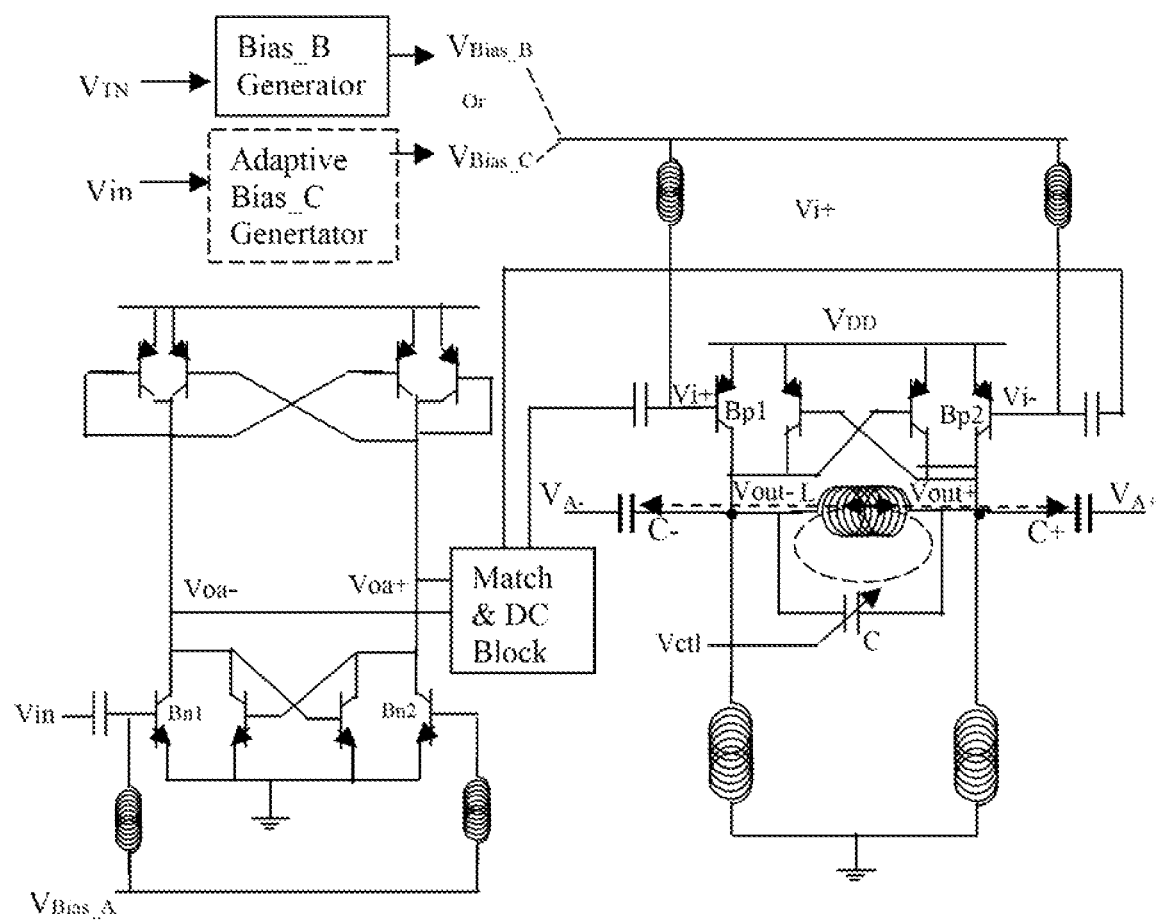

After the mixer, the signal is sent to the RF power amplifier. The output of the mixer is differential end. There is no need to have the single end to differential ends conversion. However, today most power amplifiers still are the single end that there is a need to convert the single end RF signal to the differential ends. To convert the single end differential signal to be the B-type and C-type differential signals, we need to use the special circuits. As shown by the S2D in FIG. 49A, the single end signal is convert to the differential end signals with the differential amplifier which is biased at the A-type biasing voltage Bias_A. The $2^{nd}$ stage is the differential power amplifier DPMA. FIG. 49B is the Bipolar version of the S2D and DPMA.

As shown in FIG. 45 and FIG. 46, the Doherty power amplifier uses a lot of scaling ground generator and bias generator. As shown in FIG. 50A, the Amplitude Detector, Bias_A Generator, Bias_B Generator, Bias_B Generator, Adaptive Bias_C and ground Supply Generator. As shown in FIG. 50B, it is the plan for the input Vi of the Differential Doherty power amplifier as shown in FIG. 45. As shown in FIG. 50C, it is the plan for the input Vi of the scaling power and adaptive bias voltage Differential Doherty power amplifier as shown in FIG. 46. However, the DPMA has almost 100% power efficiency and high linearity. The scaling ground generator and bias generator only have the marginal effect.

Figure 51B:
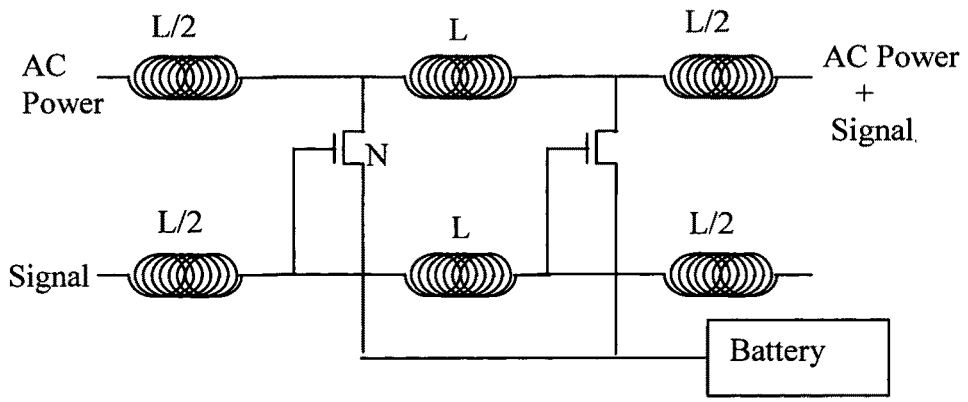
Figure 51C:
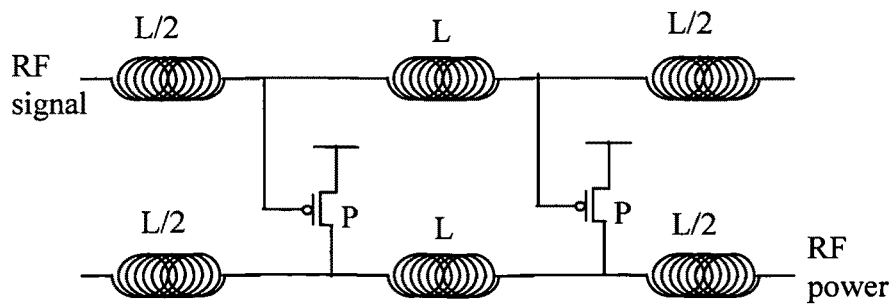
Figure 52B:
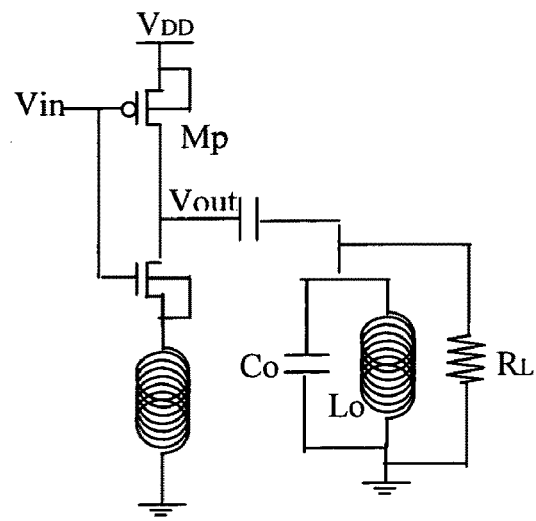
Figure 52C:
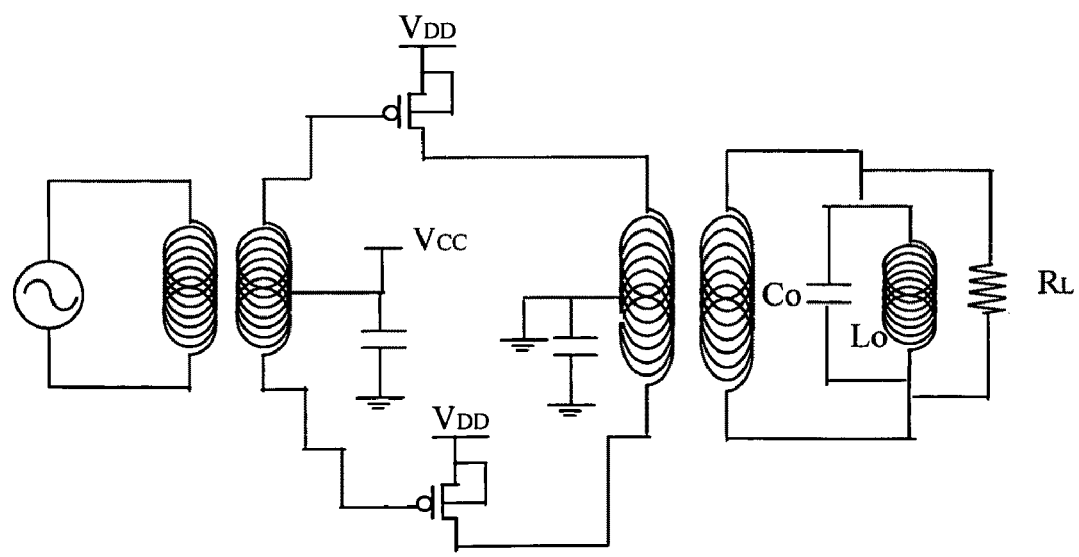
Figure 53B:
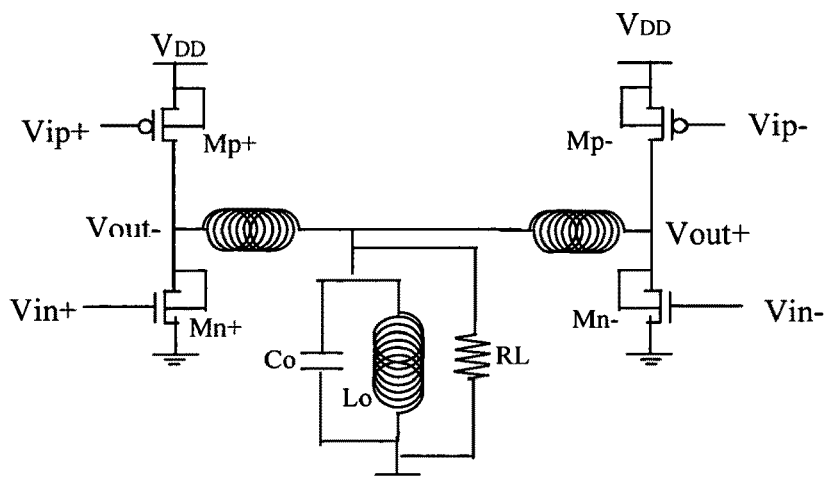
Figure 53C:
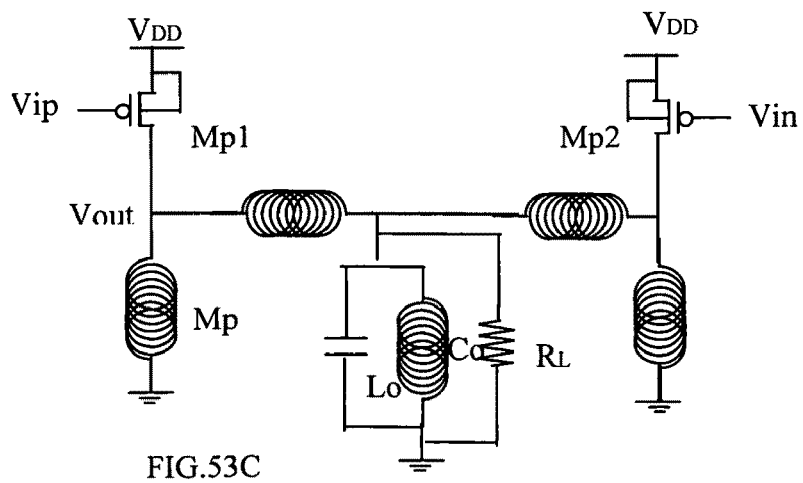
Figure 54B:
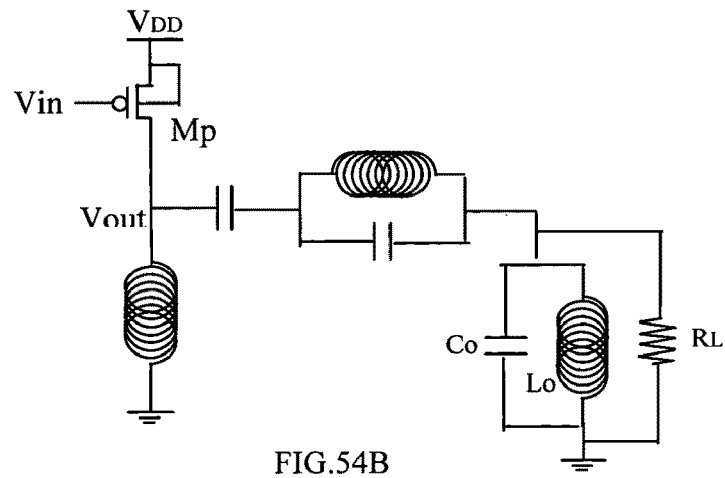
Figure 54C:
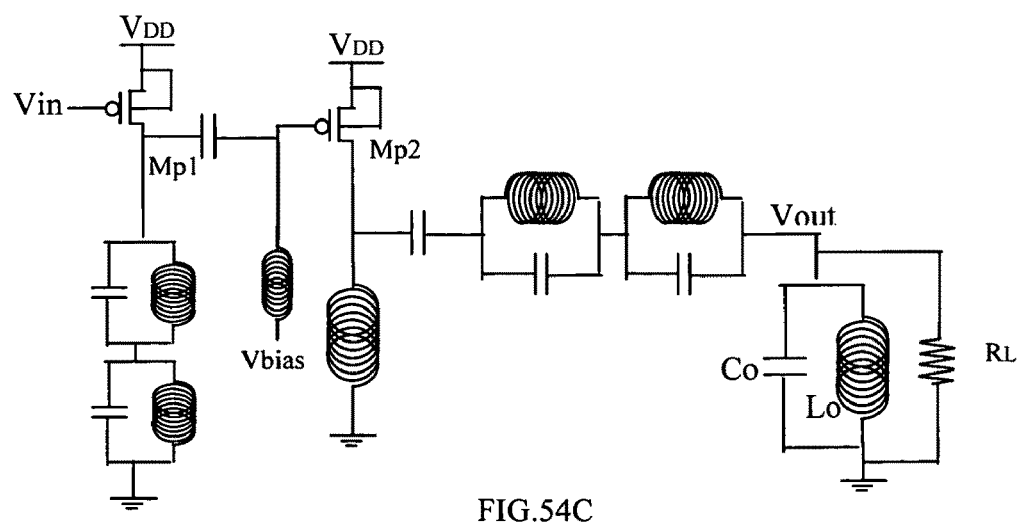

The PMA has the much superior power efficiency to the PA that the PMA is not simple as just change PA with PMOS device. We apply the PMA techniques to all the different PAs to enhance the power efficiency for the different PMA architecture. As shown in FIG. 51A, it is the generic distributed amplifier of microwave power amplifier. It has the power efficiency has only 25%. As shown in FIG. 51B, we invent the home network system including the emergency battery system. As the signal is transmitted on the VDD power line, the dissipated energy is send to the emergency battery system to charge the battery to recycle the energy. As shown in FIG. 51C, it is the PMA type distributed amplifier for the microwave power amplifier. It has the global efficiency more than 95%. FIG. 52A is the A type, B type and C type PMA. It has the power efficiency 95%. FIG. 52B is the push-pull A type, B type and C type PMA. However, due to the resistance loss of the N device in FIG. 52B, the efficiency will be lower than the PMA in FIG. 52A. FIG. 52C is the push-pull A type PMA. FIG. 53A is D type PMA. The pull-up device is P type device. The conventional D type amplifier has the pull-up output device to be N device. FIG. 53B is the differential push-pull D type amplifier. FIG. 53C is the differential push-pull A-type, B-type, C-type and D-type power amplifier. Due to the NMOS resistance in FIG. 53B, the differential push-pull in FIG. 53C has the better power efficiency than the differential push-pull D type amplifier as shown in FIG. 53B. FIG. 54A is the E-type PMA has 100% output efficiency. The conventional E-type PA has the 33% output power efficiency. FIG. 54B is the $1^{st}$ order harmonics F-type PMA has 100% output efficiency. The conventional F-type PA has the efficiency less than 50%. FIG. 54B is the $1^{st}$ order and the $3^{rd}$ harmonics F-type PMA has 100% output efficiency.

The power amplifier design needs to use the energy flow and recycling concepts to design. In the energy band structure, as the electron flows and drop from the conduction band to valance band, it means to lose the energy. This is the unsymmetrical principle of the energy flowing from the high energy level to the low energy. As the electron flows, it means the loss of energy. From FIG. 42, the N type PA is conjugate symmetrical to the P type PA. In other words, the N type is oscillating with $V_{DD}$ being the centerline; the P type is oscillating with Gnd being the centerline. The positive charge of P type PA is replaced the negative charge of N type PA, the operation of P type PA is the same as N type PA. Why the P type PA has the much better power efficiency (100%) than the N type PA efficiency (33%)? The electrical property is completely symmetry. However, as the switch is on, the PMA is positive holes flow and PA is negative electron flow. The PMA doesn't lose energy. The energy is stored in the LC tank and is recycled to be LC tank oscillation energy. As the N switch is on, the PA is negative electron flows. The energy stored in the capacitor of the resonator tank is lost at the spot and the energy is dissipated to ground instantly. This is the fundamental unsymmetrical physical principle of the universe. Even though the operation is electrical symmetrically. However, from the energy flow concept, the P switch energy operation is reversible and the N switch energy operation is irreversible. That is the reason why we use the energy flow concept in the power circuit design. The power circuit includes the power amplifier. The principle is the energy always flowing from the high energy level to the low energy. Many PA engineers doesn't have the enough disciplines to recognize the fundamental unsymmetrical principle of the universe that their design violate the fundamental physical principles to have such kind low efficiency PA to be 30% and waste a lot of energy. One observation is very simple. The SM buck regulator has the power efficiency to be 95%. If the power amplifier uses the similar circuit configuration, it is easy for the P type power amplifier to have more than 95% efficiency. However, due to the lack of the multiple disciplinary training, nobody recognized such kind a fundamental problem. The principle is the symmetry is in the electrical circuit system level. However, the unsymmetrical property is in the molecular and atom energy band structure level. Therefore, we cannot use the pure electrical circuit analysis. We need to use the energy flow to make the analysis for the power efficiency of the power amplifier. It is so simple and fundamental physical principle of the universe, however, the electrical engineers doesn't have the thermodynamics training to understand the fundamental universe physical principles. Not to mention, the electrical engineer can apply the fundamental physical energy principles to the power amplifier design.

The most important for the P type switch is the 100% output efficiency. The most important for the B type power amplifier is the zero DC bias of the input signal. The most important for the differential structure of the power amplifier is to double the power swing range. The most important issue of the differential B type power amplifier is the 100% modulation information. With the 50% modulation of the differential B type power amplifier, we can have the same delivery power as the 100% modulation single-end power amplifier. We don't need to struggle as the single end for the high-efficiency and high linearity. We have the plenty headroom for the high peak to average ratio (PA) OFDM .

While the invention has been particularly shown and described with reference to the preferred embodiments thereof, it will be understood by those skilled in the art that various changes in form and details may be made therein without departing from the spirit and scope of the invention.

We claim:

1. A power-efficient device comprising:
    a differential power amplifier having a pair of switching means and an inducting means;
    wherein said differential power amplifier has an AC coupling differential input signal for controlling said switching means, output nodes, a power supplying node and a power grounding node;
    wherein said switching means has a source terminal connected to the power supplying node and said inducting means having one terminal connected to said power grounding node;
    wherein said switching means has a drain terminal connected to another terminal of said inducting means and said output node;
    wherein said switching means has said AC coupling differential input signal biased at a cut-off voltage level having zero DC current;
    wherein said switching means receives a partial period of an input signal with a bias voltage having a zero DC current; the output nodes forming a composite signal that maintains complete information of said input signal;
    wherein said differential power amplifier is biased at a zero DC current level to eliminate all DC current flowing through said differential amplifier from said power supplying node to said power grounding node so that the differential power amplifier is power efficient;
    a single end to differential end signal converter and zero DC bias generator; said single end to differential end signal converter and zero DC bias generator generating a pair of differential input signals; said differential input signals having AC-coupling; said single end to differential end converter being a differential amplifier generating two AC signals having opposite polarity to each other; said zero DC bias generator having an average of said AC signal to be biased at the cut-off voltage level so that a negative half portion of said AC signal is cut off.

2. A power-efficient device according to claim 1, further comprising a plurality of reactive components between said output nodes to increase cross coupling between said output signals; said reactive components having a first terminal connected to a first output node and a second terminal connected to a second output node.

3. A power-efficient device according to claim 1 wherein said differential power amplifier further comprises a pair of cross coupling switching devices to increase cross-coupling between said output signals; a switching device of said cross coupling switching devices having a draining node connected to an output node and controlling a gating node connected to an opposite output node and vice versa.

4. A power-efficient device according to claim 1 wherein said differential power amplifier further comprises a pair of capacitors; wherein said capacitors have one terminal connected to said draining node of said cross coupling switching devices;
    wherein another terminal of said capacitors is AC coupled to said output node; and
    wherein charge and energy stored in said capacitors is not discharged and wasted during switching of said switching means.

5. A power-efficient device comprising said power amplifier according to claim 1 further comprising ¼ wavelength delay with type B biasing power amplifier and type C biasing power amplifier with ¼ wavelength delay;
    an input signal going through a first ¼ wavelength delay then going through said type B biasing power amplifier to generate a first output; said input signal going through said type C biasing power amplifier then going through a second ¼ wavelength delay to generate a second output;
    said type B biasing power amplifier being said differential power amplifier having input signals generated as a B-type amplifier; said type C biasing power amplifier being said differential power amplifier having input signals generated as a C-type amplifier; said first output and said second output combining to generate said output signal.

6. A power-efficient device comprising said power amplifier according to claim 1 further comprising an envelope adaptive power supply; said envelope adaptive power supply comprising an envelope detector and a supply power generator;
    said envelope detector detecting an envelope of said input signal; said supply power generator generating power supply having its voltage corresponding to said envelope.

7. A power-efficient device comprising said differential power amplifier according to claim 1 further comprising envelope adaptive switching mode power supply; said envelope adaptive switching mode power supply comprising an envelope detector for said input signal and a switch mode power supply; said switch mode power supply generating a power supply voltage according to a detected envelope of said input signal.

8. A power-efficient device comprising said power amplifier according to claim 1, further comprising a switching mode power supply boost converter in series with a low-drop voltage regulated buck converter to supply power to said power amplifier; said switching mode power supply boost converter connected with a low voltage power supply and converting power of said low voltage power supply to a high voltage power supply;
    said low-drop voltage regulated buck converter connecting said high voltage power supply to supply power to said power amplifier;

said low-drop voltage regulated buck converter further comprising a low-drop voltage clamming voltage switch, switch controller and output driver;

said switch controller controlling a switching action of said output driver to supply power for normal power to said power amplifier; and wherein as said power amplifier needs a high voltage power, said low-drop voltage clamming voltage switch turns on said output driver to supply high voltage to said power amplifier.

9. A power-efficient device according to claim 1 further comprising a radio frequency resonator and RF lighting device;

said power amplifier sending RF power to said radio frequency resonator;

said RF lighting device being mounted inside said radio frequency resonator;

said RF power resonating inside said radio frequency resonator lighting up said RF lighting device.

10. A power-efficient device according to claim 1 further comprising a switch mode power supply means for comprising switch inductor means, output driver means and a large output load; said output driver means driving said large output load with large amount current;

in order to drive said large output load, said output driver is a large size device;

wherein said switch inductor comprises an inductor, a discharging switch, a charging switch, a holding switch, a transferring switch and storage capacitance means;

said discharging switch is connected between a power grounding node, a first terminal of said inductor and a first terminal of said transferring switch;

said charging switch is connected between said power grounding node, a second terminal of said inductor and a first terminal of said holding switch;

during a discharging process, said discharging switch turns on and charge stored in an input capacitance load flows through said inductor as an inductor current;

wherein when said inductor current is at a maximum level, said transferring switch turns on and said inductor current flows through said transferring switch to said storage capacitance means; as said inductor current decreases to zero said transferring switch turns off to hold transferred energy in said storage capacitance means;

during a charging process, said transferring switch and said discharging switch turns on; said charge and energy stored in said storage capacitance means flowing through said transferring switch to said input capacitance load; wherein when said inductor current is at a maximum level, said discharging switch turns off; as said inductor current becoming zero turning off said transferring switch and turning on said holding switch to add more charge to compensate for energy loss in said charging process and discharging process and holding voltage at a high level.

11. A power-efficient according to claim 10 further comprising output control of a low drop voltage regulator;

said low drop voltage regulator and said switch mode power supply sharing the same output driver;

a plurality of output control devices having a source node connecting to an output node and having a drain node connecting to a gate of said output driver;

a detected envelope generating signal controlling said gate of said output driver;

as said detected envelope rises upward suddenly, said output driver turns on said output driver to have a high voltage power supply.

12. A power-efficient device according to claim 10 wherein said storage capacitance means of a first power-efficient switch mode power supply is said input capacitance load of a second power-efficient switch mode power supply and vice versa;

said first power-efficient switch mode power supply and said second power-efficient switch mode power supply turns power on and off alternatively.

13. A power-efficient device according to claim 10 wherein inductor current is detected with an inductor current detector; said inductor current detector comprising an active filter, said active filter connected at two ends of said inductor; said active filter being able to be implemented with an operational amplifier having a capacitor and a resistor connected as said active filter.

14. A power-efficient device according to claim 1 further comprising a plurality of mirror cells arranged in an array;

each said mirror cell comprising a mirror and a frame;

each said mirror cell being pivoted mounted on side of said frame;

beneath said mirror cell, said frame having electric poles;

said mirror cell having one front side and one backend side;

wherein a plurality of doped electrodes are located on said backend side;

changing electrical magnitude and/or polarity of said electric poles on said frame, said electrode of said mirror cell being attracted and rejected by electrical force in order to clip said mirror cells.

15. A power-efficient device according to claim 14 further comprising a light signal processor to control said mirror flipping in a projector and projective television;

said light signal processor converting light intensity of video signal to be duration of a mirror flipping period;

wherein when more electrodes are attracted and rejected, light intensity and mirror reflecting periods increase.

16. A power-efficient device according to claim 14 wherein said plurality of mirror cells form a programmable concave mirror for laser communication;

said programmable concave mirror further comprising a telescope, an optical attenuator and a wavefront sensor;

said wavefront sensor detecting wavefront of laser light; and wherein said programmable concave mirror is adjusted according to said wave front of said laser light.

17. A power-efficient device according to claim 1 further comprising a phase lock loop means with analog signal processing of an analog input signal for a VCO;

said analog signal processing comprising an analog phase signal processing circuit and an analog frequency processing circuit;

said analog phase signal processing circuit sending a signal to control a phase of oscillation of said VCO;

said analog frequency processing circuit taking an average of said analog input signal of said VCO and generating an average voltage control signal for frequency to control frequency of said VCO; all the analog frequency processing being processed with analog circuit without any digital signal.

18. A power-efficient device according to claim 1 further comprising a temperature compensated VCO oscillator, said temperature compensated VCO oscillator comprising an inductor and a capacitor;

said inductor comprising an inductance in series with an inductor resistance; said capacitor comprising a capacitor in series with a capacitor resistance;

wherein said inductor resistance is made equal to said capacitance resistance over all temperatures, an oscillator frequency of said temperature compensated VCO oscillator is held constant over all temperatures.

19. A power-efficient device according to claim 1 comprising a power-efficient switch inductor;

said power-efficient switch inductor comprising an inductor and a switch having AC coupling with a voltage biased at a zero DC current;

said switch connected with said inductor means at one terminal of junction node; one terminal of said switch being connected to one power node; another terminal of said inductor being referenced to an opposite power; said switch inductor further comprising a capacitor having one node referenced to a junction node; said capacitor having another terminal referenced to said opposite power.

* * * * *